United States Patent
Nakamura

(10) Patent No.: US 12,140,867 B2
(45) Date of Patent: Nov. 12, 2024

(54) RESIST COMPOSITION AND RESIST PATTERN FORMING METHOD

(71) Applicant: TOKYO OHKA KOGYO CO., LTD., Kawasaki (JP)

(72) Inventor: Tsuyoshi Nakamura, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 723 days.

(21) Appl. No.: 17/273,652

(22) PCT Filed: Sep. 5, 2019

(86) PCT No.: PCT/JP2019/034912
§ 371 (c)(1),
(2) Date: Mar. 4, 2021

(87) PCT Pub. No.: WO2020/054563
PCT Pub. Date: Mar. 19, 2020

(65) Prior Publication Data
US 2021/0364920 A1    Nov. 25, 2021

(30) Foreign Application Priority Data

Sep. 14, 2018   (KR) .................. 10-2018-0110031

(51) Int. Cl.
*G03F 7/039* (2006.01)
*C08F 220/10* (2006.01)
*G03F 7/004* (2006.01)
*G03F 7/20* (2006.01)
*G03F 7/32* (2006.01)

(52) U.S. Cl.
CPC .......... *G03F 7/0392* (2013.01); *C08F 220/10* (2013.01); *G03F 7/0045* (2013.01); *G03F 7/2004* (2013.01); *G03F 7/32* (2013.01)

(58) Field of Classification Search
CPC ..... G03F 7/0382; G03F 7/0392; C08F 220/10
See application file for complete search history.

(56) References Cited

U.S. PATENT DOCUMENTS

| | | | |
|---|---|---|---|
| 2004/0110085 A1 | 6/2004 | Iwai et al. | |
| 2011/0039206 A1 | 2/2011 | Liu et al. | |
| 2014/0045123 A1* | 2/2014 | Sagehashi | G03F 7/38 526/309 |
| 2016/0313645 A1* | 10/2016 | Kato | G03F 7/0397 |
| 2017/0115569 A1* | 4/2017 | Goto | C08F 220/1808 |
| 2018/0004087 A1 | 1/2018 | Hatakeyama et al. | |
| 2019/0219920 A1 | 7/2019 | Nagamine et al. | |

FOREIGN PATENT DOCUMENTS

| | | |
|---|---|---|
| EP | 2503392 A1 | 9/2012 |
| JP | 2003-241385 A | 8/2003 |
| JP | 2010-152068 A | 7/2010 |
| JP | 2015-141353 A | 8/2015 |
| JP | 2015-172765 A | 10/2015 |
| JP | 2017-223958 A | 12/2017 |
| JP | 2018-004812 A | 1/2018 |
| JP | 2018-155788 A | 10/2018 |
| WO | WO 2018/066606 A1 | 4/2018 |

OTHER PUBLICATIONS

International Search Report in International Application No. PCT/JP2019/034912 mailed on Dec. 3, 2019.

* cited by examiner

*Primary Examiner* — Mark F. Huff
*Assistant Examiner* — Nicholas E Brown
(74) *Attorney, Agent, or Firm* — Knobbe, Martens, Olson & Bear, LLP

(57) ABSTRACT

A resist composition including a base material component (A) whose solubility in a developing solution is changed due to an action of an acid, in which the base material component (A) contains a polymer compound (A1) having a constitutional unit (a1) represented by Formula (a1-1). In the formula, R represents a hydrogen atom, an alkyl group having 1 to 5 carbon atoms, or a halogenated alkyl group having 1 to 5 carbon atoms, $Vax_1$ represents a single bond or a divalent linking group, $n_{a0}$ represents an integer of 0 to 2, and $R_{01}$ represents a methyl group or an ethyl group.

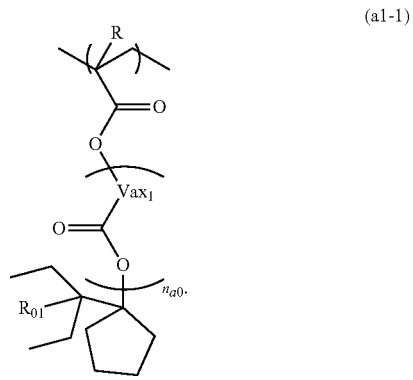

6 Claims, No Drawings

RESIST COMPOSITION AND RESIST PATTERN FORMING METHOD

TECHNICAL FIELD

The present invention relates to a resist composition and a resist pattern forming method using the resist composition.

Priority is claimed on Korean Patent Application No. 10-2018-0110031, filed in the Republic of Korea on Sep. 14, 2018, the content of which is incorporated herein by reference.

BACKGROUND ART

A technique of forming a fine pattern on a substrate and performing etching on this pattern used as a mask to process a lower layer of the pattern (pattern forming technique) has been widely employed in the manufacture of semiconductor elements and liquid crystal display elements. The fine pattern is typically formed by a technique such as a lithography method or a nanoimprint method using a resist composition formed of an organic material. For example, in the lithography method, a step of forming a resist film on a support such as a substrate using a resist material containing a base material component such as a resin, selectively exposing the resist film using an exposure device such as an ArF exposure device, an electron beam drawing device, or an EUV exposure device, and performing a developing treatment thereon to form a resist pattern having a predetermined shape on the resist film is performed. Further, a semiconductor element or the like is manufactured by performing a step of processing the substrate by performing etching using the resist pattern as a mask.

The resist material is classified into a positive tone and a negative tone. The resist material whose solubility in a developing solution of an exposed portion is increased is referred to as the positive tone, and the resist material whose solubility in a developing solution of an exposed portion is decreased is referred to as the negative tone.

As the developing solution, an alkaline aqueous solution (alkali developing solution) such as a tetramethylammonium hydroxide (TMAH) aqueous solution is typically used. Further, an organic solvent such as an aromatic solvent, an aliphatic hydrocarbon-based solvent, an ether-based solvent, a ketone-based solvent, an ester-based solvent, an amide-based solvent, or an alcohol-based solvent is also used as the developing solution.

In recent years, advances in lithography techniques have led to the progress of pattern miniaturization.

The pattern miniaturization techniques typically involve shortening the wavelength (increasing the energy) of an exposure light source. Specifically, ultraviolet rays typified by g-line and i-line have been used in the related art, but nowadays mass production of semiconductor elements using KrF excimer lasers and ArF excimer lasers has started. Further, examination has also been conducted on electron beams (EB), extreme ultraviolet rays (EUV), X-rays, and the like which have wavelengths shorter (energy higher) than the wavelengths of these excimer lasers.

With the shortening of the wavelength of an exposure light source, the resist materials are required to improve lithography characteristics such as the sensitivity with respect to the exposure light source and the resolution that enables reproduction of a fine pattern. A chemically amplified resist composition has been known as a resist material that satisfies such a requirement.

A resist material containing a base material component whose solubility in a developing solution is changed due to an action of an acid and an acid generator component that generates an acid upon light exposure has been used as the chemically amplified resist composition. For example, in a case where the developing solution is an alkali developing solution (alkali developing process), a base material component whose solubility in an alkali developing solution is increased due to an action of an acid is used as the above-described base material component.

In the related art, a resin (base resin) is mainly used as a base material component of a chemically amplified resist composition. Recently, as the base resin of a chemically amplified resist composition used for ArF excimer laser lithography or the like, a resin (acrylic resin) having a constitutional unit derived from (meth)acrylic acid ester in the main chain is mainly used because of excellent transparency in the vicinity of 193 nm.

The base resin of a chemically amplified resist composition typically has a plurality of kinds of constitutional units in order to improve lithographic characteristics and the like. Here, in a case where the base resin is an acrylic resin, as the acid decomposable group, a carboxy group in (meth)acrylic acid or the like which is protected by an acid dissociable group such as a tertiary alkyl group or an acetal group is typically used.

For example, in order to provide a high resolution and a satisfactory pattern shape in formation of a resist pattern, it is known to use a positive-tone resist composition which has a methacrylic repeating unit containing adamantyl in a tertiary carbon and a methacrylic repeating unit in which a tertiary carbon forms a cyclic structure and contains a resin whose solubility in an alkali is improved due to an acid, a photoacid generator, and a solvent, as an acid-unstable group (for example, see Patent Literatures 1 and 2).

However, in order to increase the degree of circuit integration particularly in a chip of an integrated circuit, it is important not only to form a fine pattern but also to uniformly miniaturize the resist pattern in the formation of the fine pattern. In regard to this, the critical dimension (CD) indicates the dimension (the width of an interconnect line, a contact, a trench, or the like) of the smallest geometric feature that can be formed during manufacture of a semiconductor device, and a method of efficiently controlling the deviation of the CD is required so that a uniform resist pattern is formed.

Further, resist compositions of the related art have not been able to sufficiently satisfy the requirements of the related art for realizing excellent lithographic characteristics. Specifically, the needs for miniaturization of hole patterns have been rapidly increasing recently, and as a result, further improvement in performance on the optimum exposure amount (EOP), the critical dimension uniformity (CDU), and the like has been required. However, since these are in a trade-off relationship, improvement of the EOP leads to deterioration of the CDU. Therefore, it is not easy to improve both the EOP and the CDU at the same time, and there is a problem in that resist compositions of the related art cannot sufficiently satisfy the above-described requirements of the related art.

CITATION LIST

Patent Literature

[Patent Literature 1]
Japanese Unexamined Patent Application, First Publication No. 2003-241385
[Patent Literature 2]
Japanese Unexamined Patent Application, First Publication No. 2010-152068

SUMMARY OF INVENTION

Technical Problem

The present invention has been made in consideration of the above-described circumstances, and an object thereof is to provide a resist composition which has both excellent EOP and CDU characteristics and is capable of forming a resist pattern, a resist pattern forming method carried out using the resist composition, and a polymer compound used in the resist composition.

Solution to Problem

As a result of examination repeatedly conducted by the present inventors, it was found that the above-described problem can be solved in a case where the resist composition contains a polymer compound having a specific constitutional unit as a component (A) whose solubility in a developing solution is changed due to an action of an acid, thereby completing the present invention.

According to a first aspect of the present invention, there is provided a resist composition which generates an acid upon light exposure and whose solubility in a developing solution is changed due to an action of the acid, the resist composition including: a base material component (A) whose solubility in a developing solution is changed due to the action of an acid, in which the base material component (A) contains a polymer compound (A1) having a constitutional unit (a1) represented by Formula (a1-1).

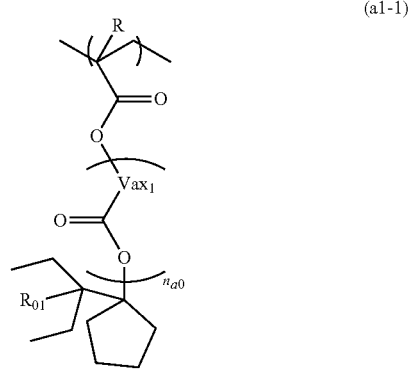

(a1-1)

[In the formula, R represents a hydrogen atom, an alkyl group having 1 to 5 carbon atoms, or a halogenated alkyl group having 1 to 5 carbon atoms, $Vax_1$ represents a single bond or a divalent linking group, $n_{a0}$ represents an integer of 0 to 2, and $R_{01}$ represents a methyl group or an ethyl group.]

According to a second aspect of the present invention, there is provided a resist pattern forming method including: a step of forming a resist film on a support using the resist composition according to the first aspect of the present invention; a step of exposing the resist film to light; and a step of developing the exposed resist film to form a resist pattern.

Advantageous Effects of Invention

According to the present invention, it is possible to provide a resist composition which has both excellent EOP and CDU characteristics and is capable of forming a resist pattern, a resist pattern forming method carried out using the resist composition, and a polymer compound used in the resist composition.

DESCRIPTION OF EMBODIMENTS

In the present description and the scope of the present patent claims, the term "aliphatic" is a relative concept used in relation to the term "aromatic", and defines a group or compound that has no aromaticity.

The "alkyl group" includes a linear, branched, or cyclic monovalent saturated hydrocarbon group unless otherwise specified.

The "alkylene group" includes a linear, branched, or cyclic divalent saturated hydrocarbon group unless otherwise specified. The same applies to the alkyl group in an alkoxy group.

The "halogenated alkyl group" is a group in which some or all hydrogen atoms of an alkyl group have been substituted with halogen atoms. Examples of the halogen atom include a fluorine atom, a chlorine atom, a bromine atom, and an iodine atom.

The "fluorinated alkyl group" or the "fluorinated alkylene group" is a group in which some or all hydrogen atoms of an alkyl group or an alkylene group have been substituted with fluorine atoms.

The "divalent linking group" is a divalent saturated or unsaturated hydrocarbon group which may have a substituent or a divalent linking group having a hetero atom.

The "constitutional unit" indicates a monomer unit constituting a polymer compound (a resin, a polymer, or a copolymer).

The "constitutional unit derived from acrylic acid ester" indicates a constitutional unit that is formed by cleavage of an ethylenic double bond of acrylic acid ester.

The "acrylic acid ester" is a compound in which a hydrogen atom at the terminal of the carboxy group of acrylic acid ($CH_2=CH-COOH$) has been substituted with an organic group.

In the acrylic acid ester, the hydrogen atom bonded to the carbon atom at the α-position may be substituted with a substituent. The substituent ($R^\alpha$) that substitutes the hydrogen atom bonded to the carbon atom at the α-position is an atom other than a hydrogen atom or a group, and examples thereof include an alkyl group having 1 to 5 carbon atoms, a halogenated alkyl group having 1 to 5 carbon atoms, and a hydroxyalkyl group. Further, the carbon atom at the α-position of the acrylic acid ester indicates a carbon atom to which a carbonyl group is bonded, unless otherwise specified.

Hereinafter, the acrylic acid ester in which the hydrogen atom bonded to the carbon atom at the α-position has been substituted with a substituent is also referred to as α-substituted acrylic acid ester. Further, the acrylic acid ester and the α-substituted acrylic acid ester are also collectively referred to as "(α-substituted) acrylic acid ester".

The "constitutional unit derived from a hydroxystyrene derivative" indicates a constitutional unit formed by cleavage of an ethylenic double bond of hydroxystyrene or a hydroxystyrene derivative.

The concept of the "hydroxystyrene derivative" includes those in which the hydrogen atom at the α-position of hydroxystyrene has been substituted with another substituent such as an alkyl group or a halogenated alkyl group; and derivatives thereof. Examples of the derivatives thereof include those obtained by substituting a hydrogen atom of a hydroxyl group of hydroxystyrene, in which the hydrogen atom at the α-position may be substituted with a substituent, with an organic group; and those obtained by bonding a substituent other than a hydroxyl group to a benzene ring of hydroxystyrene in which the hydrogen atom at the α-position may be substituted with a substituent. Further, the α-position (the carbon atom at the α-position) indicates the carbon atom having a benzene ring bonded thereto, unless otherwise specified.

Examples of the substituent which substitutes the hydrogen atom at the α-position of hydroxystyrene include those exemplified as the substituent at the α-position in the α-substituted acrylic acid ester described above.

The "constitutional unit derived from vinylbenzoic acid or a vinylbenzoic acid derivative" indicates a constitutional unit that is formed by cleavage of the ethylenic double bond of vinylbenzoic acid or a vinylbenzoic acid derivative.

The concept of the "vinylbenzoic acid derivative" includes those in which the hydrogen atom at the α-position of vinylbenzoic acid has been substituted with another substituent such as an alkyl group or a halogenated alkyl group; and derivatives thereof. Examples of the derivatives thereof include those obtained by substituting a hydrogen atom of a carboxy group of vinylbenzoic acid, in which the hydrogen atom at the α-position may be substituted with a substituent, with an organic group; and those obtained by bonding a substituent other than a hydroxyl group or a carboxy group to a benzene ring of vinylbenzoic acid in which the hydrogen atom at the α-position may be substituted with a substituent. Further, the α-position (the carbon atom at the α-position) indicates the carbon atom having a benzene ring bonded thereto, unless otherwise specified.

The "styrene derivative" indicates those in which the hydrogen atom at the α-position of styrene has been substituted with another substituent such as an alkyl group or a halogenated alkyl group.

The "constitutional unit derived from styrene" or "constitutional unit derived from a styrene derivative" indicates a constitutional unit formed by cleavage of an ethylenic double bond of styrene or a styrene derivative.

As the alkyl group as the substituent at the α-position, a linear or branched alkyl group is preferable, and specific examples thereof include an alkyl group having 1 to 5 carbon atoms (such as a methyl group, an ethyl group, a propyl group, an isopropyl group, an n-butyl group, an isobutyl group, a tert-butyl group, a pentyl group, an isopentyl group, or a neopentyl group).

Further, specific examples of the halogenated alkyl group as the substituent at the α-position include groups in which some or all hydrogen atoms in the above-described "alkyl group as the substituent at the α-position" have been substituted with halogen atoms. Examples of the halogen atom include a fluorine atom, a chlorine atom, a bromine atom, and an iodine atom. Among these, a fluorine atom is particularly preferable.

Specific examples of the hydroxyalkyl group as the substituent at the α-position include groups in which some or all hydrogen atoms in the above-described "alkyl group as the substituent at the α-position" have been substituted with a hydroxyl group. The number of hydroxyl groups in the hydroxyalkyl group is preferably in a range of 1 to 5 and most preferably 1.

The expression "may have a substituent" indicates both a case where a hydrogen atom (—H) is substituted with a monovalent group and a case where a methylene (—CH$_2$—) group is substituted with a divalent group.

The term "light exposure" is a general concept for irradiation with radiation.

<Resist Composition>

According to a first embodiment of the present invention, there is provided a resist composition which generates an acid upon light exposure and whose solubility in a developing solution is changed due to an action of the acid, the resist composition including: a base material component (A) whose solubility in a developing solution is changed due to the action of an acid, in which the base material component (A) contains a polymer compound (A1) having a constitutional unit (a1) represented by Formula (a1-1).

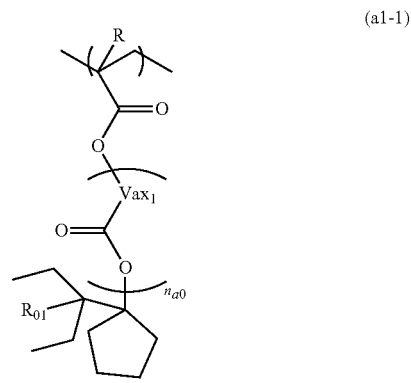

(a1-1)

[In the formula, R represents a hydrogen atom, an alkyl group having 1 to 5 carbon atoms, or a halogenated alkyl group having 1 to 5 carbon atoms, $Vax_1$ represents a single bond or a divalent linking group, $n_{a0}$ represents an integer of 0 to 2, and $R_{01}$ represents a methyl group or an ethyl group.]

In the present invention, the resist composition contains a base material component (A) (hereinafter, also referred to as a "component (A)") whose solubility in a developing solution is changed due to the action of an acid.

In a case where a resist film is formed using such a resist composition and the resist film is selectively exposed to light, an acid is generated and the solubility of the component (A) in a developing solution is changed due to the action of the acid at the exposed portion, but the solubility of the component (A) in a developing solution is not changed in the unexposed portion, and thus a difference in solubility in a developing solution occurs between the exposed portion and the unexposed portion. Therefore, in a case where the resist film is developed, the exposed portion is dissolved and removed to form a positive-tone resist pattern in a case where the resist composition is of a positive tone, whereas the unexposed portion is dissolved and removed to form a negative-tone resist pattern in a case where the resist composition is of a negative tone.

In the present specification, a resist composition which forms a positive-tone resist pattern by dissolving and removing the exposed portion is referred to as a positive-tone resist composition, and a resist composition which forms a negative-tone resist pattern by dissolving and removing the unexposed portion is referred to as a negative-tone resist composition.

The resist composition of the present invention may be a positive-tone resist composition or a negative-tone resist composition. Further, the resist composition of the present invention can be used in a dual tone development (DTD) step.

Further, the resist composition of the present invention may be used for an alkali developing process using an alkali developing solution in the developing treatment in a case of forming a resist pattern or may be used in a solvent developing process using a developing solution containing an organic solvent (organic developing solution) in the developing treatment, but it is preferable that the resist composition is used in a solvent developing process.

The resist composition used for forming a resist pattern has an acid-generating ability to generate an acid upon light exposure, and the component (A) may generate an acid upon light exposure or the resist composition may contain an acid generator component (B).

In a case where the component (A) generates an acid upon light exposure, the component (A) serves as a "base material component which generates an acid upon light exposure and whose solubility in a developing solution is changed due to the action of the acid". In a case where the component (A) is a base material component which generates an acid upon light exposure and whose solubility in a developing solution is changed due to the action of the acid, it is preferable that a component (A1) described below is a polymer compound which generates an acid upon light exposure and whose solubility in a developing solution is changed due to the action of the acid. As such a polymer compound, a resin having a constitutional unit that generates an acid upon exposure can be used. As the constitutional unit that generates an acid upon exposure, those which have been known can be used.

In the present invention, the base material component (A) whose solubility in a developing solution is changed due to the action of an acid will be described as follows.

[Base Material Component: Component (A)]

In the present invention, the "base material component" is an organic compound having a film-forming ability, and an organic compound having a molecular weight of 500 or greater is preferably used. In a case where the molecular weight of the organic compound is 500 or greater, the film-forming ability is improved, and a nano-level photosensitive resin pattern is easily formed.

Organic compounds used as the base material component are classified into non-polymers and polymers.

As the non-polymers, those having a molecular weight of 500 or greater and less than 4000 are typically used. Hereinafter, the "low-molecular-weight compound" indicates a non-polymer having a molecular weight of 500 or greater and less than 4000.

As the polymer, those having a molecular weight of 1000 or greater are typically used. Hereinafter, the "resin" indicates a polymer (polymer compound) having a molecular weight of 1000 or greater.

As the molecular weight of the polymer, the mass average molecular weight in terms of polystyrene according to gel permeation chromatography (GPC) is used.

As the component (A), a resin, a low-molecular-weight compound, or a combination thereof may be used.

The component (A) is a component whose solubility in a developing solution is changed due to the action of an acid.

Further, in the present invention, the component (A) may generate an acid upon light exposure.

In the present invention, the component (A) contains a polymer compound (A1) having a constitutional unit containing an acid decomposable group whose polarity is increased due to the action of an acid (hereinafter, also referred to as a "constitutional unit (a1)").

(Constitutional Unit (a1))

The constitutional unit (a1) is a constitutional unit containing an acid decomposable group whose polarity is increased due to the action of an acid.

The "acid decomposable group" indicates a group having acid decomposability in which at least a part of a bond in the structure of the acid decomposable group can be cleaved due to the action of an acid.

In the present invention, the polymer compound (A1) contained in the component (A) has a constitutional unit represented by Formula (a1-1) as the constitutional unit (a1) containing an acid decomposable group whose polarity is increased due to the action of an acid.

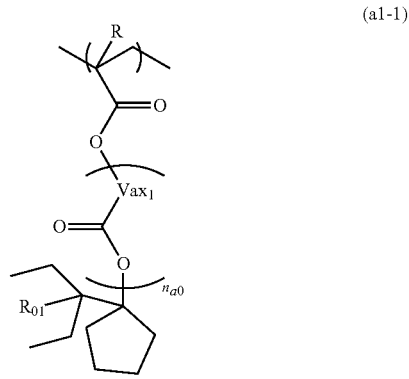

(a1-1)

[In the formula, R represents a hydrogen atom, an alkyl group having 1 to 5 carbon atoms, or a halogenated alkyl group having 1 to 5 carbon atoms, $Vax_1$ represents a single bond or a divalent linking group, $n_{a0}$ represents an integer of 0 to 2, and $R_{01}$ represents a methyl group or an ethyl group.]

In Formula (a1-1), as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms is a group in which some or all hydrogen atoms in the alkyl group having 1 to 5 carbon atoms have been substituted with halogen atoms. Examples of the halogen atom include a fluorine atom, a chlorine atom, a bromine atom, and an iodine atom. Among these, a fluorine atom is particularly preferable.

As R, a hydrogen atom, an alkyl group having 1 to 5 carbon atoms, or a fluorinated alkyl group having 1 to 5 carbon atoms is preferable, and a hydrogen atom or a methyl group is most preferable from the viewpoint of the industrial availability.

It is preferable that $Vax_1$ represents a single bond, and in a case where $Vax_1$ represents a divalent linking group, examples of the divalent linking group include a linear or branched alkylene group having 1 to 5 carbon atoms, a linear or branched alkenylene group having 2 to 5 carbon atoms, a linear or branched alkynylene group having 2 to 5 carbon atoms, —O—, —COO—, —CON(R')—, —OCO—, —CONHCO—, —CONHCS—, and bonds thereof. Among these, a linear or branched alkylene group having 1 to 5 carbon atoms is preferable.

It is more preferable that $n_{a0}$ represents 0.

It is more preferable that $R_{01}$ represents a methyl group.

Specific preferred examples of Formula (a1-1) are as follows.

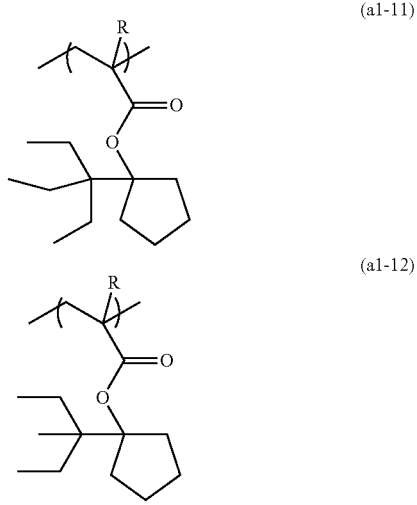

(a1-11)

(a1-12)

In Formulae (a1-11) and (a1-12), R's each have the same definition as that for R in Formula (a1-1).

In the present invention, the polymer compound (A1) contained in the component (A) may further have a constitutional unit (a1) containing an acid decomposable group other than the constitutional unit represented by Formula (a1-1).

Examples of the acid decomposable group whose polarity is increased due to the action of an acid include a group which is decomposed due to the action of an acid to generate a polar group.

Examples of the polar group include a carboxy group, a hydroxyl group, an amino group, and a sulfonic acid group (—$SO_3H$). Among these, a sulfonic acid group or a polar group containing —OH in the structure thereof (hereinafter, also referred to as a "OH-containing polar group") is preferable, a sulfonic acid group, a carboxy group, or a hydroxyl group is preferable, and a carboxy group or a hydroxyl group is particularly preferable.

More specific examples of the acid decomposable group include a group in which the above-described polar group has been protected by an acid dissociable group (such as a group in which a hydrogen atom of the OH-containing polar group has been protected by an acid dissociable group).

Here, the "acid dissociable group" indicates both a group (i) having an acid dissociation property in which a bond between the acid dissociable group and an atom adjacent to the acid dissociable group can be cleaved due to the action of an acid; and a group (ii) in which some bonds are cleaved due to the action of an acid, a decarboxylation reaction occurs, and thus the bond between the acid dissociable group and the atom adjacent to the acid dissociable group can be cleaved.

It is necessary that the acid dissociable group that constitutes the acid decomposable group is a group which exhibits a lower polarity than that of the polar group generated by the dissociation of the acid dissociable group. In this manner, in a case where the acid dissociable group is dissociated due to the action of an acid, a polar group exhibiting a higher polarity than that of the acid dissociable group is generated so that the polarity is increased. As a result, the polarity of the entire component of the polymer compound (A1) is increased. As the polarity increases, the solubility in a developing solution changes relatively, and the solubility decreases in a case where the developing solution is an organic developing solution.

The acid dissociable group is not particularly limited, and those which have been proposed as an acid dissociable group of a base resin for a chemically amplified resist in the related art can be used.

Examples of the acid dissociable group that protects a carboxy group or a hydroxyl group in the polar groups include an acid dissociable group represented by Formula (a1-r-1) (hereinafter, also referred to as an "acetal type acid dissociable group" for convenience).

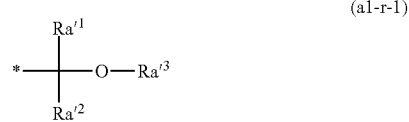

(a1-r-1)

[In the formula, $Ra'^1$ and $Ra'^2$ represent a hydrogen atom or an alkyl group, $Ra'^3$ represents a hydrocarbon group, and $Ra'^3$ may be bonded to any of $Ra'^1$ and $Ra'^2$ to form a ring. "*" represents a bonding position.]

In Formula (a1-r-1), examples of the alkyl group as $Ra'^1$ and $Ra'^2$ include those exemplified as the alkyl group for the substituent that may be bonded to the carbon atom at the α-position, in the description of the α-substituted acrylic acid ester. Among the examples, a methyl group or an ethyl group is preferable, and a methyl group is most preferable.

As the hydrocarbon group represented by $Ra'^3$, an alkyl group having 1 to 20 carbon atoms is preferable, an alkyl group having 1 to 10 carbon atoms is more preferable, and a linear or branched alkyl group is still more preferable, and specific examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group, and a 2,2-dimethylbutyl group.

In a case where $Ra'^3$ represents a cyclic hydrocarbon group, the hydrocarbon group may be aliphatic or aromatic and may be polycyclic or monocyclic. As the monocyclic alicyclic hydrocarbon group, a group in which two hydrogen atoms have been removed from a monocycloalkane is preferable. The number of carbon atoms of the monocycloalkane is preferably in a range of 3 to 8, and specific examples thereof include cyclopentane, cyclohexane, and cyclooctane. As the polycyclic alicyclic hydrocarbon group, a group in which one hydrogen atom has been removed from a polycycloalkane is preferable. The number of carbon atoms of the polycycloalkane is preferably in a range of 7 to 12. Specific examples thereof include adamantane, norbornane, isobornane, tricyclodecane, and tetracyclododecane.

In a case where the hydrocarbon group is an aromatic hydrocarbon group, specific examples of the aromatic ring contained therein include aromatic hydrocarbon rings such as benzene, biphenyl, fluorene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom.

Specific examples of the aromatic hydrocarbon group include a group in which one hydrogen atom has been removed from the aromatic hydrocarbon ring (an aryl group), and a group in which one hydrogen atom of the aryl group has been substituted with an alkylene group (for example, an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

In a case where $Ra'^3$ is bonded to any of $Ra'^1$ and $Ra'^2$ to form a ring, the cyclic group is preferably a 4- to 7-membered ring and more preferably a 4- to 6-membered ring. Specific examples of the cyclic group include a tetrahydropyranyl group and a tetrahydrofuranyl group.

Examples of the acid dissociable group that protects a carboxy group among the polar groups include an acid dissociable group represented by Formula (a1-r-2) (hereinafter, also referred to as an "acetal type acid dissociable group" for convenience).

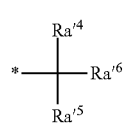

(a1-r-2)

[In the formula, $Ra'^4$ to $Ra'^6$ represent a hydrocarbon group, and $Ra'^5$ and $Ra'^6$ may be bonded to each other to form a ring. "*" represents a bonding position.]

Examples of the hydrocarbon group as $Ra'^4$ to $Ra'^6$ in Formula (a1-r-2) include the same groups as those for $Ra'^3$. It is preferable that $Ra'^4$ represents an alkyl group having 1 to 5 carbon atoms. In a case where $Ra'^5$ and $Ra'^6$ are bonded to each other to form a ring, a group represented by Formula (a1-r2-1) is exemplified.

In a case where $Ra'^4$ to $Ra'^6$ independently represent a hydrocarbon group without being bonded to one another, a group represented by Formula (a1-r2-2) is exemplified.

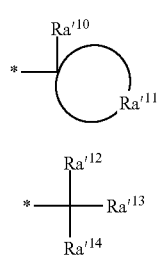

(a1-r2-1)

(a1-r2-2)

[In the formulae, $Ra'^{10}$ represents an alkyl group having 1 to 10 carbon atoms, $Ra'^{11}$ represents a group that forms an aliphatic cyclic group together with a carbon atom to which $Ra'^{10}$ is bonded, and $Ra'^{12}$ to $Ra'^{14}$ each independently represent a hydrocarbon group. "*" represents a bonding position.]

In Formula (a1-r2-1), as the alkyl group having 1 to 10 carbon atoms as $Ra'^{10}$, the groups exemplified as the linear or branched alkyl group as $Ra'^3$ in Formula (a1-r-1) are preferable. As the aliphatic cyclic group formed by $Ra'^{11}$, the groups exemplified as the cyclic alkyl group as $Ra'^3$ in Formula (a1-r-1) are preferable.

In Formula (a1-r2-2), it is preferable that $Ra'^{12}$ and $Ra'^{14}$ each independently represent an alkyl group having 1 to 10 carbon atoms. As the alkyl group, any group exemplified as the linear or branched alkyl group as $Ra'^3$ in Formula (a1-r-1) is more preferable, a linear alkyl group having 1 to 5 carbon atoms is still more preferable, and a methyl group or an ethyl group is particularly preferable.

It is preferable that $Ra'^{13}$ represents a linear, branched, or cyclic alkyl group exemplified as the hydrocarbon group represented by $Ra'^3$ in Formula (a1-r-1). Among these, any group exemplified as the cyclic alkyl group represented by $Ra'^3$ is more preferable.

Specific examples of Formula (a1-r2-1) are as follows.

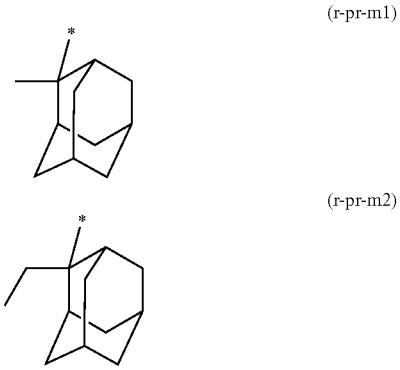

(r-pr-m1)

(r-pr-m2)

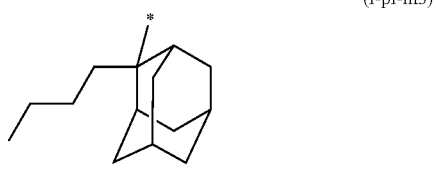

(r-pr-m3)

(r-pr-m4)

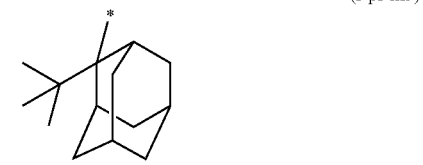

(r-pr-m5)

(r-pr-m6)

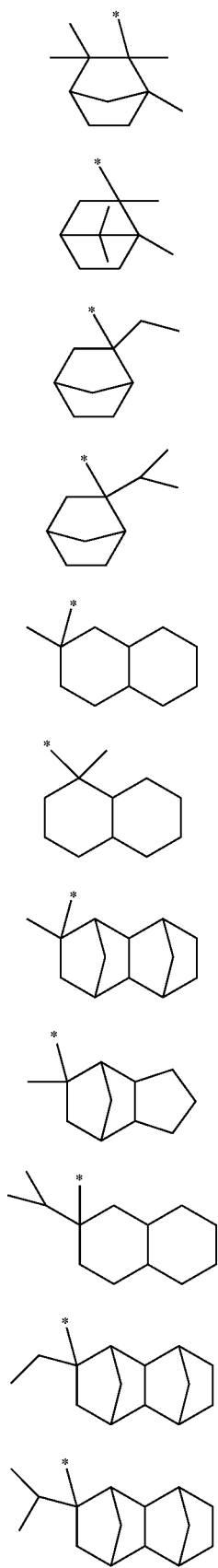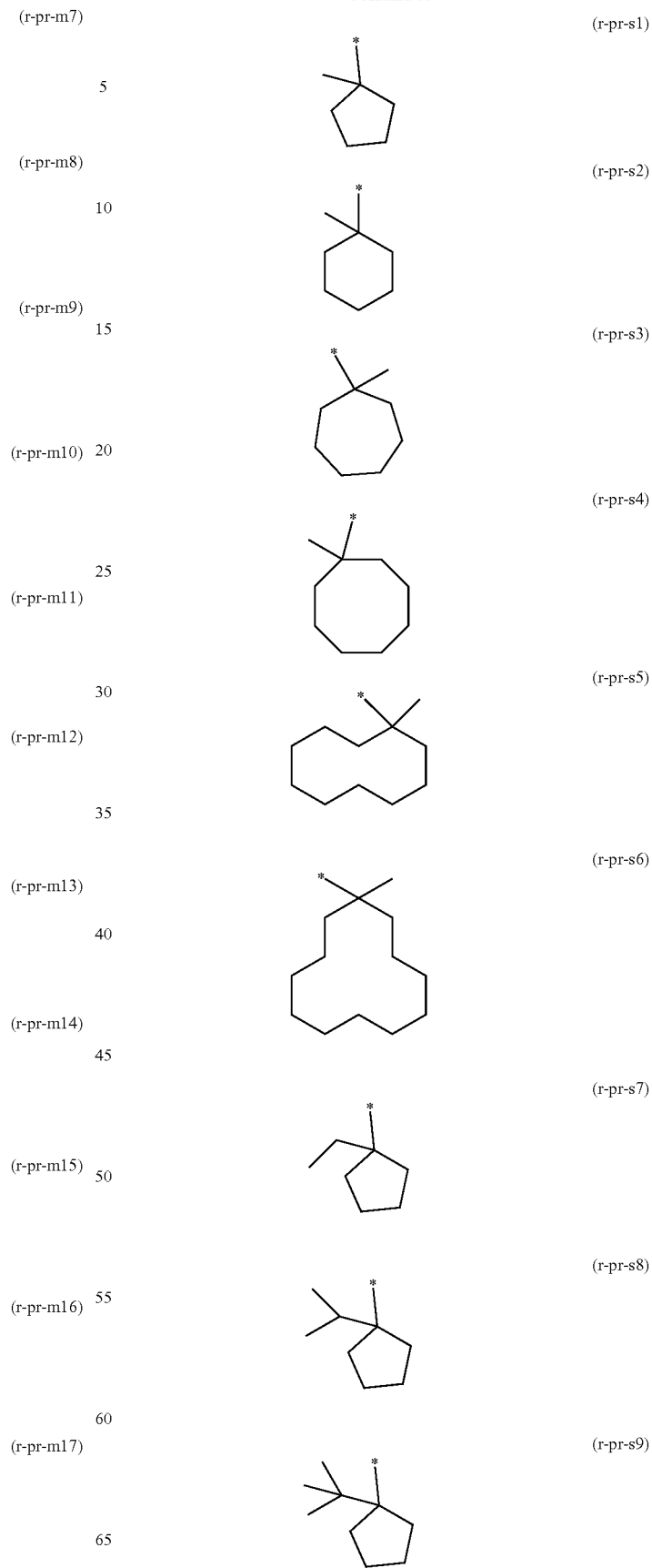

(r-pr-s10) 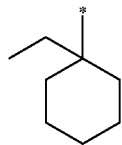
(r-pr-s11) 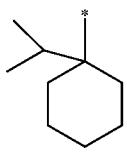
(r-pr-s12) 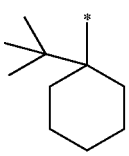
(r-pr-s13) 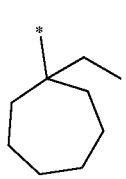
(r-pr-s14) 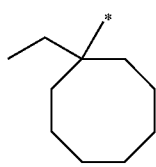
(r-pr-s15) 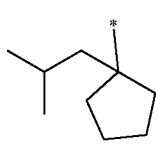
(r-pr-s16) 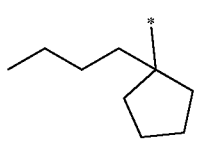
(r-pr-s17) 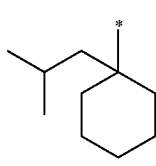
(r-pr-s18) 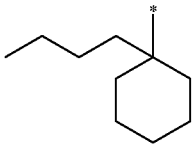
[In the formulae, "*" represents a bonding position.]
Specific examples of Formula (a1-r2-2) are as follows.
(r-pr-cm1) 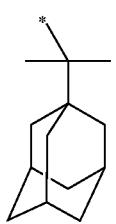
(r-pr-cm2) 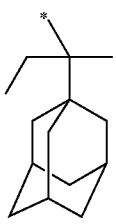
(r-pr-cm3) 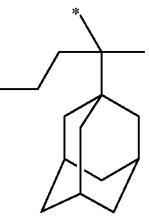
(r-pr-cm4) 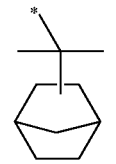
(r-pr-cm5) 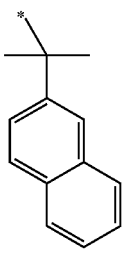

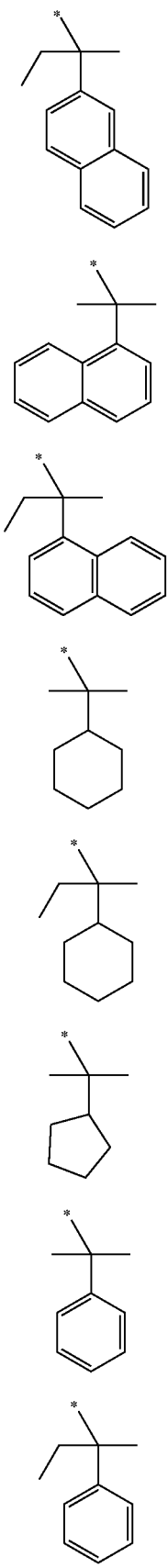

(r-pr-cm6)

(r-pr-cm7)

(r-pr-cm8)
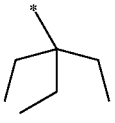

(r-pr-c1)

(r-pr-c2)

(r-pr-c3)

(r-pr-c4)

[In the formulae, "*" represents a bonding position.]

Examples of the acid dissociable group that protects a hydroxyl group among the polar groups include an acid dissociable group (hereinafter, also referred to as a "tertiary alkyloxycarbonyl acid dissociable group" for convenience) represented by Formula (a1-r-3).

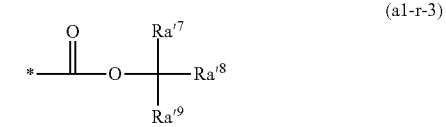

(a1-r-3)

[In the formulae, $Ra'^7$ to $Ra'^9$ represent an alkyl group. "*" represents a bonding position.]

In Formula (a1-r-3), $Ra'^7$ to $Ra'^9$ represent preferably an alkyl group having 1 to 5 carbon atoms and more preferably an alkyl group having 1 to 3 carbon atoms.

Further, the total number of carbon atoms in each alkyl group is preferably in a range of 3 to 7, more preferably in a range of 3 to 5, and most preferably 3 or 4.

Examples of the constitutional unit containing an acid decomposable group include a constitutional unit which is derived from acrylic acid ester in which the hydrogen atom bonded to the carbon atom at the α-position may be substituted with a substituent and contains an acid decomposable group whose polarity is increased due to the action of an acid; a constitutional unit in which at least some hydrogen atoms in a hydroxyl group of a constitutional unit derived from hydroxystyrene or a hydroxystyrene derivative are protected by a substituent containing the acid decomposable group; and a constitutional unit in which at least some hydrogen atoms in —C(=O)—OH of a constitutional unit derived from vinylbenzoic acid or a vinylbenzoic acid derivative are protected by a substituent containing the acid decomposable group.

Known constitutional units can be used as the constitutional unit containing an acid decomposable group other than the constitutional unit represented by Formula (a1-1), but the constitutional unit represented by Formula (a1-2) is preferable.

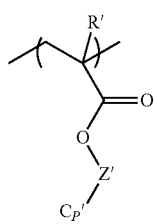

(a1-2)

[In the formula, R' represents a hydrogen atom, an alkyl group, or a halogenated alkyl group; Z' represents a single bond or an alkylene group; and $C'_p$ is selected from the group consisting of Formula (a1-r-1) or Formula (a1-r-2).]

In Formula (a1-2), R' has the same definition as that for R in Formula (a1-1).

It is preferable that Z' represents a single bond or an alkylene group having 1 to 10 carbon atoms. As the alkylene group having 1 to 10 carbon atoms, a linear or branched alkylene group having 1 to 10 carbon atoms is preferable, and a linear or branched alkylene group having 1 to 5 carbon atoms is more preferable, and specific examples thereof include a methylene group, an ethylene group, a propylene group, an isopropylene group, and an n-butylene group.

Z' represents more preferably a single bond or an alkylene group having 1 to 5 carbon atoms and most preferably a single bond.

The polymer compound (A1) having the constitutional unit (a1) of the present invention may further have a constitutional unit represented by (a1-3) or (a1-4) as the constitutional unit containing an acid decomposable group other than the constitutional unit represented by Formula (a1-1).

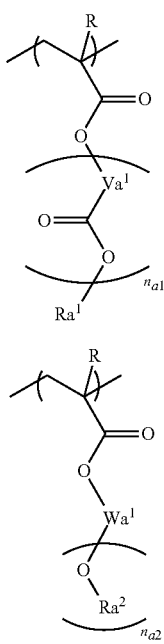

[In the formulae, each R has the same definition as that for R in Formula (a1-1). $Va^1$ represents a divalent hydrocarbon group which may have an ether bond, a urethane bond, or an amide bond, $n_{a1}$ represents 0 to 2, and $Ra^1$ represents an acid dissociable group represented by any of Formulae (a1-r-1) and (a1-r-2). $Wa^1$ represents a $(n_{a2}+1)$-valent hydrocarbon group, $n_{a2}$ represents 1 to 3, and $Ra^e$ represents an acid dissociable group represented by Formula (a1-r-1) or (a1-r-3)].

In Formula (a1-3), the hydrocarbon group as $Va^1$ may be an aliphatic hydrocarbon group or an aromatic hydrocarbon group. The aliphatic hydrocarbon group indicates a hydrocarbon group that has no aromaticity. The aliphatic hydrocarbon group as the divalent hydrocarbon group represented by $Va^1$ may be saturated or unsaturated. In general, it is preferable that the aliphatic hydrocarbon group is saturated.

More specific examples of the aliphatic hydrocarbon group include a linear or branched aliphatic hydrocarbon group and an aliphatic hydrocarbon group having a ring in the structure thereof.

In addition, examples of $Va^1$ include the divalent hydrocarbon group that is bonded through an ether bond, a urethane bond, or an amide bond.

The linear or branched aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$], and a pentamethylene group [—$(CH_2)_5$].

As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Examples of the aliphatic hydrocarbon group having a ring in the structure thereof include an alicyclic hydrocarbon group (a group in which two hydrogen atoms have been removed from an aliphatic hydrocarbon ring), a group in which an alicyclic hydrocarbon group is bonded to the terminal of a linear or branched aliphatic hydrocarbon group, and a group in which an alicyclic hydrocarbon group is interposed in a linear or branched aliphatic hydrocarbon group. Examples of the linear or branched aliphatic hydrocarbon group include the same groups as those described above.

The alicyclic hydrocarbon group has preferably 3 to 20 carbon atoms and more preferably 3 to 12 carbon atoms.

The alicyclic hydrocarbon group may be monocyclic or polycyclic. As the monocyclic alicyclic hydrocarbon group, a group in which two hydrogen atoms have been removed from a monocycloalkane is preferable. The number of carbon atoms of the monocycloalkane is preferably in a range of 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Specific examples thereof include adamantane, norbornane, isobornane, tricyclodecane, and tetracyclododecane.

The aromatic hydrocarbon group is a hydrocarbon group having an aromatic ring.

The aromatic hydrocarbon group as the divalent hydrocarbon group represented by $Va^1$ has preferably 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring contained in the aromatic hydrocarbon group include aromatic hydrocarbon rings such as benzene, biphenyl, fluorene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (for example, a group formed by further removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

In Formula (a1-4), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity and may be saturated or unsaturated. In general, it is preferable that the aliphatic hydrocarbon group is saturated. Examples of the aliphatic hydrocarbon group include a linear or branched aliphatic hydrocarbon group, an aliphatic hydrocarbon group having a ring in the structure thereof, and a group obtained by combining the linear or branched aliphatic hydrocarbon group with the aliphatic hydrocarbon group having a ring in the structure thereof, and specific examples thereof include the same groups as those for $Va^1$ in Formula (a1-3).

The valency of $n_{a2}+1$ is preferably divalent, trivalent, or tetravalent and more preferably divalent or trivalent.

As Formula (a1-4), a constitutional unit represented by Formula (a1-4-01) is particularly preferable.

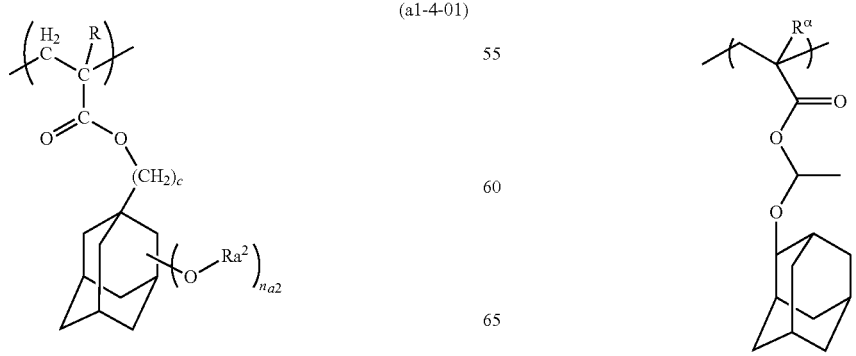

[In Formula (a1-4-01), $Ra^2$ represents an acid dissociable group represented by Formula (a1-r-1) or (a1-r-3). $n_{a2}$ represents an integer of 1 to 3, preferably 1 or 2, and more preferably 1. c represents an integer of 0 to 3, preferably 0 or 1, and more preferably 1. R has the same definition as described above.]

Specific examples of Formulae (a1-3) and (a1-4) are shown below. In the formulae shown below, $R^\alpha$ represents a hydrogen atom, a methyl group, or a trifluoromethyl group.

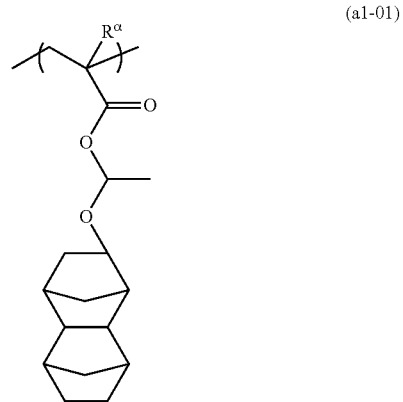

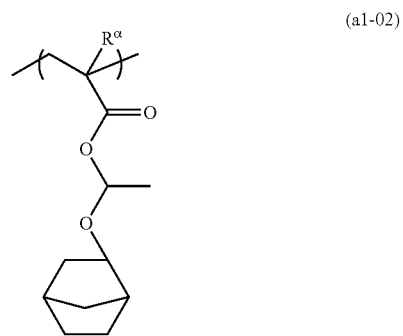

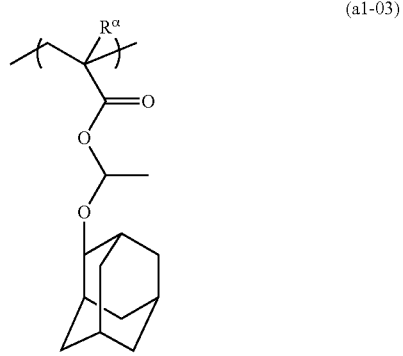

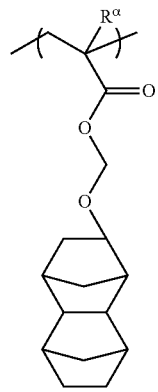 (a1-04)
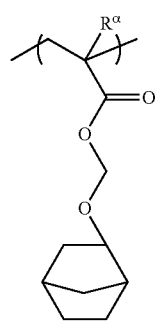 (a1-05)
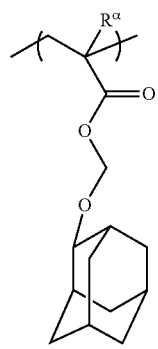 (a1-06)
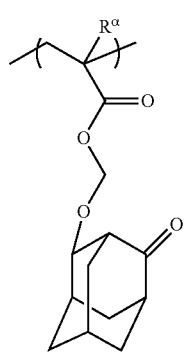 (a1-07)
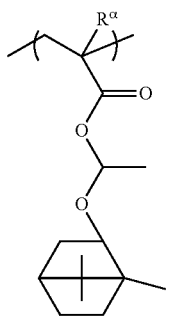 (a1-08)
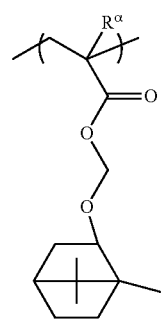 (a1-09)
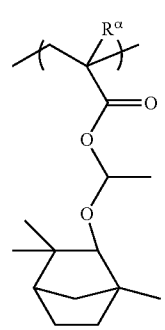 (a1-10)
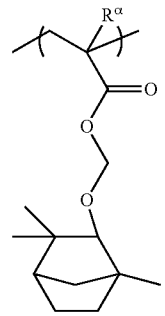 (a1-11)

(a1-12) 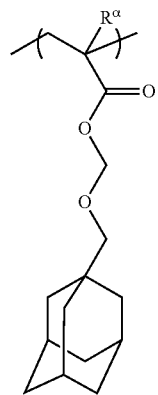
(a1-16) 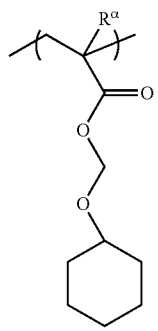
(a1-13) 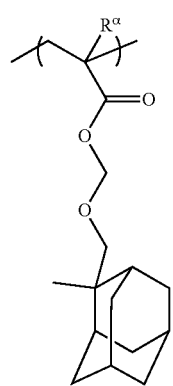
(a1-17) 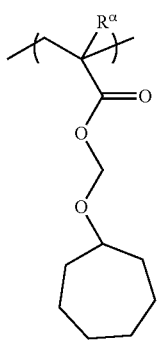
(a1-14) 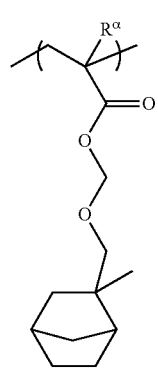
(a1-18) 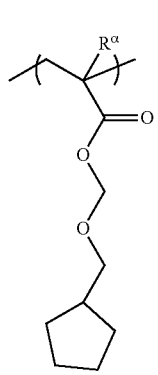
(a1-15) 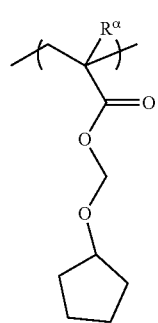
(a1-19) 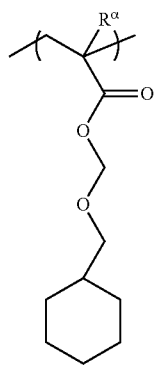

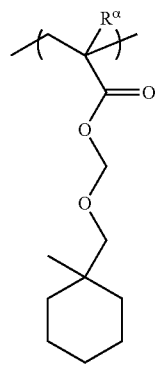 (a1-20)
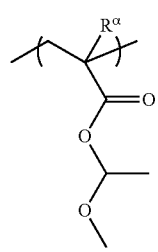 (a1-21)
(a1-22)
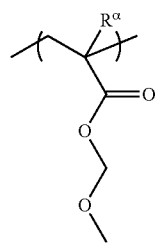
(a1-23)
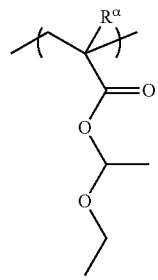
(a1-24)
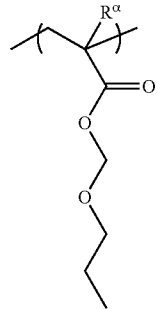
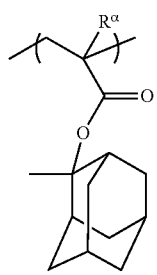 (a1-25)
(a1-26)
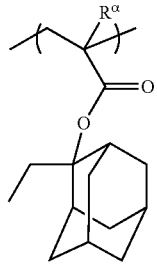
(a1-27)
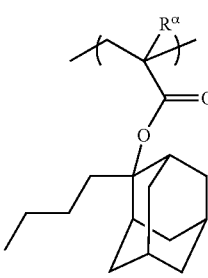
(a1-28)
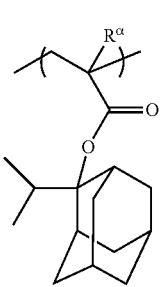
(a1-29)
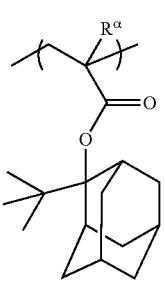
(a1-30)
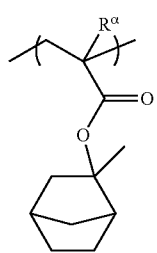

-continued
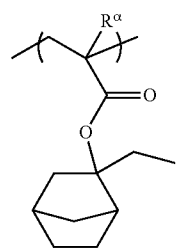
(a1-31)
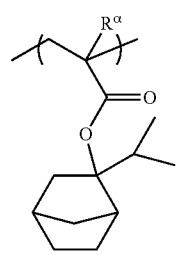
(a1-32)
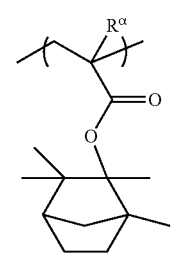
(a1-33)
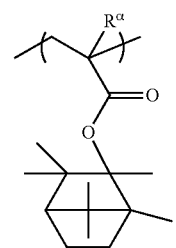
(a1-34)
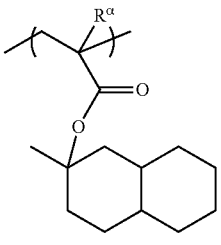
(a1-35)
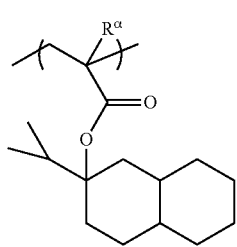
(a1-36)
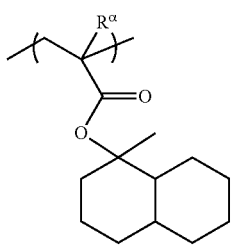
(a1-37)
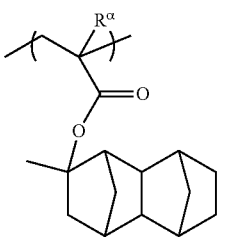
(a1-38)
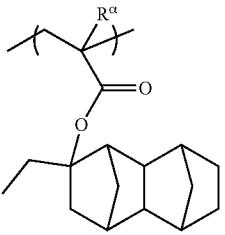
(a1-39)
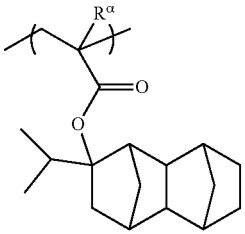
(a1-40)
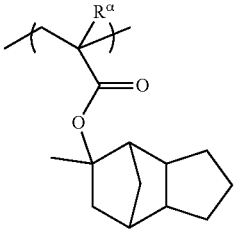
(a1-41)
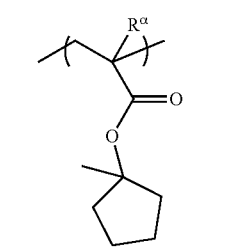
(a1-42)

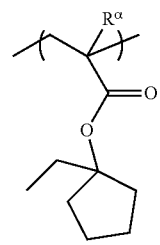 (a1-43)
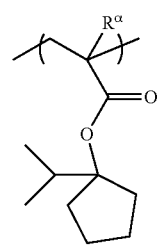 (a1-44)
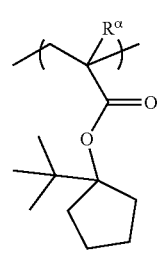 (a1-45)
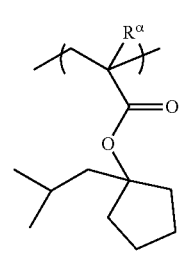 (a1-46)
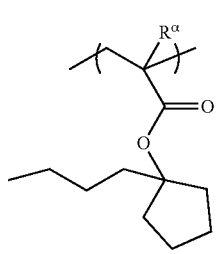 (a1-47)
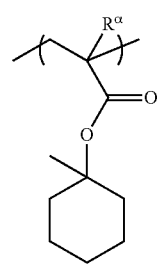 (a1-48)
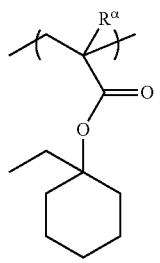 (a1-49)
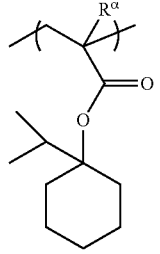 (a1-50)
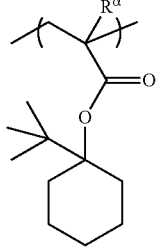 (a1-51)
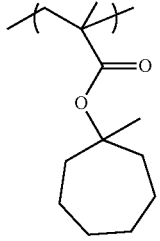 (a1-52)
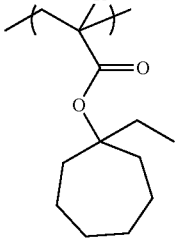 (a1-53)
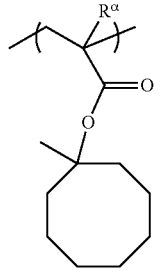 (a1-54)

(a1-55)
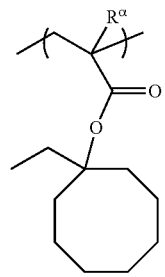
(a1-56)
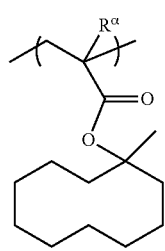
(a1-57)
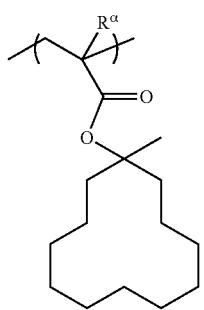
(a1-58)
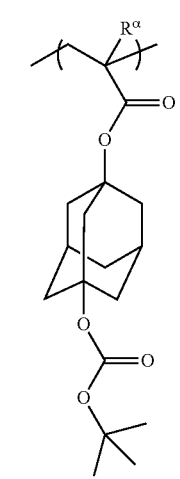
(a1-59)
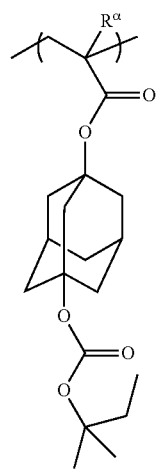
(a1-60)
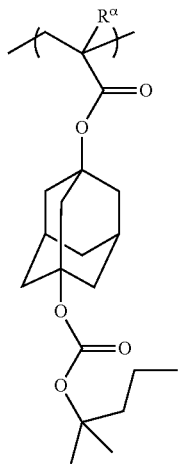
(a1-61)
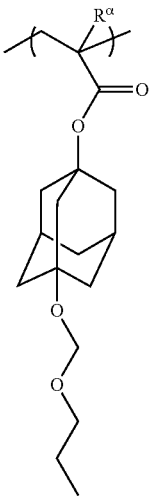

(a1-62)
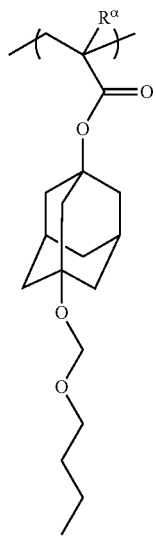

(a1-63)
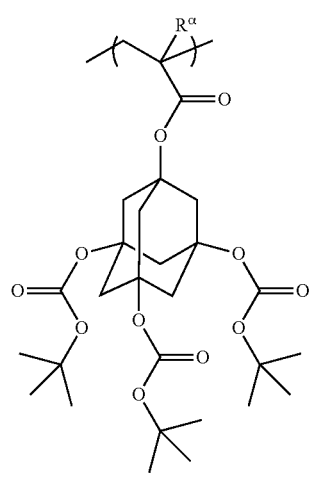

(a1-64)
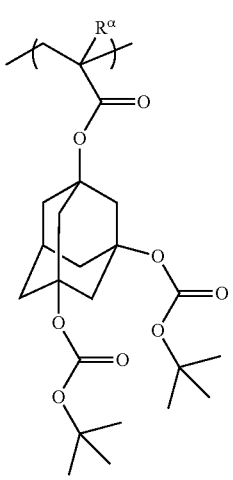

(a1-65)
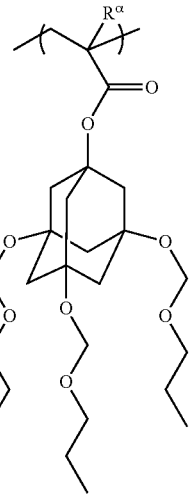

(a1-66)
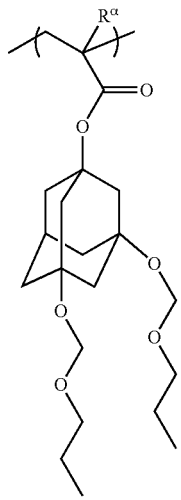

The proportion of the constitutional unit (a1) in the component (A) is preferably in a range of 20% to 80% by mole, more preferably in a range of 20% to 75% by mole, and still more preferably in a range of 25% to 70% by mole with respect to the total amount of all constitutional units constituting the component (A). In a case where the proportion thereof is set to be greater than or equal to the lower limit, the lithographic characteristics such as the sensitivity, the resolution, and LWR are also improved. On the contrary, in a case where the proportion thereof is set to be less than or equal to the upper limit, the constitutional unit (a1) and other constitutional units are likely to be balanced.

(Constitutional Unit (a2))

In the present invention, the polymer compound (A1) contained in the component (A) may contain a constitutional unit (a2) containing a —$SO_2$-containing cyclic group, a lactone-containing cyclic group, a carbonate-containing cyclic group, or a heterocyclic group other than these cyclic groups.

In a case where the component (A) is used for forming a resist film, the —$SO_2$-containing cyclic group, the lactone-containing cyclic group, the carbonate-containing cyclic group, or the heterocyclic group other than these cyclic groups contained in the constitutional unit (a2) is effective for enhancing the adhesiveness of the resist film to the substrate and enhancing the affinity for a developing solution containing water.

Further, in a case where the constitutional unit (a1) contains a —SO$_2$-containing cyclic group, a lactone-containing cyclic group, a carbonate-containing cyclic group, or a heterocyclic group other than these cyclic groups, the constitutional unit also corresponds to the constitutional unit (a2), but such a constitutional unit corresponds to the constitutional unit (a1) and does not correspond to the constitutional unit (a2).

It is preferable that the constitutional unit (a2) is a constitutional unit represented by Formula (a2-1).

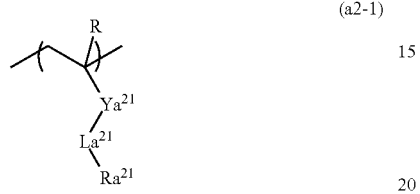

(a2-1)

[In the formula, R represents a hydrogen atom, an alkyl group having 1 to 5 carbon atoms, or a halogenated alkyl group having 1 to 5 carbon atoms, Ya$^{21}$ represents a single bond or a divalent linking group, La$^{21}$ represents —O—, —COO—, —CON(R')—, —OCO—, —CONHCO—, or —CONHCS—, and R' represents a hydrogen atom or a methyl group. In a case where La$^{21}$ represents —O—, Ya$^{21}$ does not represent —CO—. Ra$^{21}$ represents a —SO$_2$-containing cyclic group, a lactone-containing cyclic group, a carbonate-containing cyclic group, or a heterocyclic group other than these cyclic groups.]

In Formula (a2-1), it is preferable that Ra$^{21}$ represents a —SO$_2$-containing cyclic group, a lactone-containing cyclic group, a heterocyclic group, or a carbonate-containing cyclic group.

The "—SO$_2$-containing cyclic group" indicates a cyclic group that has a ring containing —SO$_2$— in the ring skeleton thereof. Specifically, the —SO$_2$-containing cyclic group is a cyclic group in which the sulfur atom (S) in —SO$_2$— forms a part of the ring skeleton of the cyclic group. In a case where the ring containing —SO$_2$— in the ring skeleton thereof is counted as the first ring and the group contains only the ring, the group is referred to as a monocyclic group. Further, in a case where the group has other ring structures, the group is referred to as a polycyclic group regardless of the structures. The —SO$_2$-containing cyclic group may be a monocyclic group or a polycyclic group.

As the —SO$_2$-containing cyclic group, a cyclic group containing —O—SO$_2$— in the ring skeleton thereof, that is, a cyclic group having a sultone ring in which —O—S— in —O—SO$_2$— forms a part of the ring skeleton thereof is particularly preferable. More specific examples of the —SO$_2$-containing cyclic group include groups respectively represented by Formulae (a5-r-1) to (a5-r-4).

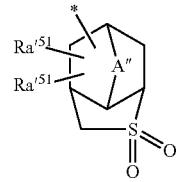

(a5-r-1)

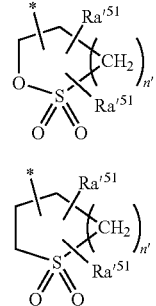

(a5-r-2)

(a5-r-3)

(a5-r-4)

[In the formulae, each Ra'$^{51}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group, R" represents a hydrogen atom or an alkyl group, A" represents an alkylene group having 1 to 5 carbon atoms which may contain an oxygen atom or a sulfur atom, an oxygen atom, or a sulfur atom, n' represents an integer of 0 to 2, and "*" represents a bonding position.]

In Formulae (a5-r-1) to (a5-r-4), A" has the same definition as that for A" in Formulae (a2-r-1) to (a2-r-7). Examples of the alkyl group, the alkoxy group, the halogen atom, the halogenated alkyl group, —COOR", —OC(=O)R", and the hydroxyalkyl group as Ra'$^{51}$ include the same groups as those for Ra'$^{21}$ in Formulae (a2-r-1) to (a2-r-7).

Specific examples of the groups respectively represented by Formulae (a5-r-1) to (a5-r-4) are shown below. In the formulae, "Ac" represents an acetyl group.

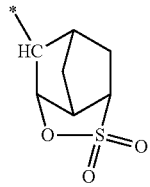

(r-sl-1-1)

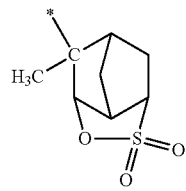

(r-sl-1-2)

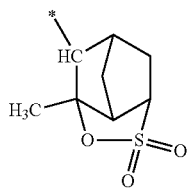

(r-sl-1-3)

-continued
(r-sl-1-4)
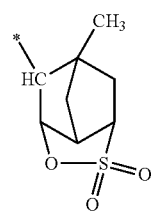
(r-sl-1-5)
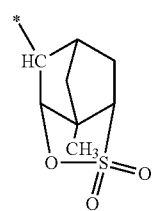
(r-sl-1-6)
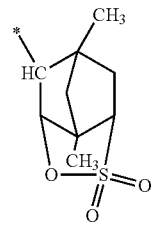
(r-sl-1-7)
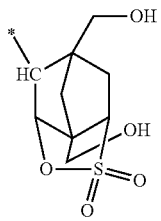
(r-sl-1-8)
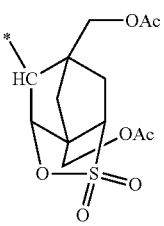
(r-sl-1-9)
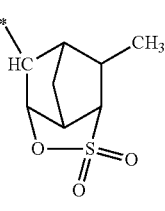
(r-sl-1-10)
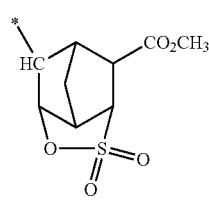
-continued
(r-sl-1-11)
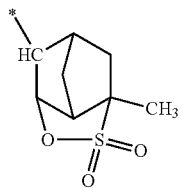
(r-sl-1-12)
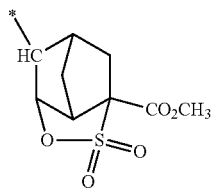
(r-sl-1-13)
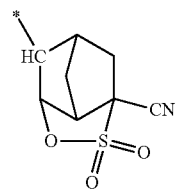
(r-sl-1-14)
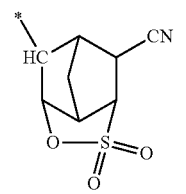
(r-sl-1-15)
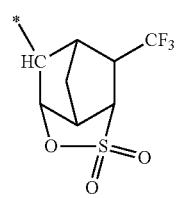
(r-sl-1-16)
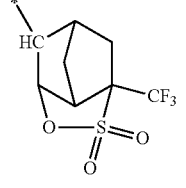
(r-sl-1-17)
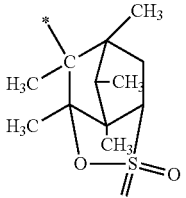
(r-sl-1-18)
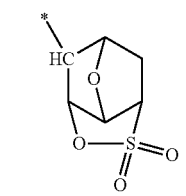

(r-s1-1-19)
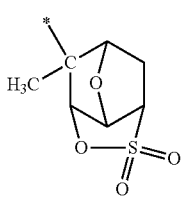
(r-sl-1-20)
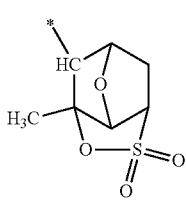
(r-sl-1-21)
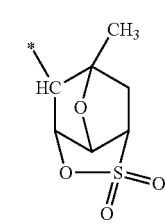
(r-sl-1-22)
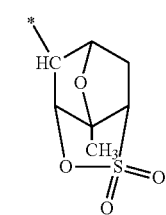
(r-sl-1-23)
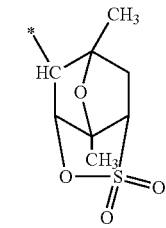
(r-sl-1-24)
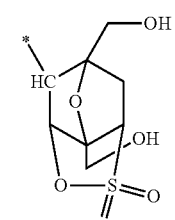
(r-sl-1-25)
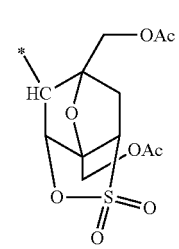
(r-sl-1-26)
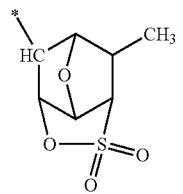
(r-sl-1-27)
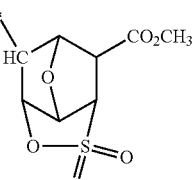
(r-sl-1-28)
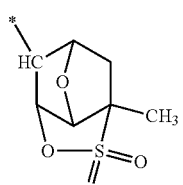
(r-sl-1-29)
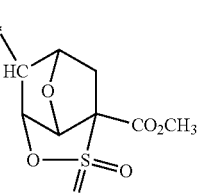
(r-sl-1-30)
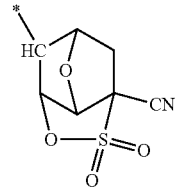
(r-sl-1-31)
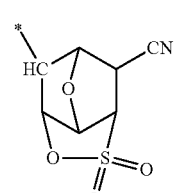
(r-sl-1-32)
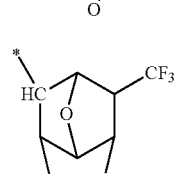
(r-sl-1-33)
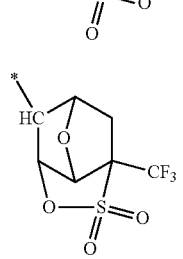

-continued (r-sl-2-1)
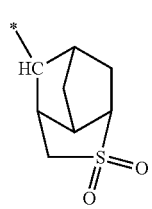

(r-sl-2-2)
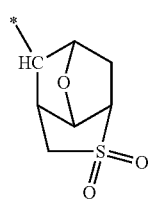

(r-sl-3-1)
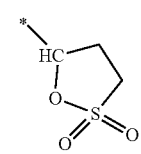

(r-sl-4-1)
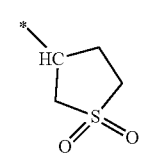

[In the formulae, "*" represents a bonding position.]

In the present invention, in a case where the constitutional unit (a2) contains a —SO$_2$-containing cyclic group, the —SO$_2$-containing cyclic group is not particularly limited as long as the log P value of an acrylic acid ester monomer containing the —SO$_2$-containing cyclic group is less than 1.2, and among examples thereof, a group represented by Formula (a5-r-1) is preferable, at least one selected from the group consisting of groups represented by Formulae (r-s1-1-1), (r-s1-1-18), (r-s1-3-1), and (r-s1-4-1) is more preferable, and a group represented by Formula (r-s1-1-1) is most preferable.

The "lactone-containing cyclic group" indicates a cyclic group that has a ring (lactone ring) containing —O—C(=O)— in the ring skeleton. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group is not particularly limited, and an optional group can be used. Specific examples thereof include groups respectively represented by Formulae (a2-r-1) to (a2-r-7).

(a2-r-1)
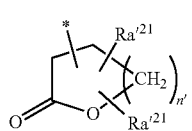

-continued (a2-r-2)
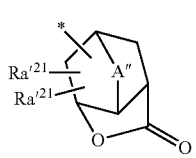

(a2-r-3)
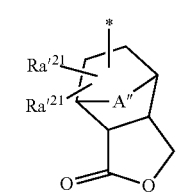

(a2-r-4)
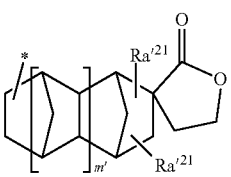

(a2-r-5)
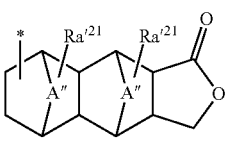

(a2-r-6)
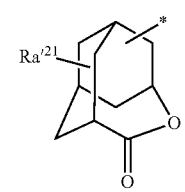

(a2-r-7)
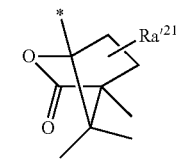

[In the formulae, each Ra$'^{21}$ independently represents a hydrogen atom, an alkyl group, an alkoxy group, a halogen atom, a halogenated alkyl group, a hydroxyl group, —COOR″, —OC(=O)R″, a hydroxyalkyl group, or a cyano group, R″ represents a hydrogen atom or an alkyl group, A″ represents an alkylene group having 1 to 5 carbon atoms which may have an oxygen atom or a sulfur atom, an oxygen atom, or a sulfur atom, n' represents an integer of 0 to 2, m' represents 0 or 1, and "*" represents a bonding position.]

In Formulae (a2-r-1) to (a2-r-7), A″ represents an alkylene group having 1 to 5 carbon atoms which may have an oxygen atom (—O—) or a sulfur atom (—S—), an oxygen atom, or a sulfur atom. As the alkylene group having 1 to 5 carbon atoms as A″, a linear or branched alkylene group is preferable, and examples thereof include a methylene group, an ethylene group, an n-propylene group, and an isopropylene group. In a case where the alkylene group has an oxygen atom or a sulfur atom, specific examples thereof include groups in which —O— or —S— is interposed in the terminal of the alkylene group or between the carbon atoms of the alkylene group. Further, examples thereof include —O—CH$_2$—, —CH$_2$—O—CH$_2$—, —S—CH$_2$—, and —CH$_2$—S—CH$_2$—. As A″, an alkylene group having 1 to 5 carbon atoms or —O— is preferable, an alkylene group having 1 to 5 carbon atoms is more preferable, and a methylene group is most preferable. Each $Ra'^{21}$ independently represents an alkyl group, an alkoxy group, a halogen atom, a halogenated alkyl group, —COOR", —OC(=O)R", a hydroxyalkyl group, or a cyano group.

As the alkyl group represented by $Ra'^{21}$, an alkyl group having 1 to 5 carbon atoms is preferable.

It is preferable that the alkoxy group as $Ra'^{21}$ is an alkoxy group having 1 to 6 carbon atoms. Further, it is preferable that the alkoxy group is linear or branched. Specific examples thereof include a group formed by linking the above-described alkyl group exemplified as the alkyl group represented by $Ra'^{21}$ to an oxygen atom (—O—).

Examples of the halogen atom as $Ra'^{21}$ include a fluorine atom, a chlorine atom, a bromine atom, and an iodine atom. Among these, a fluorine atom is preferable.

Examples of the halogenated alkyl group as $Ra'^{21}$ include a group in which some or all hydrogen atoms of the alkyl group as $Ra'^{21}$ have been substituted with the halogen atoms. As the halogenated alkyl group, a fluorinated alkyl group is preferable, and a perfluoroalkyl group is particularly preferable.

Specific examples of the groups respectively represented by Formulae (a2-r-1) to (a2-r-7) are shown below.

(r-lc-1-1)

(r-lc-1-2)

(r-lc-1-3)

(r-lc-1-4)

(r-lc-1-5)
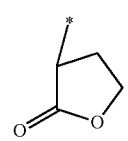

(r-lc-1-6)
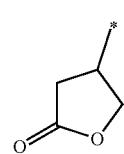

(r-lc-1-7)
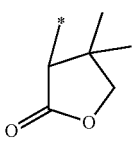

(r-lc-2-1)
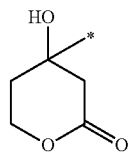

(r-lc-2-2)
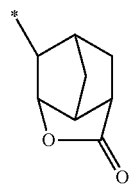

(r-lc-2-3)
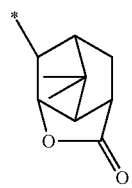

(r-lc-2-4)
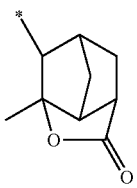

(r-lc-2-5)
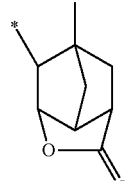

(r-lc-2-6)
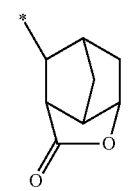

(r-lc-2-7)
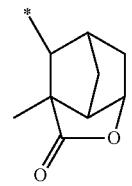

(r-lc-2-8)
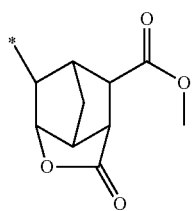
(r-lc-2-9)
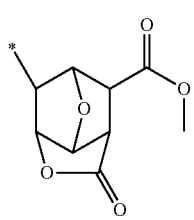
(r-lc-2-10)
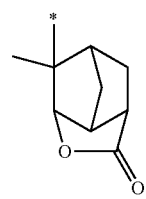
(r-lc-2-11)
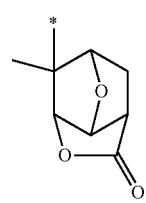
(r-lc-2-12)
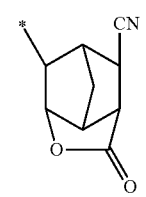
(r-lc-2-13)
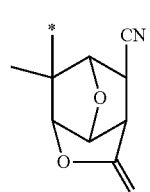
(r-lc-3-1)
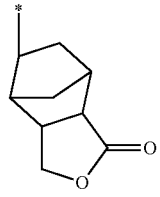
(r-lc-3-2)
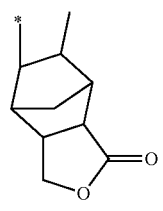
(r-lc-3-3)
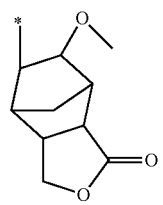
(r-lc-3-4)
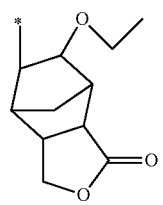
(r-lc-3-5)
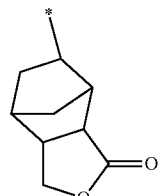
(r-lc-4-1)
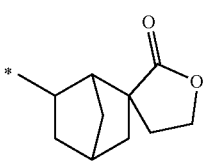
(r-lc-4-2)
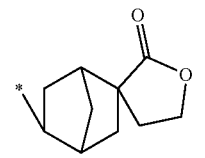
(r-lc-4-3)
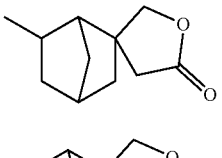
(r-lc-4-4)
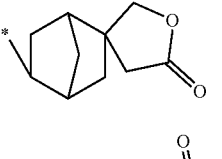
(r-lc-4-5)
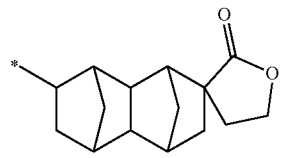

-continued (r-lc-4-6)
(r-lc-4-7)
(r-lc-4-8)
(r-lc-4-9)
(r-lc-5-1)
(r-lc-5-2)
(r-lc-5-3)

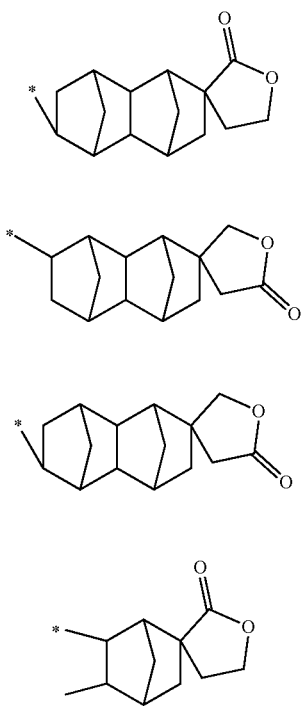
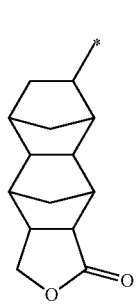
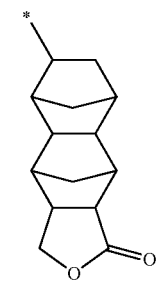
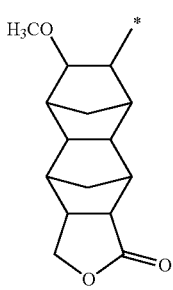

-continued (r-lc-5-4)
(r-lc-6-1)
(r-lc-7-1)

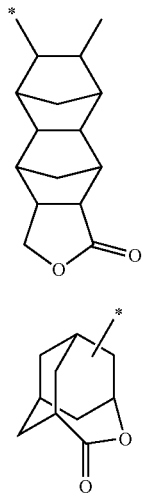
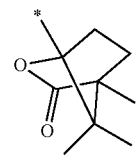
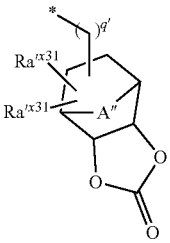

[In the formulae, "*" represents a bonding position.]

In the present invention, as the constitutional unit (a2), a group represented by Formula (a2-r-1) or (a2-r-2) is preferable, and a group represented by Formula (r-lc-1-1) or (r-lc-2-7) is more preferable.

The "carbonate-containing cyclic group" indicates a cyclic group that has a ring (a carbonate ring) containing —O—C(=O)—O— in the ring skeleton thereof. In a case where the carbonate ring is counted as the first ring and the group has only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

Specific examples thereof include groups respectively represented by Formulae (ax3-r-1) to (ax3-r-3).

(ax3-r-1)

(ax3-r-2)

(ax3-r-3)

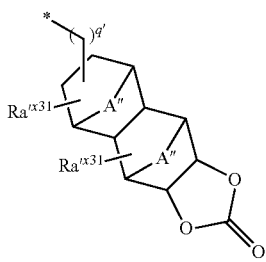

[In the formulae, each $Ra^{rx31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group, R" represents a hydrogen atom or an alkyl group, A" represents an alkylene group having 1 to 5 carbon atoms which may have an oxygen atom or a sulfur atom, an oxygen atom, or a sulfur atom, q' represents an integer of 0 or 1, and "*" represents a bonding position.]

In Formulae (ax3-r-1) to (ax3-r-3), specific examples of A" are the same as those for A" in Formulae (a2-r-1) to (a2-r-7). Examples of the alkyl group, the alkoxy group, the halogen atom, the halogenated alkyl group, —COOR", —OC(=O)R", and the hydroxyalkyl group as $Ra^{rx31}$ include the same groups as those for $Ra'^{21}$ in Formulae (a2-r-1) to (a2-r-7).

Specific examples of groups represented by Formulae (ax3-r-1) to (ax3-r-3) are shown below.

(r-cr-1-1)

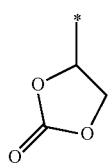

(r-cr-1-2)

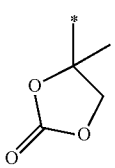

(r-cr-1-3)

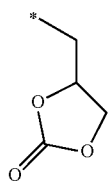

(r-cr-1-4)

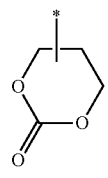

(r-cr-1-5)

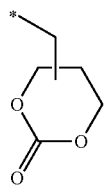

(r-cr-1-6)

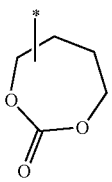

(r-cr-1-6)

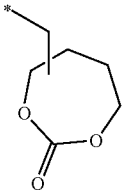

(r-cr-2-1)

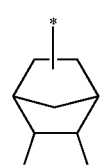

(r-cr-2-2)

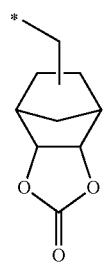

(r-cr-2-3)

(r-cr-2-4)

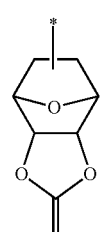

(r-cr-3-1)
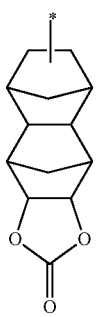

(r-cr-3-2)
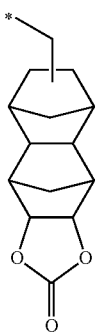

(r-cr-3-3)

(r-cr-3-4)
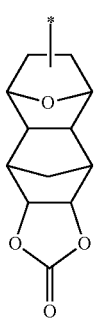

(r-cr-3-5)
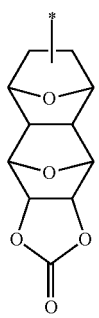

[In the formulae, "*" represents a bonding position.]

The "heterocyclic group" indicates a cyclic group having one or more non-carbon atoms in addition to carbon atoms, and examples thereof include a heterocyclic group represented by any of Formulae (r-hr-1) to (r-hr-16) and a nitrogen-containing hetero ring. Examples of the nitrogen-containing heterocyclic group include a cycloalkyl group having 3 to 8 carbon atoms which may be substituted with one or two oxo groups. Suitable examples of the cycloalkyl group include 2,5-dioxopyrrolidine and 2,6-dioxopiperidine.

(r-hr-1)
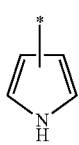

(r-hr-2)

(r-hr-3)
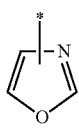

(r-hr-4)
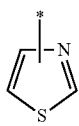

(r-hr-5)
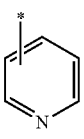

(r-hr-6)
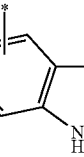

(r-hr-7) 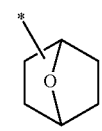

(r-hr-8) 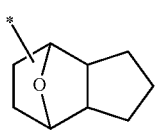

(r-hr-9) 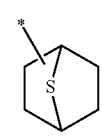

(r-hr-10) 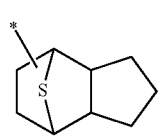

(r-hr-11) 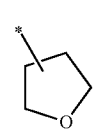

(r-hr-12) 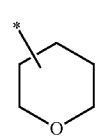

(r-hr-13) 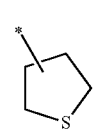

(r-hr-14) 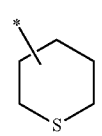

(r-hr-15) 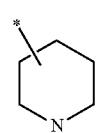

(r-hr-16) 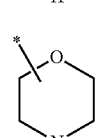

[In the formulae, "*" represents a bonding position.]

The constitutional unit (a2) contains preferably a lactone-containing cyclic group and more preferably a lactone-containing cyclic group represented by any of Formulae (a2-r-1) to (a2-r-7).

In a case where the constitutional unit (a1) and the constitutional unit (a2) containing a lactone-containing cyclic group are used for the polymer compound (A1), a resist composition and a resist pattern forming method which enable formation of a resist pattern with improved CDU and EOP can be provided.

Specific examples of the constitutional unit (a2) containing a lactone-containing cyclic group are shown below. In the formulae shown below, $R^\alpha$ represents a hydrogen atom, a methyl group, or a trifluoromethyl group.

(a2-11) 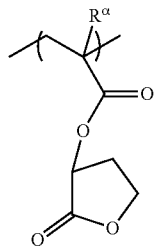

(a2-12) 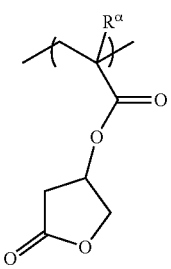

(a2-13) 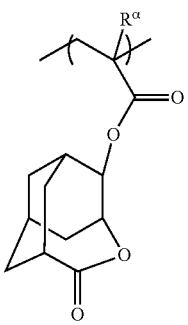

(a2-14) 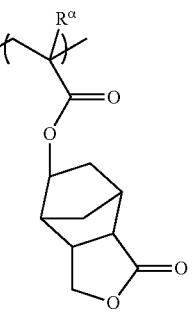

(a2-15) 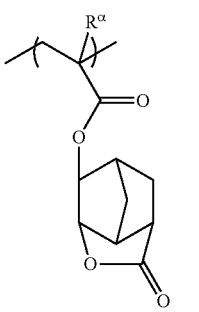

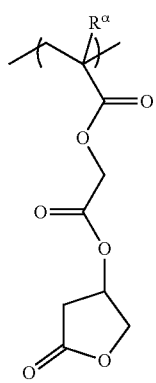
(a2-16)

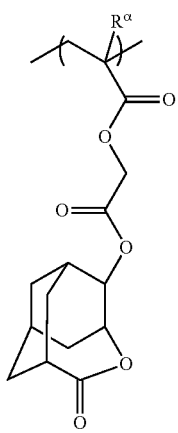
(a2-17)

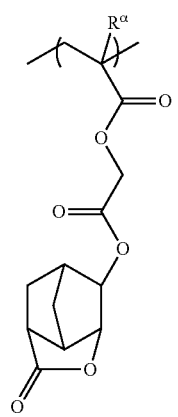
(a2-18)

In a case where the polymer compound (A1) component has the constitutional unit (a2), the polymer compound (A1) component may have one or two or more constitutional units (a2).

The proportion of the constitutional unit (a2) is preferably in a range of 1% to 60% by mole and more preferably in a range of 5% to 50% by mole with respect to the total amount of all constitutional units constituting the component (A).

In a case where the proportion of the constitutional unit (a2) is greater than or equal to the above-described lower limit, the effect obtained by allowing the polymer compound (A1) to have the constitutional unit (a2) can be satisfactorily achieved. On the contrary, in a case where the proportion of the constitutional unit (a2) is less than or equal to the above-described upper limit, the constitutional unit (a2) and other constitutional units can be balanced, and various lithography characteristics and the pattern shape are improved.

(Constitutional Unit (a3))

A constitutional unit (a3) is a constitutional unit containing a polar group-containing aliphatic hydrocarbon group (here, excluding those corresponding to the above-described constitutional units (a1) and (a2)).

It is considered that in a case where the polymer compound (A1) component has the constitutional unit (a3), the hydrophilicity of the base material component (A) is increased, and the increase in hydrophilicity contributes to improvement of the resolution.

Examples of the polar group include a hydroxyl group, a cyano group, a carboxy group, or a hydroxyalkyl group in which some hydrogen atoms in the alkyl group have been substituted with fluorine atoms. Among these, a hydroxyl group is particularly preferable.

Examples of the aliphatic hydrocarbon group include a linear or branched hydrocarbon group (preferably an alkylene group) having 1 to 10 carbon atoms and a cyclic aliphatic hydrocarbon group (a cyclic group). The cyclic group may be a monocyclic group or a polycyclic group. For example, the cyclic group can be appropriately selected from a plurality of groups that have been proposed in the resins for resist compositions for ArF excimer lasers. As the cyclic group, a polycyclic group is preferable, and a polycyclic group having 7 to 30 carbon atoms is more preferable.

Among the examples, constitutional units derived from acrylic acid ester that include an aliphatic polycyclic group containing a hydroxyl group, a cyano group, a carboxy group, or a hydroxyalkyl group in which some hydrogen atoms in the alkyl group have been substituted with fluorine atoms are more preferable. Examples of the polycyclic group include groups in which two or more hydrogen atoms have been removed from bicycloalkane, tricycloalkane, tetracycloalkane, or the like. Specific examples thereof include groups in which two or more hydrogen atoms have been removed from a polycycloalkane such as adamantane, norbornane, isobornane, tricyclodecane, or tetracyclododecane. Among these polycyclic groups, a group in which two or more hydrogen atoms have been removed from adamantane, a group in which two or more hydrogen atoms have been removed from norbornane, or a group in which two or more hydrogen atoms have been removed from tetracyclododecane is industrially preferable.

The constitutional unit (a3) is not particularly limited as long as the constitutional unit contains a polar group-containing aliphatic hydrocarbon group, and an optional constitutional unit can be used.

As the constitutional unit (a3), a constitutional unit derived from acrylic acid ester in which the hydrogen atom bonded to the carbon atom at the α-position may be substituted with a substituent, which is a constitutional unit containing a polar group-containing aliphatic hydrocarbon group is preferable.

As the constitutional unit (a3), a constitutional unit derived from hydroxyethyl ester of acrylic acid is preferable in a case where the hydrocarbon group in a polar group-containing aliphatic hydrocarbon group is a linear or branched hydrocarbon group having 1 to 10 carbon atoms. Further, in a case where the hydrocarbon group is a polycyclic group, a constitutional unit represented by any of Formulae (a3-1) to (a3-5) is preferable, and a constitutional unit represented by Formula (a3-1) is more preferable.

(a3-1) 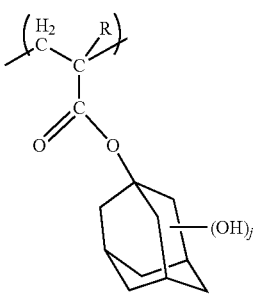

(a3-2) 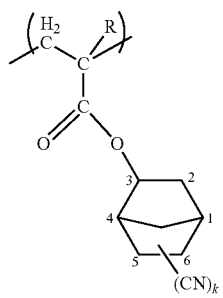

(a3-3) 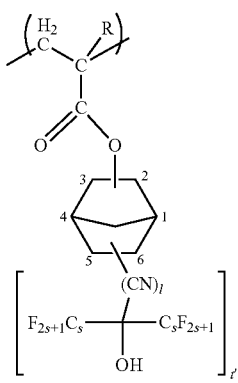

(a3-4) 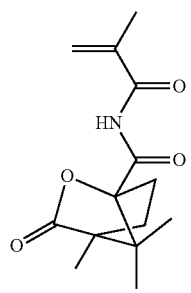

(a3-5) 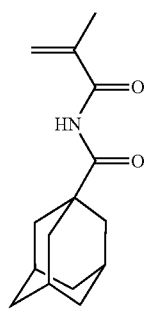

[In the formulae, R has the same definition as described above, j represents an integer of 1 to 3, k represents an integer of 1 to 3, t' represents an integer of 1 to 3, l represents an integer of 1 to 5, and s represents an integer of 1 to 3.]

In Formula (a3-1), j represents preferably 1 or 2 and more preferably 1. In a case where j represents 2, it is preferable that the hydroxyl group is bonded to the 3- and 5-positions of the adamantyl group. In a case where j represents 1, it is preferable that the hydroxyl group is bonded to the 3-position of the adamantyl group.

It is preferable that j represents 1, and it is particularly preferable that the hydroxyl group is bonded to the 3-position of the adamantyl group.

In Formula (a3-2), it is preferable that k represents 1. It is preferable that the cyano group is bonded to the 5- or 6-position of the norbornyl group.

In Formula (a3-3), it is preferable that t' represents 1. It is preferable that l represents 1. It is preferable that s represents 1. Further, it is preferable that a 2-norbornyl group or 3-norbornyl group is bonded to the terminal of the carboxy group of the acrylic acid. It is preferable that the fluorinated alkyl alcohol is bonded to the 5- or 6-position of the norbornyl group.

The polymer compound (A1) component may contain one or two or more constitutional units (a3).

The proportion of the constitutional unit (a3) in the polymer compound (A1) component is preferably in a range of 5% to 50% by mole, more preferably in a range of 5% to 40% by mole, and still more preferably in a range of 5% to 25% by mole with respect to the total amount of all constitutional units constituting the resin component (A1).

In a case where the proportion of the constitutional unit (a3) is set to be greater than or equal to the above-described lower limit, the effect obtained by allowing the polymer compound (A1) to have the constitutional unit (a3) can be satisfactorily achieved. On the contrary, in a case where the proportion thereof is set to be less than or equal to the above-described upper limit, the constitutional unit (a3) and other constitutional units are likely to be balanced.

The polymer compound (A1) component may have a constitutional unit (a4) described below in addition to the constitutional units (a1), (a2), and (a3).

(Constitutional Unit (a4))

The constitutional unit (a4) is a constitutional unit containing an acid non-dissociable cyclic group. In a case where the polymer compound (A1) component has the constitutional unit (a4), the dry etching resistance of a resist pattern to be formed is improved. In addition, the hydrophobicity of the polymer compound (A1) component is increased. The improvement of the hydrophobicity is considered to contribute to improvement of the resolution, the resist pattern shape, and the like particularly in a case of the organic solvent development.

The "acid non-dissociable cyclic group" in the constitutional unit (a4) is a cyclic group remaining in the constitutional unit without being dissociated due to the action of an acid in a case where an acid is generated from a component (B) described below upon light exposure.

As the constitutional unit (a4), for example, a constitutional unit derived from acrylic acid ester containing an acid non-dissociable aliphatic cyclic group is preferable. Examples of the cyclic group include the same groups as those exemplified in the section of the constitutional unit (a1), and a plurality of cyclic groups which have been known in the related art as those used for resin components of resist compositions for an ArF excimer laser, a KrF excimer laser (preferably an ArF excimer laser), and the like can be used.

At least one selected from a tricyclodecyl group, an adamantyl group, a tetracyclododecyl group, an isobornyl group, and a norbornyl group is particularly preferable from the viewpoint of the industrial availability. These polycyclic groups may have a linear or branched alkyl group having 1 to 5 carbon atoms as a substituent.

Specific examples of the constitutional unit (a4) include those having structures represented by Formulae (a4-1) to (a4-7).

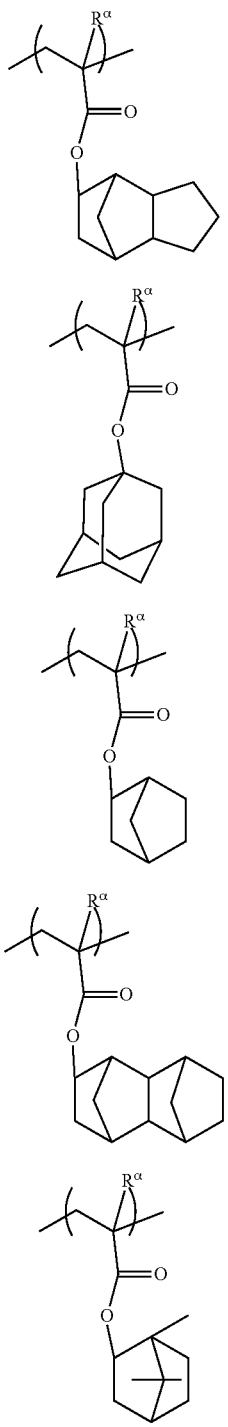

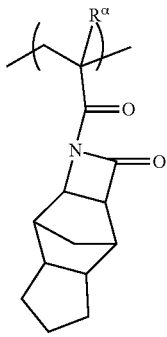

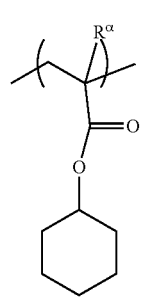

[In the formulae, $R^\alpha$ represents a hydrogen atom, a methyl group, or a trifluoromethyl group.]

The polymer compound (A1) component may contain one or two or more constitutional units (a4).

In a case where the polymer compound (A1) component contains the constitutional unit (a4), the proportion of the constitutional unit (a4) is preferably in a range of 1% to 30% by mole and more preferably in a range of 10% to 20% by mole with respect to the total amount of all constitutional units constituting the polymer compound (A1) component.

It is preferable that the polymer compound (A1) component has the constitutional units (a1) and (a2) or is a copolymer having the constitutional units (a1), (a2), and (a3).

The polymer compound (A1) component can be obtained by polymerizing a monomer, from which each constitutional unit is derived, by performing known radical polymerization using a radical polymerization initiator such as azobisisobutyronitrile (AIBN) or dimethyl azobisisobutyrate.

Further, a —C(CF$_3$)$_2$—OH group may be introduced into the terminal of the polymer compound (A1) component in a case of the polymerization using a chain transfer agent such as HS—CH$_2$—CH$_2$—CH$_2$—C(CF$_3$)$_2$—OH in combination. As described above, a copolymer into which a hydroxyalkyl group, formed by substitution of some hydrogen atoms in the alkyl group with fluorine atoms, has been introduced is effective for reducing development defects and reducing line edge roughness (LER: uneven irregularities of a line side wall).

In the present invention, the mass average molecular weight (Mw) (in terms of polystyrene according to gel permeation chromatography) of the polymer compound (A1) component is not particularly limited, but is preferably in a range of 1000 to 50000, more preferably in a range of 1500 to 30000, still more preferably in a range of 2000 to 20000, and most preferably in a range of 5000 to 16000. In a case where the mass average molecular weight of the polymer compound (A1) is less than or equal to the above-described upper limit, the resist composition exhibits a satisfactory solubility in a resist solvent so as to be used as a resist. On the contrary, in a case where the mass average molecular weight of the polymer compound (A1) is greater than or equal to the above-described lower limit, the dry etching resistance and the cross-sectional shape of the resist pattern are excellent.

The polymer compound (A1) component may be used alone or in combination of two or more kinds thereof.

The proportion of the polymer compound (A1) component in the base material component (A) is preferably 25% by mass or greater, more preferably 50% by mass, and still more preferably 75% by mass and may be 100% by mass with respect to the total mass of the base material component (A). In a case where the proportion thereof is 25% by mass or greater, the lithography characteristics are further improved.

In the present invention, the component (A) may be used alone or in combination of two or more kinds thereof.

In the present invention, the content of the component (A) may be adjusted according to the thickness of the resist film intended to be formed.

[Acid Generator Component: Component (B)]

The resist composition of the present invention may further contain, in addition to the component (A), an acid generator component (hereinafter, referred to as a "component (B)").

The component (B) is not particularly limited, and those which have been proposed as an acid generator for a chemically amplified resist in the related art can be used.

Examples of such an acid generator include various acid generators, for example, onium salt-based acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators, iminosulfonate-based acid generators, and disulfone-based acid generators. Among these, it is preferable to use an onium salt-based acid generator.

Examples of the onium salt-based acid generators include a compound represented by Formula (b-1) (hereinafter, also referred to as a "component (b-1)"), a compound represented by Formula (b-2) (hereinafter, also referred to as a "component (b-2)"), and a compound represented by Formula (b-3) (hereinafter, also referred to as a "component (b-3)").

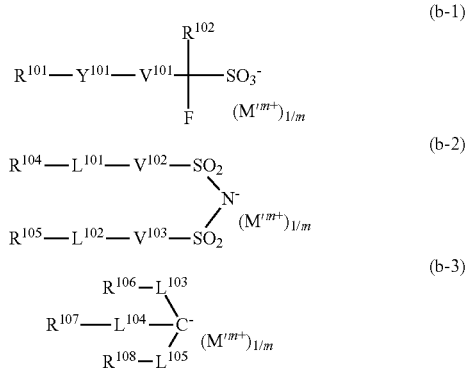

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent. $R^{104}$ and $R^{105}$ may be bonded to each other to form a ring. $R^{102}$ represents a fluorine atom or a fluorinated alkyl group having 1 to 5 carbon atoms. $Y^{101}$ represents a single bond or a divalent linking group having an oxygen atom. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO—, or —SO$_2$—. m represents an integer of 1 or greater, and $M^{m+}$ represents an m-valent onium cation.]

{Anion Moiety}

Anion Moiety of Component (b-1)

In Formula (b-1), $R^{101}$ represents a cyclic group which may have a substituent, a chain-like alkyl group which may have a substituent, or a chain-like alkenyl group which may have a substituent.

Cyclic Group which May have Substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. Further, the aliphatic hydrocarbon group may be saturated or unsaturated. In general, it is preferable that the aliphatic hydrocarbon group is saturated.

The aromatic hydrocarbon group as $R^{101}$ is a hydrocarbon group having an aromatic ring. The aromatic hydrocarbon group has preferably 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring contained in the aromatic hydrocarbon group as $R^{101}$ include benzene, fluorene, naphthalene, anthracene, phenanthrene, biphenyl, and an aromatic hetero ring in which some carbon atoms constituting these aromatic rings have been substituted with hetero atoms. Examples of the hetero atom in the aromatic hetero rings include an oxygen atom, a sulfur atom, and a nitrogen atom.

Specific examples of the aromatic hydrocarbon group as $R^{101}$ include a group in which one hydrogen atom has been removed from the aromatic ring (for example, an aryl group such as a phenyl group or a naphthyl group), and a group in which one hydrogen atom in the aromatic ring has been substituted with an alkylene group (for example, an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) has preferably 1 to 4 carbon atoms, more preferably 1 or 2 carbon atoms, and particularly preferably 1 carbon atom.

Examples of the cyclic aliphatic hydrocarbon group as $R^{101}$ include an aliphatic hydrocarbon group having a ring in the structure thereof.

Examples of the aliphatic hydrocarbon group having a ring in the structure thereof include an alicyclic hydrocarbon group (a group in which one hydrogen atom has been removed from an aliphatic hydrocarbon ring), a group in which an alicyclic hydrocarbon group is bonded to the terminal of a linear or branched aliphatic hydrocarbon group, and a group in which an alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The number of carbon atoms of the monocycloalkane is preferably in a range of 3 to 6, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among these, a polycycloalkane having a crosslinked ring polycyclic skeleton such as adamantane, norbornane, isobornane, tricyclodecane, or tetracyclododecane; and a polycycloalkane having a fused ring polycyclic skeleton such as a cyclic group having a steroid skeleton are more preferable as the polycycloalkane.

Among these examples, as the cyclic aliphatic hydrocarbon group as $R^{101}$, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The linear or branched aliphatic hydrocarbon group which may be bonded to the alicyclic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

As the branched aliphatic hydrocarbon group, a branched alkylene group is preferable, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Further, the cyclic hydrocarbon group as $R^{101}$ may have a hetero atom such as a hetero ring. Specific examples thereof include a lactone-containing cyclic group represented by any of Formulae (a2-r-1) to (a2-r-7), a —$SO_2$-containing polycyclic group represented by any of Formulae (a5-r-1) and (a5-r-2), and other heterocyclic groups represented by any of Formulae (r-hr-1) to (r-hr-16).

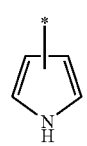

(r-hr-1)

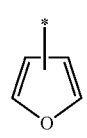

(r-hr-2)

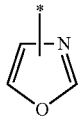

(r-hr-3)

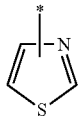

(r-hr-4)

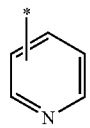

(r-hr-5)

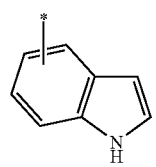

(r-hr-6)

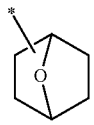

(r-hr-7)

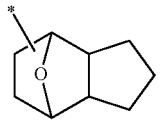

(r-hr-8)

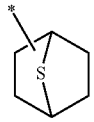

(r-hr-9)

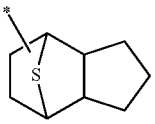

(r-hr-10)

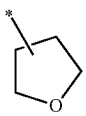

(r-hr-11)

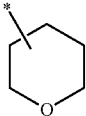

(r-hr-12)

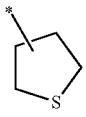

(r-hr-13)

(r-hr-14)

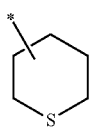

(r-hr-15)

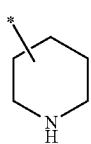

(r-hr-16)

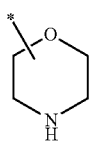

[In the formulae, "*" represents a bonding position.]

Examples of the substituent for the cyclic group as $R^{101}$ include an alkyl group, an alkoxy group, a halogen atom, a halogenated alkyl group, a hydroxyl group, a carbonyl group, and a nitro group.

As the alkyl group as the substituent, an alkyl group having 1 to 5 carbon atoms is preferable, and a methyl group, an ethyl group, a propyl group, an n-butyl group, or a tert-butyl group is most preferable.

As the alkoxy group as the substituent, an alkoxy group having 1 to 5 carbon atoms is preferable, a methoxy group, an ethoxy group, an n-propoxy group, an iso-propoxy group, an n-butoxy group, or a tert-butoxy group is more preferable, and a methoxy group or an ethoxy group is most preferable.

Examples of the halogen atom as the substituent include a fluorine atom, a chlorine atom, a bromine atom, and an iodine atom. Among these, a fluorine atom is preferable.

Example of the halogenated alkyl group as the substituent includes a group in which some or all hydrogen atoms in an alkyl group having 1 to 5 carbon atoms such as a methyl group, an ethyl group, a propyl group, an n-butyl group, or a tert-butyl group have been substituted with the halogen atoms.

The carbonyl group as the substituent is a group that substitutes a methylene group (—CH$_2$—) constituting the cyclic hydrocarbon group.

Chain-Like Alkyl Group which May have Substituent:

The chain-like alkyl group as $R^{101}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-Like Alkenyl Group which May have Substituent:

The chain-like alkenyl group as $R^{101}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

Examples of the substituent for the chain-like alkyl group or alkenyl group as $R^{101}$ include an alkoxy group, a halogen atom, a halogenated alkyl group, a hydroxy group, a carbonyl group, a nitro group, an amino group, and the cyclic group as $R^{101}$.

Among these, $R^{101}$ represents preferably a cyclic group which may have a substituent or a chain-like alkyl group which may have a substituent, more preferably a cyclic group which may have a substituent, and still more preferably a cyclic hydrocarbon group which may have a substituent.

Among these, a phenyl group, a naphthyl group, a group in which one or more hydrogen atoms have been removed from a polycycloalkane, a lactone-containing cyclic group represented by any of Formulas (a2-r-1) to (a2-r-7), or a —SO$_2$-containing polycyclic group represented by any of Formulae (a5-r-1) and (a5-r-2) is preferable. Among these, a group in which one or more hydrogen atoms have been removed from a polycycloalkane or a —SO$_2$-containing polycyclic group represented by any of Formulae (a5-r-1) and (a5-r-2-) is more preferable.

In Formula (b-1), $Y^{101}$ represents a single bond or a divalent linking group having an oxygen atom.

In a case where $Y^{101}$ represents a divalent linking group having an oxygen atom, $Y^{101}$ may have an atom other than the oxygen atom. Examples of the atom other than the oxygen atom include a carbon atom, a hydrogen atom, a sulfur atom, and a nitrogen atom.

Examples of the divalent linking group having an oxygen atom include a non-hydrocarbon oxygen atom-containing linking group such as an oxygen atom (an ether bond: —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon oxygen atom-containing linking groups with an alkylene group. Further, a sulfonyl group (—SO$_2$—) may be further linked to the combination. Examples of such a divalent linking group having an oxygen atom include linking groups respectively represented by Formulae (y-al-1) to (y-al-7).

(y-al-1)

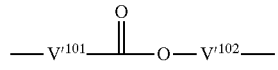

-continued

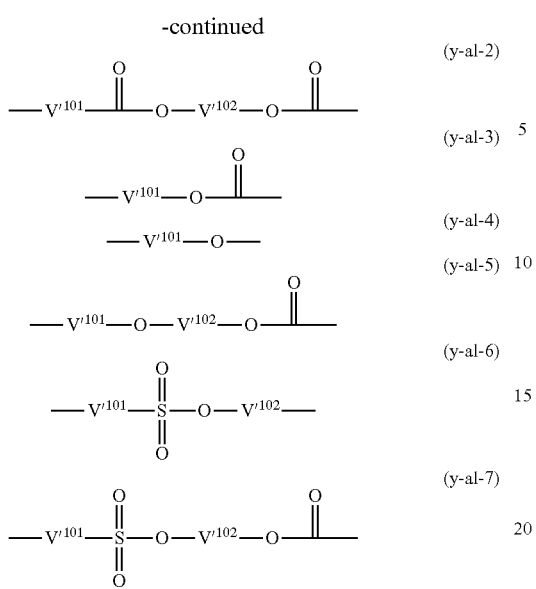

(y-al-2)
(y-al-3)
(y-al-4)
(y-al-5)
(y-al-6)
(y-al-7)

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $V'^{102}$ may be a linear alkylene group or a branched alkylene group, and a linear alkylene group is preferable.

Specific examples of the alkylene group as $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, or —$CH(CH_2CH_3)CH_2$—; a trimethylene group (n-propylene group) [—$CH_2CH_2CH_2$—]; an alkyltrimethylene group such as —$CH(CH_3)CH_2CH_2$— or —$CH_2CH(CH_3)CH_2$—; a tetramethylene group [—$CH_2CH_2CH_2CH_2$—]; an alkyltetramethylene group such as —$CH(CH_3)CH_2CH_2CH_2$— or —$CH_2CH(CH_3)CH_2CH_2$—; and a pentamethylene group [—$CH_2CH_2CH_2CH_2CH_2$—].

Further, a part of the methylene group in the alkylene group as $V'^{101}$ or $V'^{102}$ may be substituted with a divalent aliphatic cyclic group having 5 to 10 carbon atoms.

$Y^{101}$ represents preferably a divalent linking group having an ester bond or a divalent linking group having an ether bond, more preferably a linking group represented by any of Formulae (y-al-1) to (y-al-5), and still more preferably a linking group represented by any of Formulae (y-al-1) to (y-al-3).

In Formula (b-1), $V^{101}$ represents a single bond, an alkylene group, or a fluorinated alkylene group. It is preferable that the alkylene group and the fluorinated alkylene group as $V^{101}$ have 1 to 4 carbon atoms. Examples of the fluorinated alkylene group as $V^{101}$ include a group in which some or all hydrogen atoms in the alkylene group as $V^{101}$ have been substituted with fluorine atoms. Among these examples, it is preferable that $V^{101}$ represents a single bond or a fluorinated alkylene group having 1 to 4 carbon atoms.

In Formula (b-1), $R^{102}$ represents a fluorine atom or a fluorinated alkyl group having 1 to 5 carbon atoms. $R^{102}$ represents preferably a fluorine atom or a perfluoroalkyl group having 1 to 5 carbon atoms and more preferably a fluorine atom.

In a case where $Y^{101}$ represents a single bond, specific example of the anion moiety of the component (b-1) include a fluorinated alkylsulfonate anion such as a trifluoromethanesulfonate anion or a perfluorobutanesulfonate anion. Further, in a case where $Y^{101}$ represents a divalent linking group having an oxygen atom, specific examples thereof include an anion represented by any of Formulae (an-1) to (an-3).

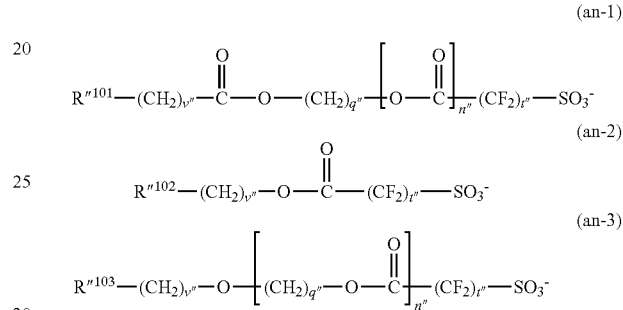

(an-1)
(an-2)
(an-3)

[In the formulae, $R'''^{101}$ represents an aliphatic cyclic group which may have a substituent, a group represented by any of Formulae (r-hr-1) to (r-hr-6), or a chain-like alkyl group which may have a substituent, $R'''^{102}$ represents an aliphatic cyclic group which may have a substituent, a lactone-containing cyclic group represented by any of Formulae (a2-r-1) to (a2-r-7), or a —$SO_2$-containing polycyclic group represented by any of Formulae (a5-r-1) and (a5-r-2), $R'''^{103}$ represents an aromatic cyclic group which may have a substituent, an aliphatic cyclic group which may have a substituent, or a chain-like alkenyl group which may have a substituent, each $v''$ independently represents an integer of 0 to 3, each $q''$ independently represents an integer of 1 to 20, $t''$ represents an integer of 1 to 3, and $n''$ represents 0 or 1.]

As the aliphatic cyclic group which may have a substituent as $R'''^{101}$, and $R'''^{103}$, the same groups as those for the cyclic aliphatic hydrocarbon group as $R^{101}$ are preferable. Examples of the substituent include the same groups as those for the substituent which may substitute the cyclic aliphatic hydrocarbon group as $R^{101}$.

As the aromatic cyclic group which may have a substituent as $R'''^{103}$, the same groups as those for the aromatic hydrocarbon group in the cyclic hydrocarbon group as $R^{101}$ are preferable. Examples of the substituent include the same groups as those for the substituent which may substitute the aromatic hydrocarbon group as $R^{101}$.

As the chain-like alkyl group which may have a substituent as $R'''^{101}$, the same groups as those for the chain-like alkyl group as $R^{101}$ are preferable. As the chain-like alkenyl group which may have a substituent as $R'''^{103}$, the same groups as those for the chain-like alkenyl group as $R^{101}$ are preferable.

Anion Moiety of Component (b-2)

In Formula (b-2), $R^{104}$ and $R^{105}$ each independently represent a cyclic group which may have a substituent, a chain-like alkyl group which may have a substituent, or a chain-like alkenyl group which may have a substituent, and examples thereof include the same groups as those for $R^{101}$ in Formula (b-1). Here, $R^{104}$ and $R^{105}$ may be bonded to each other to form a ring.

$R^{104}$ and $R^{105}$ represent preferably a chain-like alkyl group which may have a substituent and more preferably a linear or branched alkyl group or a linear or branched fluorinated alkyl group.

The chain-like alkyl group has preferably 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ decreases within the range of the number of carbon atoms from the viewpoint that the solubility in a solvent for a resist is also excellent. Further, in the chain-like alkyl group as $R^{104}$ and $R^{105}$, it is preferable that the number of hydrogen atoms substituted with fluorine atoms is as large as possible from the viewpoint that the acid strength increases and the transparency to high energy light or electron beams with a wavelength of 200 nm or less is improved.

The proportion of fluorine atoms in the chain-like alkyl group, that is, the fluorination ratio is preferably in a range of 70% to 100% and more preferably in a range of 90% to 100%, and it is most preferable that the chain-like alkyl group is a perfluoroalkyl group in which all hydrogen atoms are substituted with fluorine atoms.

In Formula (b-2), $V^{102}$ and $V^{103}$ each independently represent a single bond, an alkylene group, or a fluorinated alkylene group, and examples thereof include the same groups as those for $V^{101}$ in Formula (b-1).

In Formula (b-2), $L^{101}$ and $L^{102}$ each independently represent a single bond or an oxygen atom.

Anion Moiety of Component (b-3)

In Formula (b-3), $R^{106}$ to $R^{108}$ each independently represent a cyclic group which may have a substituent, a chain-like alkyl group which may have a substituent, or a chain-like alkenyl group which may have a substituent, and examples thereof include the same groups as those for $R^{101}$ in Formula (b-1).

$L^{103}$ to $L^{105}$ each independently represent a single bond, —CO—, or —SO$_2$—.

{Cation Moiety}

In Formulae (b-1), (b-2), and (b-3), m represents an integer of 1 or greater, $M^{m+}$ represents an m-valent onium cation, and suitable examples thereof include a sulfonium cation and an iodonium cation. Further, an organic cation represented by any of Formulae (ca-1) to (ca-4) is particularly preferable.

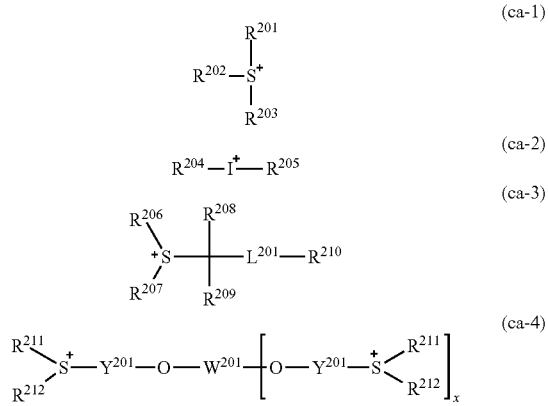

[In the formulae, $R^{201}$ to $R^{207}$ and $R^{211}$ and $R^{212}$ each independently represent an aryl group, an alkyl group, or an alkenyl group which may have a substituent, and $R^{201}$ to $R^{203}$, $R^{206}$ and $R^{207}$ and $R^{211}$ and $R^{212}$ may be bonded to each other to form a ring with the sulfur atom in the formulae. $R^{208}$ and $R^{209}$ each independently represent a hydrogen atom or an alkyl group having 1 to 5 carbon atoms, $R^{210}$ represents an aryl group which may have a substituent, an alkyl group which may have a substituent, an alkenyl group which may have a substituent, or a —SO$_2$-containing cyclic group which may have a substituent, $L^{201}$ represents —C(=O)— or —C(=O)—O—, $Y^{201}$'s each independently represent an arylene group, an alkylene group, or an alkenylene group, x represents 1 or 2, and $W^{201}$ represents an (x+1)-valent linking group.]

Examples of the aryl group as $R^{201}$ to $R^{207}$, $R^{211}$, and $R^{212}$ include an unsubstituted aryl group having 6 to 20 carbon atoms. Among the examples, a phenyl group or a naphthyl group is preferable.

As the alkyl group as $R^{201}$ to $R^{207}$, $R^{211}$, and $R^{212}$, a chain-like or cyclic alkyl group having 1 to 30 carbon atoms is preferable.

As the alkenyl group represented by $R^{201}$ to $R^{207}$, $R^{211}$, and $R^{212}$, an alkenyl group having 2 to 10 carbon atoms is preferable.

Examples of the substituent which may be included in $R^{201}$ to $R^{207}$ and $R^{210}$ to $R^{212}$ include an alkyl group, a halogen atom, a halogenated alkyl group, a carbonyl group, a cyano group, an amino group, an aryl group, and a group represented by any of Formulae (ca-r-1) to (ca-r-7).

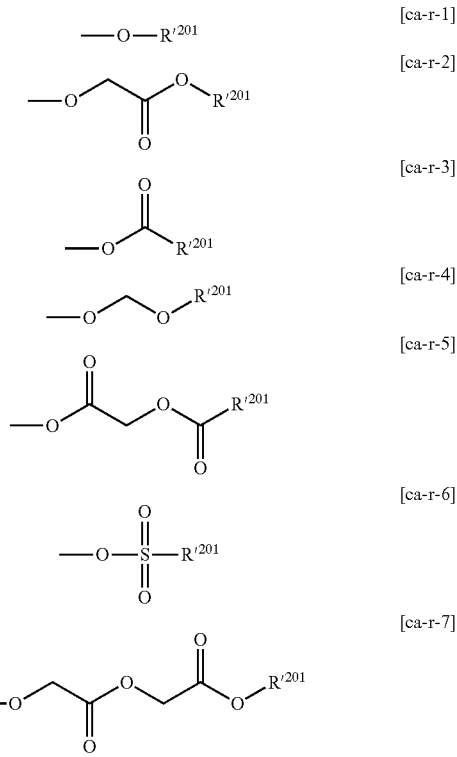

[In the formulae, each $R'^{201}$ independently represents a hydrogen atom, a cyclic group which may have a substituent, a chain-like alkyl group which may have a substituent, or a chain-like alkenyl group which may have a substituent.]

Examples of the cyclic group which may have a substituent, a chain-like alkyl group which may have a substituent, or a chain-like alkenyl group which may have a substituent as $R'^{201}$ include the same groups as those for $R^{101}$ in Formula (b-1). Further, examples of the cyclic group which may have a substituent or a chain-like alkyl group which may have a substituent as $R'^{201}$ include the same groups as those for the acid dissociable group in the above-described constitutional unit (a1).

In a case where $R^{201}$ to $R^{203}$, $R^{206}$ and $R^{207}$, and $R^{211}$ and $R^{212}$ are bonded to each other to form a ring with a sulfur atom in the formulae, these groups may be bonded to each other through a hetero atom such as a sulfur atom, an oxygen atom, or a nitrogen atom, or a functional group such as a carbonyl group, —SO—, —SO$_2$—, —SO$_3$—, —COO—, —CONH— or —N(RN)— (here, RN represents an alkyl group having 1 to 5 carbon atoms). As a ring to be formed, one ring having a sulfur atom in the formulae in the ring skeleton thereof is preferably a 3- to 10-membered ring and particularly preferably a 5- to 7-membered ring including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a thianthrene ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represent $R^{208}$ an alkyl group, and $R^{209}$ may be bonded to each other to form a ring.

$R^{210}$ represents an aryl group which may have a substituent, an alkyl group which may have a substituent, an alkenyl group which may have a substituent, or a —SO$_2$— containing cyclic group which may have a substituent.

Examples of the aryl group as $R^{210}$ include an unsubstituted aryl group having 6 to 20 carbon atoms. Among these, a phenyl group or a naphthyl group is preferable.

As the alkyl group as $R^{210}$, a chain-like or cyclic alkyl group having 1 to 30 carbon atoms is preferable.

It is preferable that the alkenyl group as $R^{210}$ has 2 to 10 carbon atoms.

As the —SO$_2$-containing cyclic group which may have a substituent as $R^{210}$, the above-described "—SO$_2$-containing polycyclic group" is preferable, and a group represented by Formula (a5-r-1) is more preferable.

$Y^{201}$'s each independently represent an arylene group, an alkylene group, or an alkenylene group.

Examples of the arylene group as $Y^{201}$ include a group in which one hydrogen atom has been removed from the aryl group exemplified as the aromatic hydrocarbon group represented by $R^{101}$ in Formula (b-1).

Examples of the alkylene group and alkenylene group as $Y^{201}$ include a group in which one hydrogen atom has been removed from the chain-like alkyl group or the chain-like alkenyl group as $R^{101}$ in Formula (b-1).

In Formula (ca-4), x represents 1 or 2.

$W^{201}$ represents an (x+1)-valent linking group, that is, a divalent or trivalent linking group.

As the divalent linking group represented by $W^{201}$, a divalent hydrocarbon group which may have a substituent is preferable, and examples thereof include the same divalent hydrocarbon groups which may have a substituent as those for $Va^{01}$ in $La^{011}$ of Formula (a01-1). The divalent linking group as $W^{201}$ may be linear, branched, or cyclic and cyclic is more preferable. Among these, a group in which two carbonyl groups are combined with both ends of the arylene group is preferable. Examples of the arylene group include a phenylene group and a naphthylene group. Among these, a phenylene group is particularly preferable.

Examples of the trivalent linking group as $W^{201}$ include a group in which one hydrogen atom has been removed from a divalent linking group as $W^{201}$ and a group in which the divalent linking group is further bonded to the divalent linking group. As the trivalent linking group as $W^{201}$, a group in which two carbonyl groups are bonded to an arylene group is preferable.

Specific examples of suitable cations represented by Formula (ca-1) include cations respectively represented by Formulae (ca-1-1) to (ca-1-67).

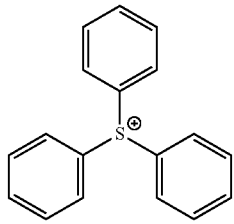

(ca-1-1)

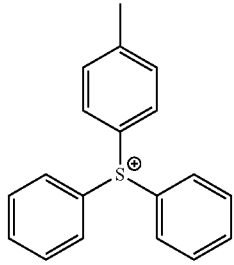

(ca-1-2)

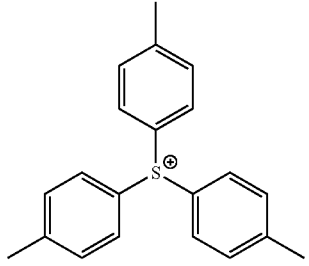

(ca-1-3)

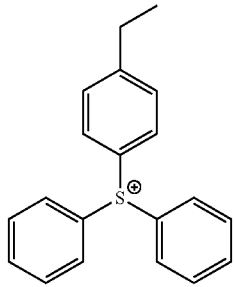

(ca-1-4)

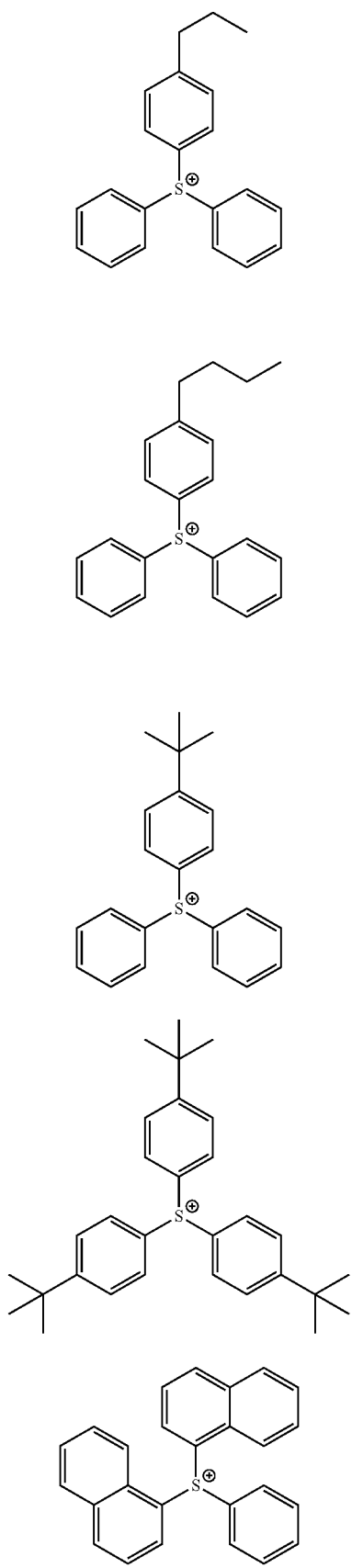
(ca-1-5)
(ca-1-6)
(ca-1-7)
(ca-1-8)
(ca-1-9)
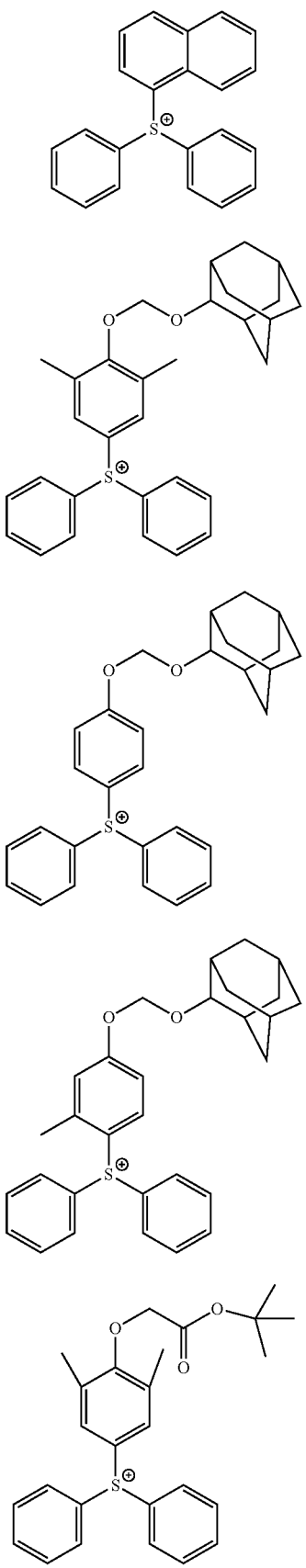
(ca-1-10)
(ca-1-11)
(ca-1-12)
(ca-1-13)
(ca-1-14)

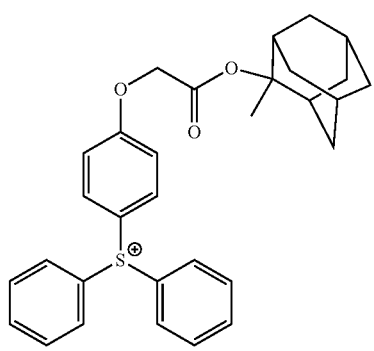
(ca-1-15)
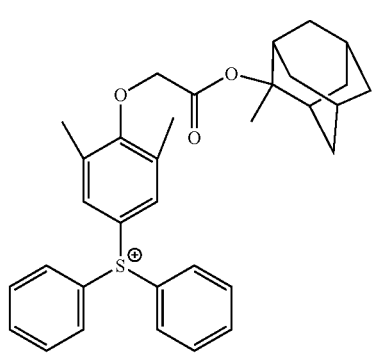
(ca-1-16)
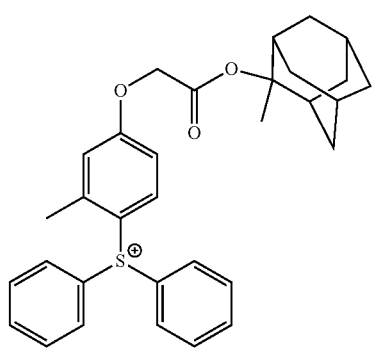
(ca-1-17)
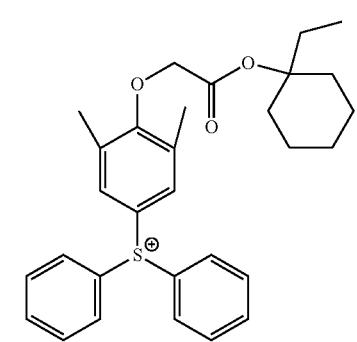
(ca-1-18)
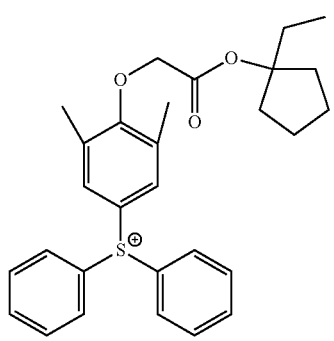
(ca-1-19)
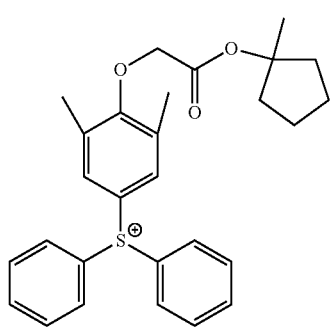
(ca-1-20)
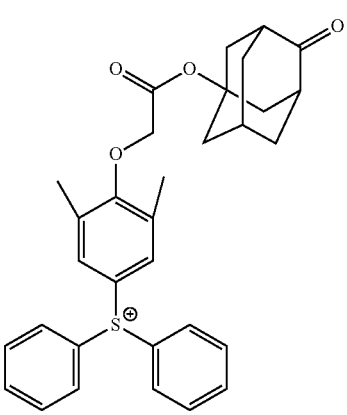
(ca-1-21)
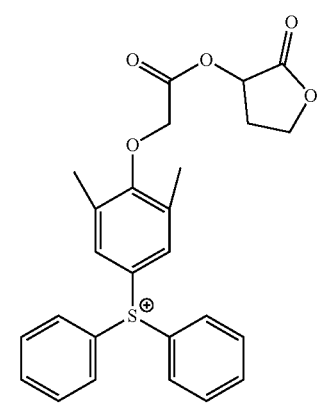
(ca-1-22)

(ca-1-23)
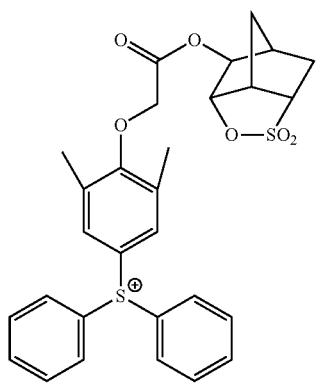
(ca-1-24)
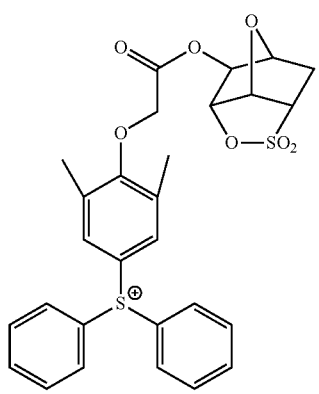
(ca-1-25)
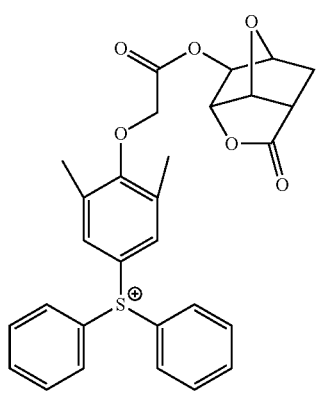
(ca-1-26)
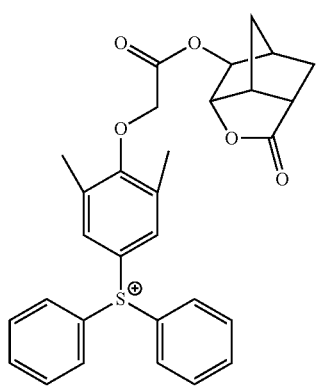
(ca-1-27)
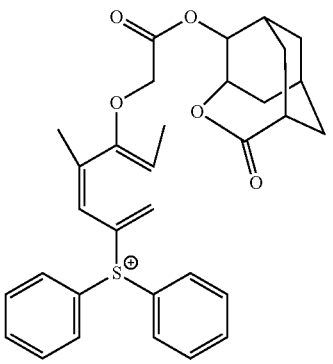
(ca-1-28)
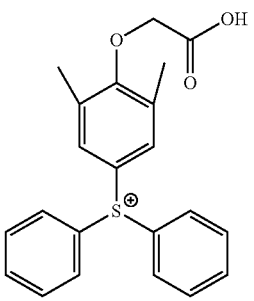
(ca-1-29)
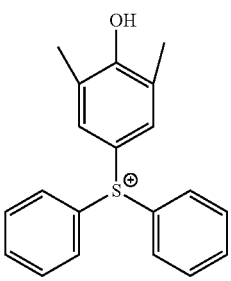
(ca-1-30)
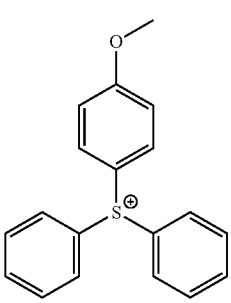
(ca-1-31)
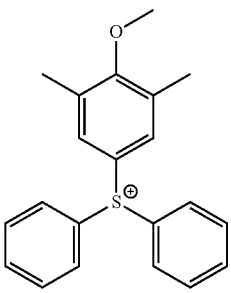

(ca-1-32)
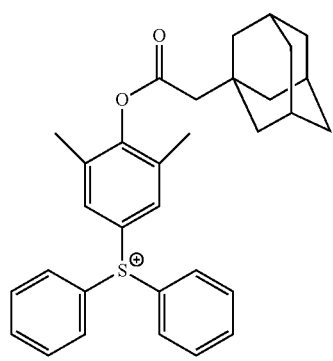
(ca-1-33)
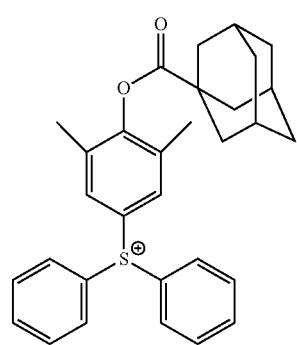
(ca-1-34)
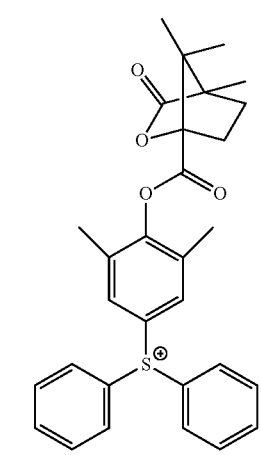
(ca-1-35)
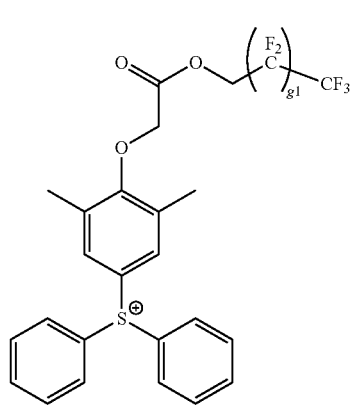
(ca-1-36)
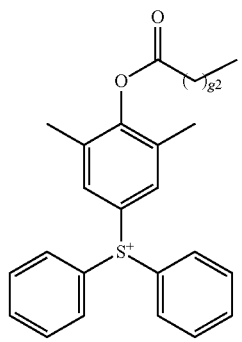
(ca-1-37)
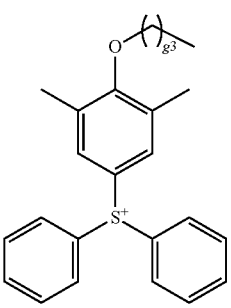
(ca-1-38)
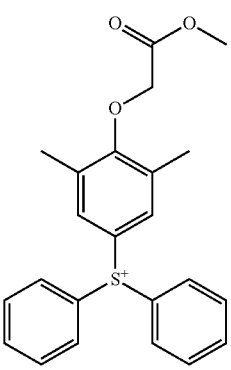
(ca-1-39)
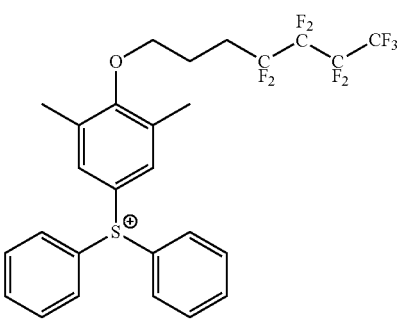

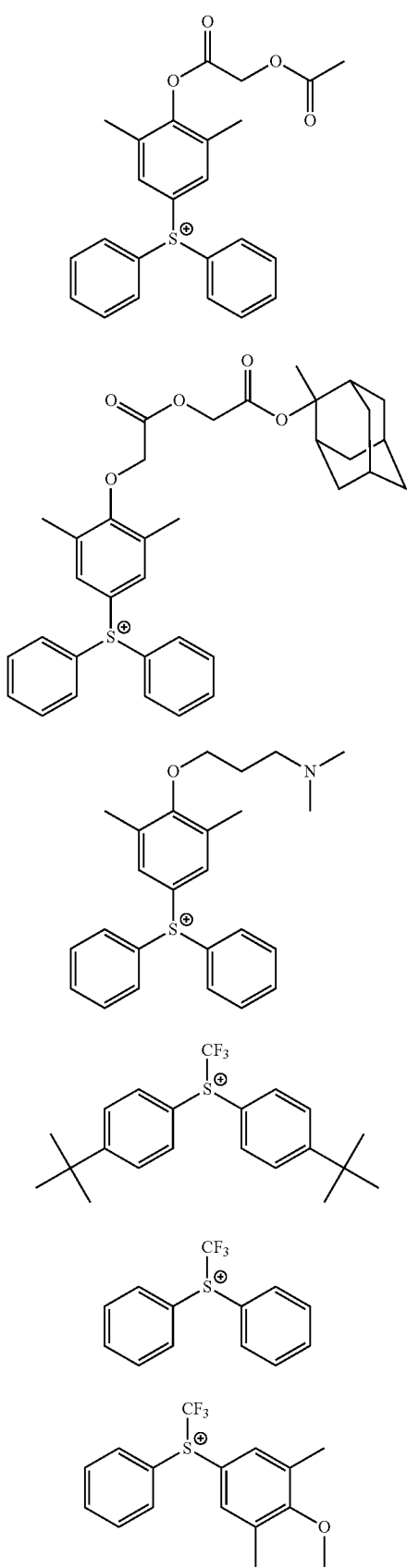
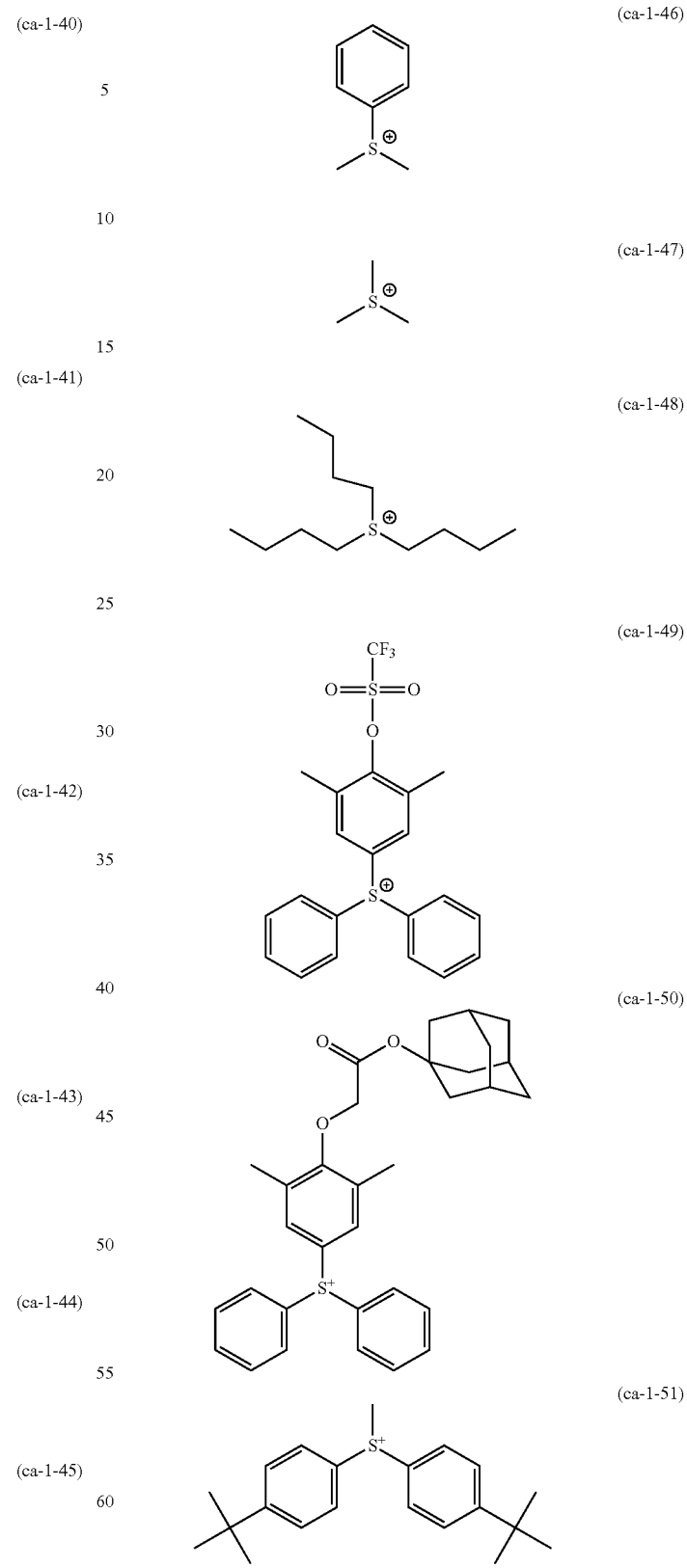
[In the formulae, g1, g2, and g3 represent a repeating number, g1 represents an integer of 1 to 5, g2 represents an integer of 0 to 20, and g3 represents an integer of 0 to 20.]

(ca-1-52) 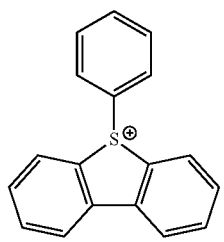
(ca-1-53)
(ca-1-54)
(ca-1-55)
(ca-1-56)
(ca-1-57) 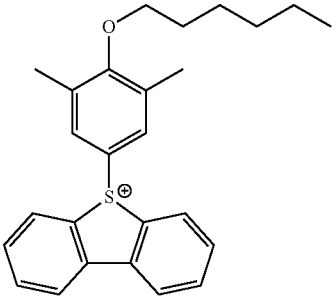
(ca-1-58) 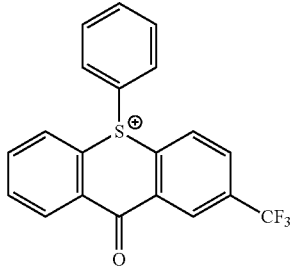
(ca-1-59) 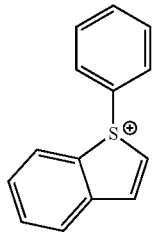
(ca-1-60) 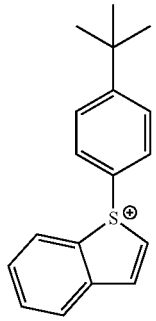
(ca-1-61) 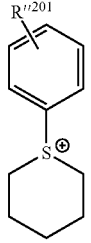

(ca-1-62) 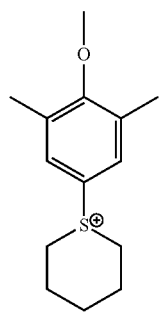

(ca-1-63) 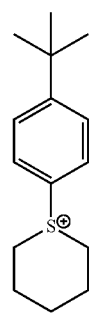

(ca-1-64) 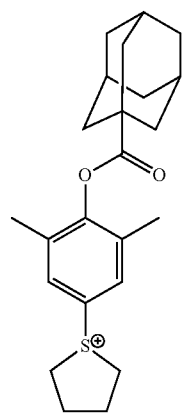

(ca-1-65) 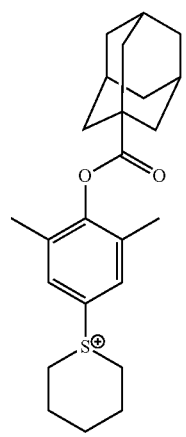

(ca-1-66) 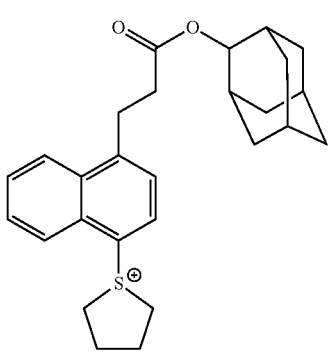

(ca-1-67) 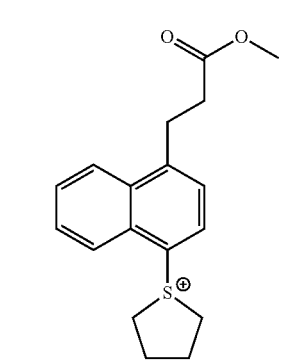

[In the formulae, $R''^{201}$ represents a hydrogen atom or a substituent, and examples of the substituent include the same groups as those for the substituents which may be included in $R^{201}$ to $R^{207}$ and $R^{210}$ to $R^{212}$.]

Specific examples of suitable cations represented by Formula (ca-2) include a diphenyliodonium cation and a bis(4-tert-butylphenyl)iodonium cation.

Specific examples of suitable cations represented by Formula (ca-3) include cations respectively represented by Formulae (ca-3-1) to (ca-3-6).

(ca-3-1) 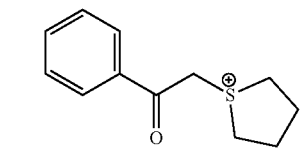

(ca-3-2) 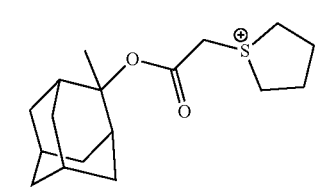

(ca-3-3) 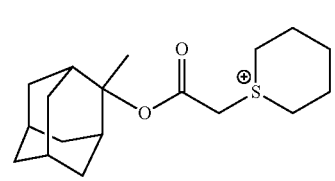

(ca-3-4)

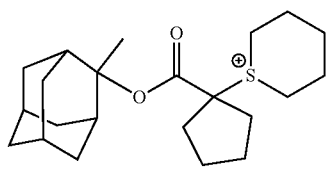

(ca-3-5)

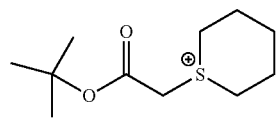

(ca-3-6)

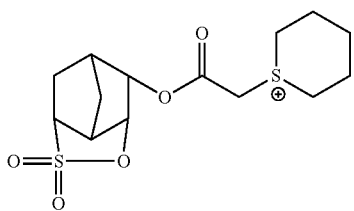

Specific examples of suitable cations represented by Formula (ca-4) include cations respectively represented by Formulae (ca-4-1) and (ca-4-2).

(ca-4-1)

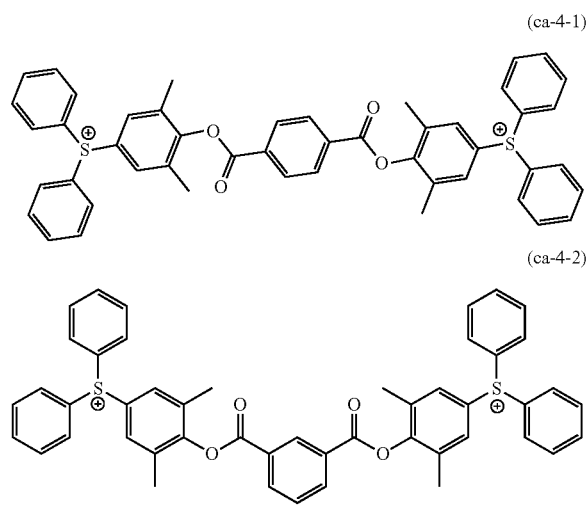

(ca-4-2)

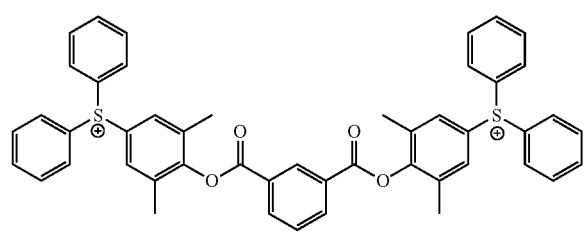

Among the examples above, as the cation moiety [$(M^{m+})_{1/m}$], a cation represented by Formula (ca-1) is preferable, and a cation represented by any of Formulae (ca-1-1) to (ca-1-67) is more preferable.

The acid generator component (B) may contain one or two or more acid generators other than the compound (B1) represented by Formula (b1).

In a case where the resist composition contains the component (B), the content of the component (B) is preferably in a range of 0.5 to 60 parts by mass, more preferably in a range of 1 to 50 parts by mass, and still more preferably in a range of 1 to 40 parts by mass with respect to 100 parts by mass of the component (A).

In a case where the content of the component (B) is set to be in the above-described range, pattern formation is satisfactorily performed. Further, it is preferable that each component of the resist composition is dissolved in an organic solvent from the viewpoint that a uniform solution is easily obtained and the storage stability of the resist composition is improved.

The resist composition of the present invention may further contain other components in addition to the component (A) or in addition to the components (A) and (B) described above. Examples of other components include a component (D), a component (E), a component (F), and a component (S) described below.

[Acid Diffusion Control Agent Component: Component (D)]

The resist composition of the present invention may further contain an acid diffusion control agent component (hereinafter, referred to as a "component (D)") in addition to the component (A) or in addition to the components (A) and (B). The component (D) functions as a quencher (an acid diffusion control agent) which traps an acid generated upon light exposure in the resist composition.

The component (D) may be a photodecomposable base (D1) (hereinafter, referred to as a "component (D1)") which is decomposed upon light exposure and loses an acid diffusion controllability or a nitrogen-containing organic compound (D2) (hereinafter, referred to as a component (D2)") that does not correspond to the component (D1).

In Regard to Component (D1)

In a case where a resist composition containing the component (D1) is employed, the contrast between an exposed portion and an unexposed portion can be further improved in a case of forming a resist pattern.

The component (D1) is not particularly limited as long as the component is decomposed upon light exposure and loses the acid diffusion controllability, and one or more compounds selected from the group consisting of a compound represented by Formula (d1-1) (hereinafter, referred to as a "component (d1-1)"), a compound represented by Formula (d1-2) (hereinafter, referred to as a "component (d1-2)"), and a compound represented by Formula (d1-3) (hereinafter, referred to as a "component (d1-3)") are preferable.

Since the components (d1-1) to (d1-3) are decomposed and lose the acid diffusion controllability (basicity), the components (d1-1) to (d1-3) do not function as a quencher at the exposed portion of the resist film, but function as a quencher at the unexposed portion of the resist film.

(d1-1)

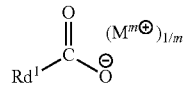

(d1-2)

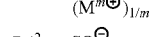

(d1-3)

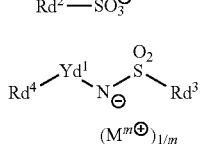

[In the formulae, $Rd^1$ to $Rd^4$ represent a cyclic group which may have a substituent, a chain-like alkyl group which may have a substituent, or a chain-like alkenyl group which may have a substituent. Here, the carbon atom adjacent to the S atom as $Rd^2$ in Formula (d1-2) has no fluorine atom bonded thereto. $Yd^1$ represents a single bond or a divalent linking group. m represents an integer of 1 or greater, and each $M^{m+}$ independently represents an m-valent organic cation.]

{Component (d1-1)}
Anion Moiety

In Formula (d1-1), $Rd^1$ represents a cyclic group which may have a substituent, a chain-like alkyl group which may have a substituent, or a chain-like alkenyl group which may have a substituent, and examples thereof include the same groups as those for $R^{101}$ in Formula (b-1).

Among these, it is preferable that the group as $Rd^1$ represents an aromatic hydrocarbon group which may have a substituent, an aliphatic cyclic group which may have a substituent, and a chain-like alkyl group which may have a substituent. Examples of the substituent that may be included in these groups include a hydroxyl group, an oxo group, an alkyl group, an aryl group, a fluorine atom, a fluorinated alkyl group, a lactone-containing cyclic group represented by any of Formulae (a2-r-1) to (a2-r-6), an ether bond, an ester bond, and a combination thereof. In a case where an ether bond or an ester bond is included as the substituent, an alkylene group may be interposed.

As the aromatic hydrocarbon group, a phenyl group or a naphthyl group is more preferable.

As the aliphatic cyclic group, a group in which one or more hydrogen atoms have been removed from a polycycloalkane such as adamantane, norbornane, isobornane, tricyclodecane or tetracyclododecane is more preferable.

It is preferable that the chain-like alkyl group has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group may have a fluorine atom or a fluorinated alkyl group as a substituent, the fluorinated alkyl group has preferably 1 to 11 carbon atoms, more preferably 1 to 8 carbon atoms, and still more preferably 1 to 4 carbon atoms. The fluorinated alkyl group may have an atom other than a fluorine atom. Examples of the atom other than the fluorine atom include an oxygen atom, a sulfur atom, and a nitrogen atom.

$Rd^1$ represents preferably a fluorinated alkyl group in which some or all hydrogen atoms constituting a linear alkyl group have been substituted with fluorine atoms and particularly preferably a fluorinated alkyl group in which all hydrogen atoms constituting a linear alkyl group have been substituted with fluorine atoms (a linear perfluoroalkyl group).

Specific preferred examples of the anion moiety in the component (d1-1) are described below.

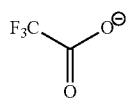
(d1-1-11)

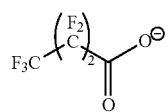
(d1-1-12)

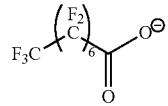
(d1-1-13)

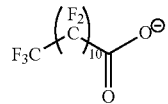
(d1-1-14)

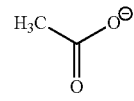
(d1-1-15)

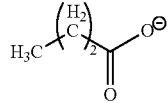
(d1-1-16)

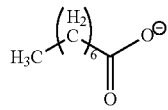
(d1-1-17)

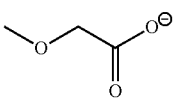
(d1-1-18)

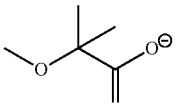
(d1-1-19)

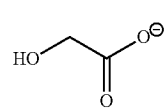
(d1-1-20)

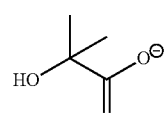
(d1-1-21)

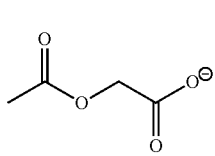
(d1-1-22)

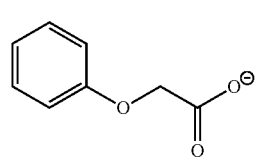
(d1-1-23)

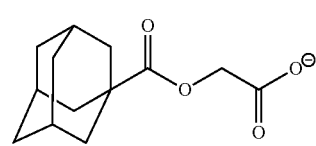
(d1-1-24)

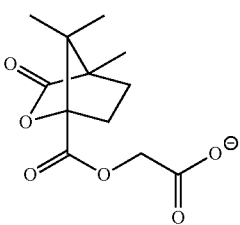
(d1-1-25)

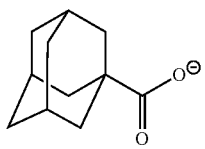
(d1-1-26)

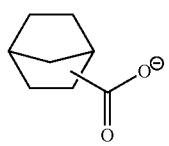
(d1-1-27)

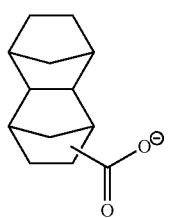
(d1-1-28)

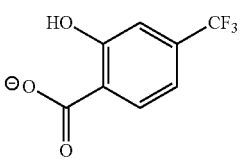
(d1-1-29)

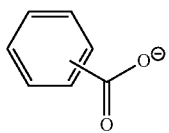
(d1-1-30)

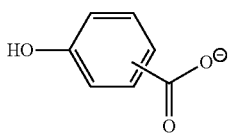
(d1-1-31)

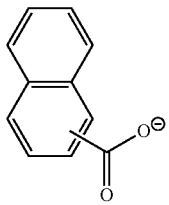
(d1-1-32)

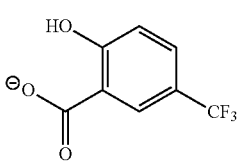
(d1-1-33)

Cation Moiety

In Formula (d1-1), $M^{m+}$ represents an m-valent organic cation.

Suitable examples of the organic cation as $M^{m+}$ include those for the cations respectively represented by Formulae (ca-1) to (ca-4). Among these, the cation represented by Formula (ca-1) is more preferable, and the cations respectively represented by Formulae (ca-1-1) to (ca-1-67) are still more preferable.

The component (d1-1) may be used alone or in combination of two or more kinds thereof.

{Component (d1-2)}

Anion Moiety

In Formula (d1-2), $Rd^2$ represents a cyclic group which may have a substituent, a chain-like alkyl group which may have a substituent, or a chain-like alkenyl group which may have a substituent, and examples thereof include the same groups as those for $R^{101}$ in Formula (b-1).

Here, the carbon atom adjacent to the S atom in $Rd^2$ has no fluorine atom bonded thereto (the carbon atom is not substituted with a fluorine atom). In this manner, the anion of the component (d1-2) becomes an appropriately weak acid anion, thereby improving the quenching ability of the component (D).

It is preferable that $Rd^2$ represents a chain-like alkyl group which may have a substituent or an aliphatic cyclic group which may have a substituent. The chain-like alkyl group has preferably 1 to 10 carbon atoms and more preferably 3 to 10 carbon atoms. As the aliphatic cyclic group, a group in which one or more hydrogen atoms have been removed from adamantane, norbornane, isobornane, tricyclodecane, or tetracyclododecane (a group which may have a substituent); and a group in which one or more hydrogen atoms have been removed from camphor are more preferable.

The hydrocarbon group as $Rd^2$ may have a substituent, and examples of the substituent include the same groups as those for the substituent which may be included in the hydrocarbon group (such as an aromatic hydrocarbon group, an aliphatic cyclic group, or a chain-like alkyl group) as $Rd^1$ in Formula (d1-1).

Specific preferred examples of the anion moiety in the component (d1-2) are described below.

(d1-2-11)

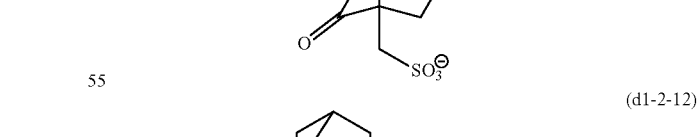
(d1-2-12)

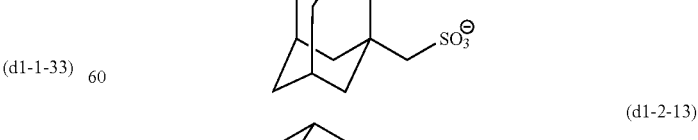
(d1-2-13)

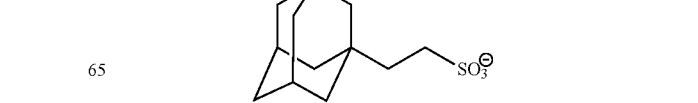

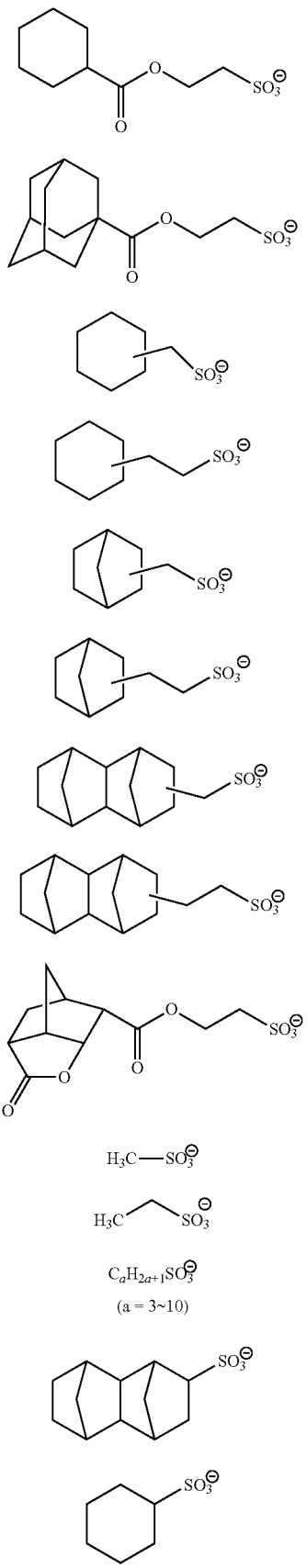

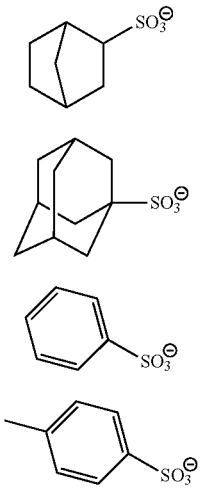

Cation Moiety

In Formula (d1-2), $M^{m+}$ represents an m-valent organic cation and has the same definition as that for $M^{m+}$ in Formula (d1-1).

The component (d1-2) may be used alone or in combination of two or more kinds thereof.

{Component (d1-3)}

Anion Moiety

In Formula (d1-3), $Rd^3$ represents a cyclic group which may have a substituent, a chain-like alkyl group which may have a substituent, or a chain-like alkenyl group which may have a substituent, and examples thereof include the same groups as those for $R^{101}$ in Formula (b-1). Among these, a cyclic group having a fluorine atom, a chain-like alkyl group, or a chain-like alkenyl group is preferable. Among these, a fluorinated alkyl group is preferable, and the same groups as those for the fluorinated alkyl group represented by Rd' are more preferable.

$Rd^4$ represents a cyclic group which may have a substituent, a chain-like alkyl group which may have a substituent, or a chain-like alkenyl group which may have a substituent, and examples thereof include the same groups as those for $R^{101}$ in Formula (b-1).

Among these, an alkyl group which may have a substituent, an alkoxy group which may have a substituent, an alkenyl group which may have a substituent, or a cyclic group which may have a substituent is preferable.

It is preferable that the alkyl group as $Rd^4$ is a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an isopentyl group, and a neopentyl group. Some hydrogen atoms in the alkyl group as $Rd^4$ may be substituted with a hydroxyl group, a cyano group, or the like.

It is preferable that the alkoxy group as $Rd^4$ is an alkoxy group having 1 to 5 carbon atoms, and specific examples of the alkoxy group having 1 to 5 carbon atoms include a methoxy group, an ethoxy group, an n-propoxy group, an iso-propoxy group, an n-butoxy group, and a tert-butoxy group. Among these, a methoxy group and an ethoxy group are preferable.

Examples of the alkenyl group as $Rd^4$ include the same groups as those for $R^{101}$ in Formula (b-1). Among these, a vinyl group, a propenyl group (an allyl group), a 1-methylpropenyl group, and a 2-methylpropenyl group are preferable. These groups may have an alkyl group having 1 to 5 carbon atoms or a halogenated alkyl group having 1 to 5 carbon atoms as a substituent.

Examples of the cyclic group as $Rd^4$ include the same groups as those for $R^{101}$ in Formula (b-1). Among these, an alicyclic group in which one or more hydrogen atoms have been removed from a cycloalkane such as cyclopentane, cyclohexane, adamantane, norbornane, isobornane, tricyclodecane, or tetracyclododecane or an aromatic group such as a phenyl group or a naphthyl group is preferable. In a case where $Rd^4$ represents an alicyclic group, the resist composition is satisfactorily dissolved in an organic solvent so that the lithography characteristics are improved. Further, in a case where $Rd^4$ represents an aromatic group, the resist composition has excellent light absorption efficiency in lithography using EUV or the like as an exposure light source, and thus the sensitivity and lithography characteristics are improved.

In Formula (d1-3), $Yd^1$ represents a single bond or a divalent linking group.

The divalent linking group as $Yd^1$ is not particularly limited, and examples thereof include a divalent hydrocarbon group (an aliphatic hydrocarbon group or an aromatic hydrocarbon group) which may have a substituent and a divalent linking group having a hetero atom.

It is preferable that $Yd^1$ represents a carbonyl group, an ester bond, an amide bond, an alkylene group, or a combination of these. As the alkylene group, a linear or branched alkylene group is more preferable, and a methylene group or an ethylene group is still more preferable.

Specific preferred examples of the anion moiety in the component (d1-3) are described below.

(d1-3-11)

(d1-3-12)

(d1-3-13)

(d1-3-14)

(d1-3-15)

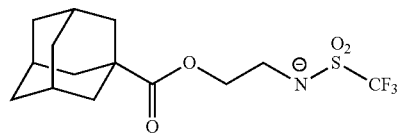

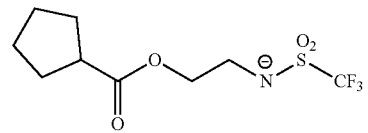

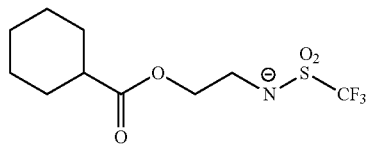

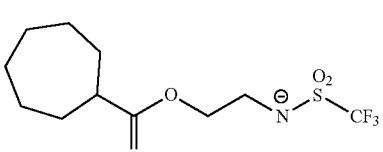

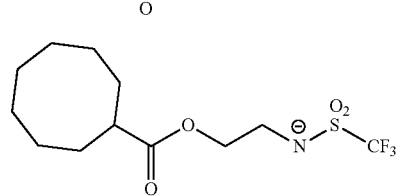

-continued (d1-3-16)

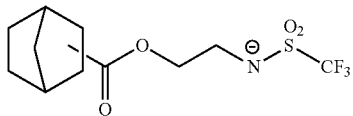

(d1-3-17)

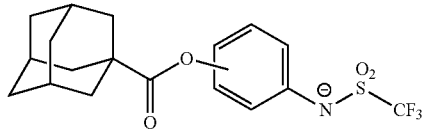

(d1-3-18)

(d1-3-19)

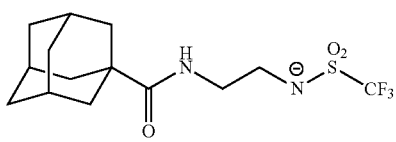

(d1-3-20)

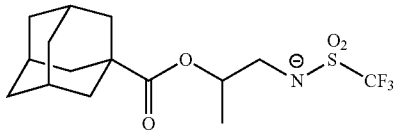

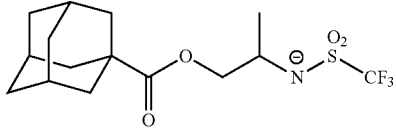

(d1-3-21)

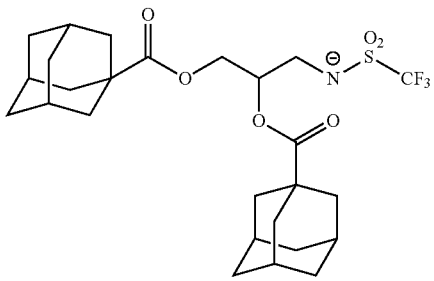

(d1-3-22)

(d1-3-23)

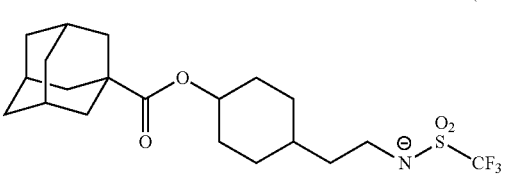

(d1-3-24)

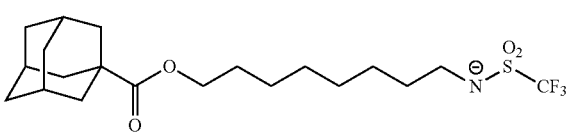

-continued (d1-3-25) 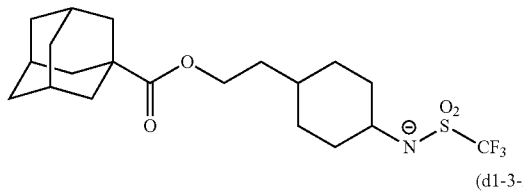

(d1-3-26) 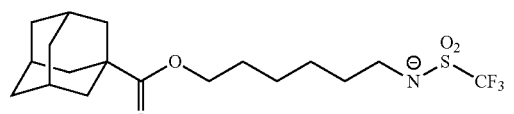

(d1-3-27) 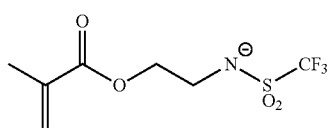

(d1-3-28) 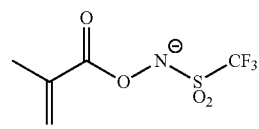

(d1-3-29) 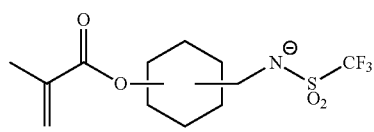

(d1-3-30) 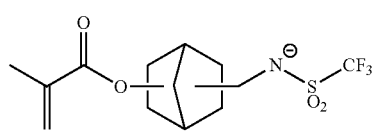

(d1-3-31) 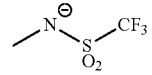

(d1-3-32) 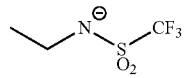

(d1-3-33) 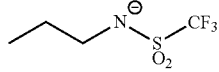

(d1-3-34) 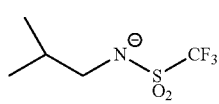

(d1-3-35) 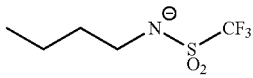

(d1-3-36) 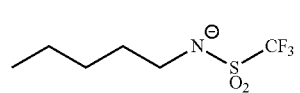

(d1-3-37) 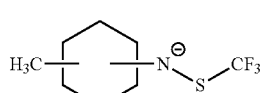

-continued (d1-3-38) 

(d1-3-39) 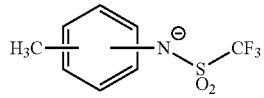

(d1-3-40) 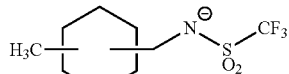

(d1-3-41) 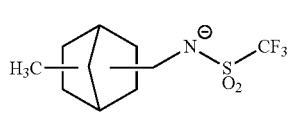

(d1-3-42) 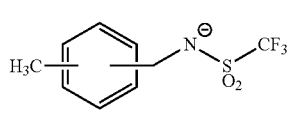

(d1-3-43) 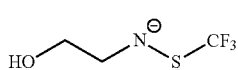

Cation Moiety

In Formula (d1-3), $M^{m+}$ represents an m-valent organic cation and has the same definition as that for $M^{m+}$ in Formula (d1-1).

The component (d1-3) may be used alone or in combination of two or more kinds thereof.

As the component (D1), only one of the above-described components (d1-1) to (d1-3) or a combination of two or more kinds thereof may be used.

Among the examples, it is preferable to use at least the component (d1-1) as the component (D1).

In a case where the resist composition contains the component (D1), the content of the component (D1) is preferably in a range of 0.5 to 10 parts by mass, more preferably in a range of 0.5 to 8 parts by mass, and still more preferably in a range of 1 to 8 parts by mass with respect to 100 parts by mass of the component (A).

In a case where the content of the component (D1) is greater than or equal to the above-described preferred lower limit, particularly excellent lithography characteristics and an excellent resist pattern shape are easily obtained. On the contrary, in a case where the content is less than or equal to the above-described upper limit, the sensitivity can be satisfactorily maintained and the throughput is also excellent.

Method of Producing Component (D1):

The methods of producing the component (d1-1) and the component (d1-2) are not particularly limited, and these components can be produced according to known methods.

Further, the method of producing the component (d1-3) is not particularly limited, and the component (d1-3) can be produced according to the same method as disclosed in United States Patent Application, Publication No. 2012-0149916.

In Regard to Component (D2)

The resist composition may contain, as the acid diffusion control agent component, a nitrogen-containing organic compound component (hereinafter, referred to as a "component (D2)") that does not correspond to the component (D1) described above.

The component (D2) is not particularly limited as long as the component functions as an acid diffusion control agent and does not correspond to the component (D1), and an optional component may be selected from known components and then used. Among the examples, an aliphatic amine is preferable, and particularly a secondary aliphatic amine and a tertiary aliphatic amine are more preferable.

The aliphatic amine is an amine containing one or more aliphatic groups, and the number of carbon atoms in the aliphatic group is preferably in a range of 1 to 12.

Examples of these aliphatic amine include amines in which at least one hydrogen atom of ammonia $NH_3$ has been substituted with an alkyl group or hydroxyalkyl group having 12 or less carbon atoms (alkyl amines or alkyl alcohol amines), and cyclic amines.

Specific examples of the alkyl amines and the alkyl alcohol amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, tri-isopropanolamine, di-n-octanolamine, and tri-n-octanolamine. Among these, a trialkylamine of 5 to 10 carbon atoms is preferable, and tri-n-pentylamine and tri-n-octylamine are particularly preferable.

Examples of the cyclic amine include a heterocyclic compound having a nitrogen atom as a hetero atom. The heterocyclic compound may be a monocyclic compound (aliphatic monocyclic amine) or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate. Among these, triethanolamine triacetate is preferable.

As the component (D2), an aromatic amine may be used.

Examples of the aromatic amine include 4-dimethylaminopyridine, pyrrole, indole, pyrazole, imidazole, and derivatives thereof, tribenzylamine, 2,6-diisopropylaniline, and N-tert-butoxycarbonylpyrrolidine.

The component (D2) may be used alone or in combination of two or more kinds thereof.

In a case where the resist composition contains the component (D2), the content of the component (D2) is typically in a range of 0.01 to 5 parts by mass with respect to 100 parts by mass of the component (A). In a case where the content thereof is set to be in the above-described range, the resist pattern shape, the post exposure temporal stability, and the like are improved.

[At Least One Compound Selected from the Group Consisting of Organic Carboxylic Acids, Phosphorus Oxo Acids, and Derivatives Thereof: Component (E)]

For the purpose of preventing deterioration in sensitivity and improving the resist pattern shape and the post exposure temporal stability, the resist composition of the present invention may contain, as optional components, at least one compound (E) (hereinafter, referred to as a "component (E)") selected from the group consisting of organic carboxylic acids, phosphorus oxo acids, and derivatives thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid, and phosphinic acid. Among these, phosphonic acid is particularly preferable.

Examples of the phosphorus oxo acid derivatives include esters in which a hydrogen atom in the above-described oxo acids is substituted with a hydrocarbon group. Examples of the hydrocarbon group include an alkyl group having 1 to 5 carbon atoms and an aryl group having 6 to 15 carbon atoms.

Examples of the phosphoric acid derivatives include phosphoric acid esters such as di-n-butyl phosphate and diphenyl phosphate.

Examples of the phosphonic acid derivatives include phosphonic acid esters such as dimethyl phosphonate, di-n-butyl phosphonate, phenylphosphonic acid, diphenyl phosphonate, and dibenzyl phosphonate.

Examples of the phosphinic acid derivatives include phosphinic acid ester and phenylphosphinic acid.

The component (E) may be used alone or in combination of two or more kinds thereof.

In a case where the resist composition contains the component (E), the content of the component (E) is typically in a range of 0.01 to 5 parts by mass with respect to 100 parts by mass of the component (A).

[Fluorine Additive Component: Component (F)]

The resist composition of the present invention may contain a fluorine additive component (hereinafter, referred to as a "component (F)") in order to impart water repellency to the resist film.

As the component (F), for example, the fluorine-containing polymer compounds described in Japanese Unexamined Patent Application, First Publication Nos. 2010-002870, 2010-032994, 2010-277043, 2011-13569, and 2011-128226 can be used. More specific examples of the component (F) include a polymer having a constitutional unit (f1) represented by Formula (f1-1). However, the polymer compound that corresponds to the above-described component (A) is excluded.

As the polymer having the constitutional unit (f1), a polymer (homopolymer) formed of only the constitutional unit (f1); a copolymer of the constitutional unit (f1) and a constitutional unit represented by Formula (m-1); or a copolymer of the constitutional unit (f1), a constitutional unit derived from acrylic acid or methacrylic acid, and a constitutional unit (m-1) represented by Formula (m-1) is preferable.

Here, as the constitutional unit represented by Formula (m-1), a constitutional unit derived from 1-ethyl-1-cyclooctyl (meth)acrylate or a constitutional unit derived from 1-methyl-1-adamantyl (meth)acrylate is preferable.

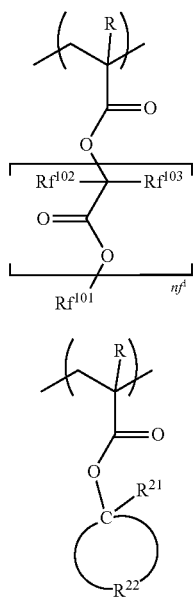

(f1-1)

(m-1)

[In the formulae, a plurality of R's each independently represent a hydrogen atom, an alkyl group having 1 to 5 carbon atoms, or a halogenated alkyl group having 1 to 5 carbon atoms. In Formula (f1-1), $Rf^{102}$ and $Rf^{103}$ each independently represent a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other. $nf^1$ represents an integer of 0 to 5, and $Rf^{101}$ represents an organic group having a fluorine atom. In Formula (m-1), $R^{21}$ represents an alkyl group, and $R^{22}$ represents a group that forms an aliphatic cyclic group with the carbon atom to which the $R^{22}$ is bonded.]

In Formula (f1-1), R's each independently represent a hydrogen atom, an alkyl group having 1 to 5 carbon atoms, or a halogenated alkyl group having 1 to 5 carbon atoms. R in Formula (f1-1) has the same definition as that for R in Formula (a1-1).

It is preferable that R represents a hydrogen atom, an alkyl group having 1 to 5 carbon atoms, or a fluorinated alkyl group having 1 to 5 carbon atoms. Further, from the viewpoint of the industrial availability, R represents more preferably a hydrogen atom or an alkyl group having 1 to 5 carbon atoms, still more preferably an alkyl group having 1 to 5 carbon atoms, and particularly preferably a methyl group.

In Formula (f1-1), examples of the halogen atom as $Rf^{102}$ and $Rf^{103}$ include a fluorine atom, a chlorine atom, a bromine atom, and an iodine atom. Among these, a fluorine atom is particularly preferable. Examples of the alkyl group having 1 to 5 carbon atoms as $Rf^{102}$ and $Rf^{103}$ include the same groups as those for the alkyl group having 1 to 5 carbon atoms as R. Among the examples, a methyl group or an ethyl group is preferable. Specific examples of the halogenated alkyl group having 1 to 5 carbon atoms for $Rf^{102}$ and $Rf^{103}$ include a group in which some or all hydrogen atoms of an alkyl group having 1 to 5 carbon atoms have been substituted with halogen atoms.

Examples of the halogen atom include a fluorine atom, a chlorine atom, a bromine atom, and an iodine atom. Among these, a fluorine atom is particularly preferable. Among these, $Rf^{102}$ and $Rf^{103}$ represent preferably a hydrogen atom, a fluorine atom, or an alkyl group having 1 to 5 carbon atoms and more preferably a hydrogen atom, a fluorine atom, a methyl group, or an ethyl group.

In Formula (f1-1), $nf^1$ represents an integer of 0 to 5, preferably an integer of 0 to 3, and more preferably 0 or 1.

In Formula (f1-1), $Rf^{101}$ represents an organic group having a fluorine atom and preferably a hydrocarbon group having a fluorine atom.

The hydrocarbon group having a fluorine atom may be linear, branched, or cyclic, and the number of carbon atoms thereof is preferably in a range of 1 to 20, more preferably in a range of 1 to 15, and particularly preferably in a range of 1 to 10.

In the hydrocarbon group having a fluorine atom, preferably 25% or more of the hydrogen atoms in the hydrocarbon group are fluorinated, more preferably 50% or more thereof are fluorinated, and particularly preferably 60% or more thereof are fluorinated from the viewpoint of increasing the hydrophobicity of the resist film in a case of liquid immersion exposure.

Among examples, $Rf^{101}$ represents more preferably a fluorinated hydrocarbon group having 1 to 5 carbon atoms and particularly preferably —$CF_3$, —$CH_2$—$CF_3$, —$CH_2$—$CF_2$—$CF_3$, —$CH(CF_3)_2$, —$CH_2$—$CH_2$—$CF_3$, or —$CH_2$—$CH_2$—$CF_2$—$CF_2$—$CF_3$.

In Formula (m-1), the alkyl group as $R^{21}$ may be linear, branched, or cyclic. Among these, it is preferable that the alkyl group is linear or branched. The linear alkyl group has preferably 1 to 5 carbon atoms, more preferably 1 to 4 carbon atoms, and still more preferably 1 or 2 carbon atoms. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable. The branched alkyl group has preferably 3 to 10 carbon atoms and more preferably 3 to 5 carbon atoms. Specific examples thereof include an isopropyl group, an isobutyl group, a tert-butyl group, an isopentyl group, and a neopentyl group. Among these, an isopropyl group is particularly preferable.

In Formula (m-1), $R^{22}$ represents a group that forms an aliphatic cyclic group with the carbon atom to which the $R^{22}$ is bonded. The aliphatic cyclic group formed by $R^{22}$ may be monocyclic or polycyclic. As the monocyclic aliphatic cyclic group, a group in which one or more hydrogen atoms have been removed from a monocycloalkane is preferable. The monocycloalkane preferably has 3 to 10 carbon atoms, and examples thereof include cyclopentane, cyclohexane, and cyclooctane. As the polycyclic aliphatic cyclic group, a group in which one or more hydrogen atoms have been removed from a polycycloalkane is preferable. As the polycycloalkane, a group having 7 to 12 carbon atoms is preferable, and examples thereof include adamantane, norbornane, isobornane, tricyclodecane, and tetracyclododecane.

The mass average molecular weight (Mw) (in terms of polystyrene according to gel permeation chromatography) of the component (F) is preferably in a range of 1000 to 50000, more preferably in a range of 5000 to 40000, and most preferably in a range of 10000 to 30000. In a case where the mass average molecular weight thereof is less than or equal to the upper limit of the above-described range, the resist composition exhibits a sufficient solubility in a solvent for a resist enough to be used as a resist. On the contrary, in a case where the mass average molecular weight thereof is greater than or equal to the lower limit of the above-described range, the dry etching resistance and the cross-sectional shape of the resist pattern are excellent.

Further, the dispersity (Mw/Mn) of the component (F) is preferably in a range of 1.0 to 5.0, more preferably in a range of 1.0 to 3.0, and most preferably in a range of 1.2 to 2.5.

The component (F) may be used alone or in combination of two or more kinds thereof.

In a case where the resist composition contains the component (F), the content of the component (F) is typically in a range of 0.5 to 10 parts by mass with respect to 100 parts by mass of the component (A).

As desired, miscible additives such as additive resins, dissolution inhibitors, plasticizers, stabilizers, colorants, halation prevention agents, and dyes for improving the performance of the resist film can be added to the resist composition of the present invention, as appropriate.

[Organic Solvent Component: Component (S)]

The resist composition of the present invention can be produced by dissolving the resist materials in an organic solvent component (hereinafter, referred to as a "component (S)").

The component (S) may be any organic solvent which can dissolve the respective components to be used to obtain a uniform solution, and an optional organic solvent can be appropriately selected from those which have been known in the related art as solvents of a chemically amplified resist composition and then used.

Examples of the component (S) include lactones such as γ-butyrolactone; ketones such as acetone, methyl ethyl ketone, cyclohexanone, methyl-n-pentyl ketone, methyl isopentyl ketone, and 2-heptanone; polyhydric alcohols such as ethylene glycol, diethylene glycol, propylene glycol, and dipropylene glycol; compounds having an ester bond, such as ethylene glycol monoacetate, diethylene glycol monoacetate, propylene glycol monoacetate, and dipropylene glycol monoacetate; polyhydric alcohol derivatives of compounds having an ether bond such as monoalkyl ether or monophenyl ether, such as monomethylether, monoethylether, monopropylether, or monobutylether of polyhydric alcohols or compounds having an ester bond [among these, propylene glycol monomethyl ether acetate (PGMEA) and propylene glycol monomethyl ether (PGME) are preferable]; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene; dimethylsulfoxide (DMSO); and propylene carbonate.

The component (S) may be used alone or in the form of a mixed solvent of two or more kinds thereof.

Among these, PGMEA, PGME, γ-butyrolactone, ethyl lactate (EL), cyclohexanone, and propylene carbonate are preferable.

Further, a mixed solvent obtained by mixing PGMEA with a polar solvent is also preferable as the component (S). The blending ratio (mass ratio) of the mixed solvent may be appropriately determined in consideration of the compatibility between PGMEA and the polar solvent, but is preferably in the range of 1:9 to 9:1 and more preferably in a range of 2:8 to 8:2.

More specifically, in a case where EL or cyclohexanone is blended as the polar solvent, the mass ratio of PGMEA to ethyl lactate (EL) or PGMEA to cyclohexanone is preferably in a range of 1:9 to 9:1 and more preferably in a range of 2:8 to 8:2. Further, in a case where PGME is blended as the polar solvent, the mass ratio of PGMEA to PGME is preferably in a range of 1:9 to 9:1, more preferably in a range of 2:8 to 8:2, and still more preferably in a range of 3:7 to 7:3. Further, a mixed solvent of PGMEA, PGME, and cyclohexanone is also preferable.

In addition to the solvent described above, a mixed solvent of γ-butyrolactone and at least one selected from PGMEA and ethyl lactate (EL) is also preferable as the component (S). In this case, as the mixing ratio, the mass ratio between the former and the latter is preferably in a range of 70:30 to 95:5.

The amount of the component (S) to be used is not particularly limited and is appropriately set to have a concentration which enables coating a substrate or the like depending on the thickness of the coated film. The component (S) is typically used in an amount such that the solid content concentration of the resist composition is set to be in a range of 1% to 20% by mass and preferably in a range of 2% to 15% by mass.

According to a resist pattern forming method performed using the resist composition according to the embodiment described above, the effect of forming a resist pattern having more satisfactory EOP and CDU can be obtained.

<Resist Pattern Forming Method>

A resist pattern forming method according to a second embodiment of the present invention includes a step of forming a resist film using the resist composition according to the first embodiment, a step of exposing the resist film to light, and a step of developing the resist film to form a resist pattern.

More specifically, the resist pattern forming method includes a step of forming a resist film on a support using a resist composition which generates an acid upon light exposure and whose solubility in a developing solution is changed due to the action of the acid, a step of exposing the resist film, and a step of patterning the exposed resist film by performing development using a developing solution to form a resist pattern.

Such a resist pattern forming method can be performed, for example, in the following manner.

First, a resist film is formed by coating a support with a resist composition which generates an acid upon light exposure and whose solubility in a developing solution is changed due to the action of the acid using a spinner or the like and performing a bake (post applied bake (PAB)) treatment under a temperature condition of 80° C. to 150° C. for 20 to 120 seconds and preferably 40 to 90 seconds.

Here, the above-described resist composition is used as the resist composition.

Next, the resist film is exposed to light through a photomask (mask pattern) on which a predetermined pattern is formed or selectively exposed by direct irradiation with electron beams for drawing without a photomask, using an exposure device such as an ArF exposure device, an electron beam drawing device, or an EUV exposure device.

Thereafter, a bake (post exposure bake (PEB)) treatment is performed, for example, under a temperature condition of 80° C. to 150° C. for 20 to 120 seconds and preferably 40 to 90 seconds.

Next, the resist film after the exposure and the bake (PEB) treatment is developed. The development is carried out using an alkali developing solution in a case of an alkali developing process and using a developing solution containing an organic solvent (organic developing solution) in a case of a solvent developing process.

After the development, it is preferable to perform a rinse treatment. As the rinse treatment, water rinsing using pure water is preferable in a case of the alkali developing process, and rinsing using a rinse solution containing an organic solvent is preferable in a case of the solvent developing process.

In a case of the solvent developing process, after the developing treatment or the rinse treatment, a treatment of removing the developing solution or the rinse solution attached onto the pattern using a supercritical fluid may be performed.

After the developing treatment or the rinse treatment, drying is performed. Further, a bake treatment (post bake) may be performed after the developing treatment depending on the circumstances. In this manner, a resist pattern can be obtained.

By performing the above-described operation, a fine resist pattern can be formed.

The support is not particularly limited and a known support of the related art can be used, and examples thereof include a substrate for an electronic component and a substrate on which a predetermined wiring pattern has been formed. Specific examples thereof include a metal substrate such as a silicon wafer, copper, chromium, iron, or aluminum; and a glass substrate. As the materials of the wiring pattern, copper, aluminum, nickel, or gold can be used.

Further, as the support, a support obtained by providing an inorganic and/or organic film on the above-described substrate may be employed. As the inorganic film, an inorganic antireflection film (inorganic BARC) can be used. Examples of the organic film include an organic film such as an organic antireflection film (organic BARC) or a lower-layer organic film used for a multilayer resist method.

Here, the multilayer resist method is a method of providing at least one layer of an organic film (lower-layer organic film) and at least one layer of a resist film (upper-layer resist film) on a substrate and performing patterning of the lower-layer organic film using a resist pattern formed on the upper-layer resist film as a mask, and this method is considered to enable formation of a pattern with a high aspect ratio. That is, according to the multilayer resist method, since a desired thickness can be ensured by the lower-layer organic film, the thickness of the resist film can be reduced, and a fine pattern with a high aspect ratio can be formed.

The multilayer resist method is classified into a method (two-layer resist method) in which a double-layer structure consisting of an upper-layer resist film and a lower-layer organic film is formed and a method (three-layer resist method) in which a multilayer structure having three or more layers with one or more intermediate layers (thin metal film and the like) between an upper-layer resist film and a lower-layer organic film is formed.

The wavelength to be used for exposure is not particularly limited and the exposure can be conducted using radiation such as an ArF excimer laser, a KrF excimer laser, an $F_2$ excimer laser, extreme ultraviolet rays (EUV), vacuum ultraviolet rays (VUV), electron beams (EB), X-rays, and soft X-rays. The resist pattern forming method of the present invention is highly useful for a KrF excimer laser, an ArF excimer laser, EB, and EUV and particularly useful for an ArF excimer laser, EB, and EUV.

The exposure of the resist film to light may be typical exposure (dry exposure) conducted in air or an inert gas such as nitrogen, or liquid immersion exposure (liquid immersion lithography).

The liquid immersion exposure is an exposure method in which the region between the resist film and the lens at the lowermost position of the exposure device is filled with a solvent (liquid immersion medium) in advance that has a larger refractive index than the refractive index of air, and the exposure (immersion exposure) is performed in this state.

As the liquid immersion medium, a solvent which has a refractive index larger than the refractive index of air but smaller than the refractive index of the resist film to be exposed to light is preferable. The refractive index of such a solvent is not particularly limited as long as the refractive index is in the above-described range.

Examples of the solvent which has a refractive index larger than the refractive index of air but smaller than the refractive index of the resist film include water, a fluorine-based inert liquid, a silicon-based organic solvent, and a hydrocarbon-based organic solvent.

Specific examples of the fluorine-based inert liquid include a liquid containing a fluorine-based compound such as $C_3HCl_2F_5$, $C_4F_9OCH_3$, $C_4F_9OC_2H_5$, or $C_5H_3F_7$ as a main component, and a liquid with a boiling point of 70° C. to 180° C. is preferable and a liquid with a boiling point of 80° C. to 160° C. is more preferable. A fluorine-based inert liquid having a boiling point in the above-described range is preferable from the viewpoint that a medium used for liquid immersion can be removed using a simple method after completion of light exposure.

As the fluorine-based inert liquid, a perfluoroalkyl compound in which all hydrogen atoms in the alkyl group have been substituted with fluorine atoms is particularly preferable. Specific examples of the perfluoroalkyl compound include a perfluoroalkylether compound and a perfluoroalkylamine compound.

Further, specific examples of the perfluoroalkylether compound include perfluoro(2-butyl-tetrahydrofuran) (boiling point of 102° C.), and specific examples of the perfluoroalkylamine compound include perfluorotributylamine (boiling point of 174° C.).

As the liquid immersion medium, water is preferable from the viewpoints of the cost, the safety, the environmental issues, and the versatility.

In the alkali developing process, the alkali developing solution used for the developing treatment may be any developing solution that is capable of dissolving the above-described component (A) (the component (A) before light exposure) and can be appropriately selected from known alkali developing solutions. Examples thereof include a 0.1 to 10 mass % tetramethylammonium hydroxide (TMAH) aqueous solution.

In the solvent developing process, the organic solvent contained in the organic developing solution used for the developing treatment may be any solvent that is capable of dissolving the above-described component (A) (the component (A) before light exposure) and can be appropriately selected from known organic solvents. Specific examples thereof include a polar solvent such as a ketone-based organic solvent, an ester-based organic solvent, an alcohol-based organic solvent, a nitrile-based organic solvent, an amide-based organic solvent, or an ether-based organic solvent, and a hydrocarbon-based organic solvent. Further, the developing solution may contain 80% by mass or greater of the organic solvent.

The ketone-based organic solvent is an organic solvent containing C—C(=O)—C in the structure thereof. The ester-based organic solvent is an organic solvent containing C—C(=O)—O—C in the structure thereof. The alcohol-based organic solvent is an organic solvent containing an alcoholic hydroxyl group in the structure thereof, and the "alcoholic hydroxyl group" indicates a hydroxyl group bonded to a carbon atom of an aliphatic hydrocarbon group. The nitrile-based organic solvent is an organic solvent containing a nitrile group in the structure thereof. The amide-based organic solvent is an organic solvent containing an amide group in the structure thereof. The ether-based organic solvent is an organic solvent containing C—O—C in the structure thereof.

Some organic solvents have a plurality of the functional groups which characterize each of the solvents in the structure thereof. In such a case, the organic solvents are considered to correspond to all the solvents containing the functional groups. For example, diethylene glycol monomethyl ether corresponds to both the alcohol-based organic solvent and the ether-based organic solvent which have been classified above.

The hydrocarbon-based organic solvent is a hydrocarbon solvent which is formed of a hydrocarbon that may be halogenated and does not have a substituent other than halogen atoms. Examples of the halogen atom include a fluorine atom, a chlorine atom, a bromine atom, and an iodine atom. Among these, a fluorine atom is preferable.

Among the examples, the developing solution used for the development of the solvent developing process contains preferably one or more selected from the group consisting of an ester-based organic solvent and a ketone-based organic solvent and more preferably an ester-based organic solvent, from the viewpoint of easily obtaining a high-resolution resist pattern.

Examples of the ester-based organic solvent include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate.

Among these, butyl acetate is preferable as the ester-based organic solvent.

Examples of the ketone-based organic solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, γ-butyrolactone, and methyl amyl ketone (2-heptanone).

Among these, methyl amyl ketone (2-heptanone) is preferable as the ketone-based organic solvent.

Known additives can be blended into the organic developing solution as desired. Examples of the additive include a surfactant. The surfactant is not particularly limited, and for example, an ionic or non-ionic fluorine-based and/or silicon-based surfactant can be used.

As the surfactant, a non-ionic surfactant is preferable, and a fluorine-based surfactant or a silicon-based surfactant is more preferable.

In a case where a surfactant is blended into the organic developing solution, the amount of the surfactant to be blended is typically in a range of 0.001% to 5% by mass, preferably in a range of 0.005% to 2% by mass, and more preferably in a range of 0.01% to 0.5% by mass with respect to the total amount of the organic developing solution.

The developing treatment can be performed according to a known developing method, and examples thereof include a method of immersing a support in a developing solution for a certain time (a dip method), a method of raising a developing solution on the surface of a support using the surface tension and maintaining the state for a certain time (a puddle method), a method of spraying a developing solution to the surface of a support (spray method), and a method of continuously ejecting a developing solution onto a support rotating at a certain rate while scanning a developing solution ejection nozzle at a certain rate (dynamic dispense method).

As the organic solvent contained in the rinse solution used for the rinse treatment after the development of the solvent developing process, a solvent that is unlikely to dissolve a resist pattern can be appropriately selected from the organic solvents exemplified as the organic solvent used in the organic developing solution and then used. Typically, at least one solvent selected from a hydrocarbon-based organic solvent, a ketone-based organic solvent, an ester-based organic solvent, an alcohol-based organic solvent, an amide-based organic solvent, and an ether-based organic solvent is used. Among these, at least one selected from a hydrocarbon-based organic solvent, a ketone-based organic solvent, an ester-based organic solvent, an alcohol-based organic solvent, and an amide-based organic solvent is preferable, at least one selected from an ester-based organic solvent and a ketone-based organic solvent is more preferable, and an ester-based organic solvent is particularly preferable.

These organic solvents may be used alone or in combination of two or more kinds thereof. Further, an organic solvent other than the above-described solvents and water may be mixed and used. However, in consideration of the development characteristics, the content of water in the rinse solution is preferably 30% by mass or less, more preferably 10% by mass or less, still more preferably 5% by mass or less, and particularly preferably 3% by mass or less with respect to the total amount of the rinse solution.

Known additives can be added to the rinse solution as necessary. Examples of the additive include a surfactant. As the surfactant, the same surfactants as those described above can be exemplified. Among these, a non-ionic surfactant is preferable, and a fluorine-based surfactant or a silicon-based surfactant is more preferable.

In a case where a surfactant is added to the solution, the amount of the surfactant to be added is typically in a range of 0.001% to 5% by mass, preferably in a range of 0.005% to 2% by mass, and more preferably in a range of 0.01% to 0.5% by mass with respect to the total amount of the rinse solution.

The rinse treatment carried out using a rinse solution (washing treatment) can be performed according to a known rinse method. Examples of the method of performing the rinse treatment include a method of continuously ejecting a rinse solution onto a support rotating at a certain rate (rotary coating method), a method of immersing a support in a rinse solution for a certain time (dip method), and a method of spraying a rinse solution to the surface of a support (spray method).

EXAMPLES

Hereinafter, the present invention will be described in more detail with reference to examples, but the present invention is not limited to these examples.

<Preparation of Resist Composition>

Respective components as listed in Table 1 were mixed and dissolved to prepare a resist composition of each example.

TABLE 1

|  | Component (A) | Component (B) | Component (D) | Component (F) | Component (S) |
|---|---|---|---|---|---|
| Example 1 | R-(1) [100] | P-(1)/P-(2) [11/6.0] | Q-(1) [6.0] | F-(1) [2.0] | PGMEA/PGME [2200/900] |
| Comparative Example 1 | R-(2) [100] | P-(1)/P-(2) [11/6.0] | Q-(1) [6.0] | F-(1) [2.0] | PGMEA/PGME [2200/900] |
| Comparative Example 2 | R-(3) [100] | P-(1)/P-(2) [11/6.0] | Q-(1) [6.0] | F-(1) [2.0] | PGMEA/PGME [2200/900] |
| Comparative Example 3 | R-(4) [100] | P-(1)/P-(2) [11/6.0] | Q-(1) [6.0] | F-(1) [2.0] | PGMEA/PGME [2200/900] |
| Example 2 | R-(5) [100] | P-(1)/P-(2) [11/6.0] | Q-(1) [6.0] | F-(1) [2.0] | PGMEA/PGME [2200/900] |
| Example 3 | R-(6) [100] | P-(1)/P-(2) [11/6.0] | Q-(1) [6.0] | F-(1) [2.0] | PGMEA/PGME [2200/900] |
| Example 4 | R-(7) [100] | P-(1)/P-(2) [11/6.0] | Q-(1) [6.0] | F-(1) [2.0] | PGMEA/PGME [2200/900] |

In Table 1, each abbreviation has the following meaning, and each numerical value in the parentheses indicates the blending amount (parts by mass).

Component (A)

Polymer Compound in Table 2

TABLE 2

| Polymer compound | (a1) | (a2) | PDI | Molar ratio | Mw |
|---|---|---|---|---|---|
| R-(1) | M1-(1) | M2 | 1.6 | 50:50 | 10000 |
| R-(2) | M1-(2) | M2 | 1.5 | 50:50 | 10000 |
| R-(3) | M1-(3) | M2 | 1.7 | 50:50 | 9000 |
| R-(4) | M1-(4) | M2 | 1.7 | 50:50 | 10000 |
| R-(5) | M1-(5) | M2 | 1.6 | 50:50 | 10000 |
| R-(6) | M1-(1) | M2-(2) | 1.7 | 50:50 | 10000 |
| R-(7) | M1-(5) | M2-(2) | 1.7 | 50:50 | 10000 |

Polymer compounds R-(1) to R-(4) were respectively obtained by radically polymerizing the following monomers M1-(1) to M1-(4) and M2, which provide the constitutional units constituting the respectively polymer compounds, using predetermined molar ratios listed in Table 2.

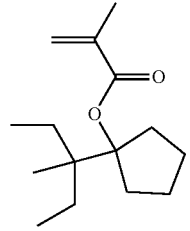

M1-(1)

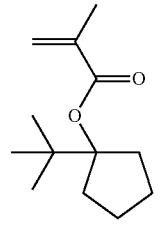

M1-(2)

-continued

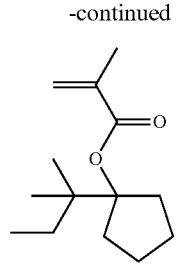

M1-(3)

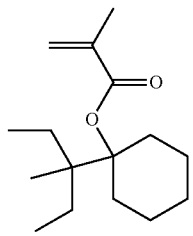

M1-(4)

-continued

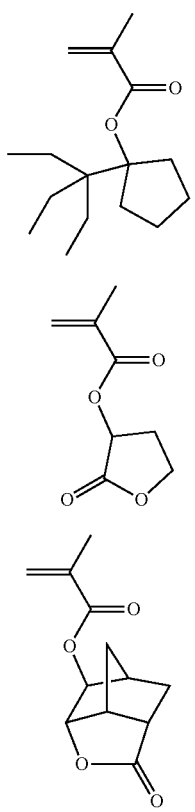

M1-(5)

M2

M2-(2)

In Table 2, the copolymer compositional ratio (molar ratio of each constitutional unit in the polymer compound) of each polymer compound was acquired by $^{13}$C-NMR, and the molecular weight (Mw) was described using the mass average molecular weight in terms of polystyrene according to gel permeation chromatography (GPC).

Component (B)

Acid generator represented by following formulae

Component (D)

Acid diffusion control agent represented by following chemical formula

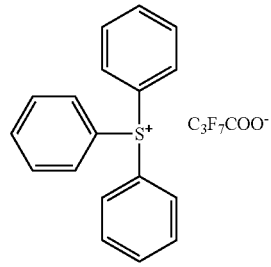

Q-(1)

Component (F)

Fluorine-containing polymer compound represented by following chemical formula. The mass average molecular weight (Mw) in terms of standard polystyrene which had been acquired by GPC measurement was 15000, and the molecular weight dispersity (Mw/Mn) was 1.61. The copolymer compositional ratio (l/m) (the ratio (molar ratio) of respective constitutional units in the structural formula) acquired by $^{13}$C-NMR was 50/50.

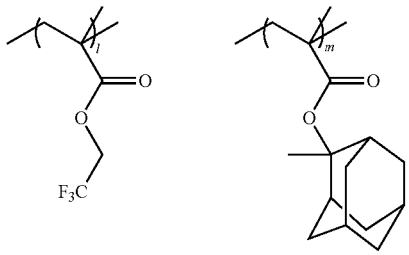

F-(1)

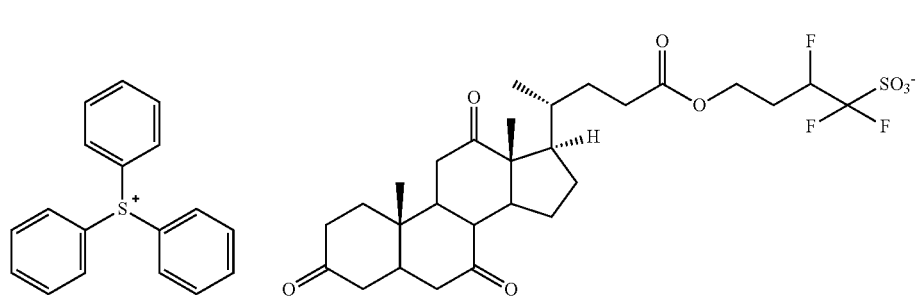

P-(1)

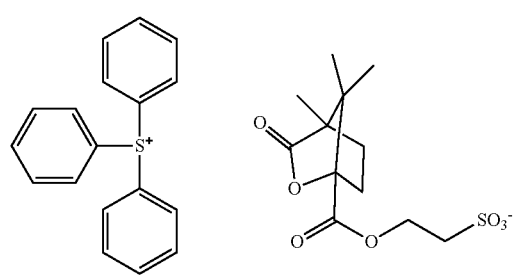

P-(2)

Component (S)

PGMEA: propylene glycol monomethyl ether acetate
PGME: propylene glycol monomethyl ether <Formation of Negative-Tone Resist Pattern>

A 12-inch silicon wafer to which a hexamethyldisilazane (HMDS) treatment had been applied was coated with an organic antireflection film composition "ARC95" (trade name, manufactured by Brewer Science, Inc.) using a spinner, baked on a hot plate at 205° C. for 60 seconds, and dried, thereby forming an organic antireflection film having a film thickness of 98 nm.

Next, the film was coated with each composition in [Table 1] using a spinner, subjected to a post applied bake (PAB) treatment on a hot plate at a temperature of 100° C. for 50 seconds, and dried, thereby forming a resist film having a film thickness of 85 nm.

Next, the resist film was selectively irradiated with an ArF excimer laser (193 nm) through a photomask [att-PSM 6% transparency] using an ArF exposure device for liquid immersion, NSR—S610C [manufactured by Nikon Corporation; numerical aperture (NA)=1.30; Crosspole (0.98/0.78) w/A-pol.].

Thereafter, a bake (PEB) treatment was performed thereon at 90° C. for 50 seconds. Next, the film was dried without being rinsed by performing paddle development for 30 seconds, and post bake treatment was performed thereon at 110° C. for 50 seconds. As the developing solution, n-butyl acetate was used.

As a result, a negative-tone resist pattern was formed (target: 69 nm×48 nm mask/100 nm×90 nm pitch/48 nm×36 nm).

<Evaluation of Negative-Tone Resist Pattern>

Examples 1 to 4 and Comparative Examples 1 and 2 to 3

[CDU (in-Plane Uniformity of Pattern Dimension)]

In the CH pattern formed according to the method in the section of <formation of negative-tone resist pattern>, the hole diameters (nm) of 100 holes in the CH pattern were measured by observing the CH pattern from above using a length measurement SEM (scanning electron microscope, acceleration voltage of 300 V, trade name: CG5000, manufactured by Hitachi High-Technologies Corporation). Three times (3σ) the standard deviation (3σ) calculated from the measurement results was acquired. The results are listed in the table in the columns of "CDU (nm)". As the value of 36 acquired in the above-described manner is decreased, this indicates that dimension (CD) uniformity in the holes formed in the resist film is high.

For Examples 1 to 4 and Comparative Examples 1 to 3, the CDU was measured by the above-described method. Further, in the formation of the resist pattern of each example, the optimum exposure amount (sensitivity) EOP (mJ/cm²) in which each pattern was formed was acquired. The results are as listed in Table 3.

TABLE 3

|  | EOP (mJ/cm²) | CDU |
| --- | --- | --- |
| Example 1 | 35 | 4.8 |
| Comparative Example 1 | 42 | 5.1 |
| Comparative Example 2 | 37 | 5.0 |
| Comparative Example 3 | 41 | 5.3 |

TABLE 3-continued

|  | EOP (mJ/cm²) | CDU |
| --- | --- | --- |
| Example 2 | 33 | 4.6 |
| Example 3 | 39 | 4.7 |
| Example 4 | 37 | 4.7 |

As shown in the results, in a case where the resist composition according to the present invention is used, a resist pattern with an excellent CDU value and excellent EOP characteristics can be formed.

Hereinbefore, the suitable examples of the present invention have been described, but the present invention is not limited to these examples. Additions, omissions, replacements, and modifications of configurations can be made in a range without departing from the gist of the present invention. The present invention is not limited by the description above, but only by the appended claims.

The invention claimed is:

1. A resist composition which generates an acid upon light exposure and whose solubility in a developing solution is changed due to an action of the acid, the resist composition comprising:
a base material component (A) whose solubility in a developing solution is changed due to the action of an acid, and
an acid generator component (B),
wherein the base material component (A) contains a polymer compound (A1) having a constitutional unit (a1) represented by Formula (a1-1), and
the acid generator component (B) contains at least one member selected from the group consisting of a compound represented by Formula (b-1), a compound represented by Formula (b-2), and a compound represented by Formula (b-3):

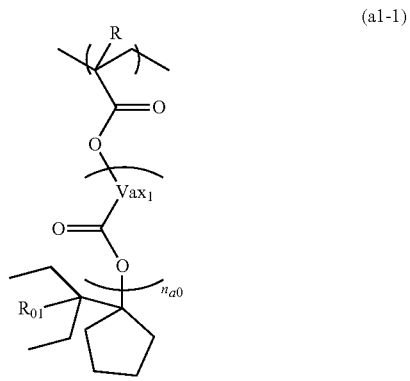

wherein R represents a hydrogen atom, an alkyl group having 1 to 5 carbon atoms, or a halogenated alkyl group having 1 to 5 carbon atoms, $Vax_1$ represents a single bond or a divalent linking group, $n_{a0}$ represents an integer of 0 to 2, and $R_{01}$ represents a methyl group or an ethyl group;

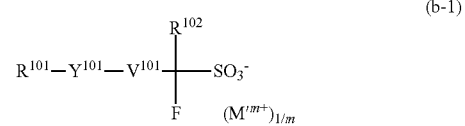

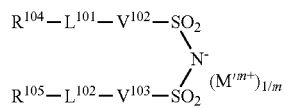

(b-2)

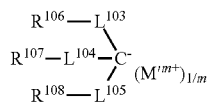

(b-3)

wherein $R^{101}$ and $R^{104}$ to $R^{108}$ each independently represent a cyclic group which may have a substituent, a chain alkyl group which may have a substituent, or a chain alkenyl group which may have a substituent; $R^{104}$ and $R^{105}$ may be bonded to each other to form a ring; $R^{102}$ represents a fluorine atom or a fluorinated alkyl group having 1 to 5 carbon atoms; $Y^{101}$ represents a single bond or a divalent linking group having an oxygen atom; $V^{101}$ to $V^{103}$ each independently represent a single bond, an alkylene group, or a fluorinated alkylene group; $L^{101}$ and $L^{102}$ each independently represent a single bond or an oxygen atom; $L^{103}$ to $L^{105}$ each independently represent a single bond, —CO—, or —SO$_2$—; m represents an integer of 1 or greater, and $M'^{m+}$ represents a cation represented by Formula (ca-1):

$$R^{202}-\underset{R^{203}}{\overset{R^{201}}{S^+}}$$ (ca-1)

wherein $R^{201}$ to $R^{203}$ each independently represent a phenyl group which may have a substituent.

2. The resist composition according to claim 1, wherein the polymer compound (A1) further comprises a constitutional unit (a2) containing a lactone-containing cyclic group.

3. The resist composition according to claim 1, wherein $n_{a0}$ represents 0.

4. The resist composition according to claim 1, wherein the resist composition contains one or more components selected from the group consisting of an acid diffusion control agent, an additive, and a solvent.

5. A resist pattern forming method comprising:
   forming a resist film on a support using the resist composition according to claim 1;
   exposing the resist film to light; and
   developing the exposed resist film to form a resist pattern.

6. The resist composition according to claim 1, wherein $R^{201}$ to $R^{203}$ each independently represent a phenyl group which does not have a substituent.

\* \* \* \* \*